US012665586B2

(12) United States Patent
Kimoto et al.

(10) Patent No.: US 12,665,586 B2
(45) Date of Patent: Jun. 23, 2026

(54) ELEMENT ARRAY CIRCUIT AND SENSOR

(71) Applicant: TDK Corporation, Tokyo (JP)

(72) Inventors: Yusuke Kimoto, Tokyo (JP); Shinji Hara, Tokyo (JP); Tadao Senriuchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 30 days.

(21) Appl. No.: 18/975,471

(22) Filed: Dec. 10, 2024

(65) Prior Publication Data

US 2025/0233584 A1 Jul. 17, 2025

(30) Foreign Application Priority Data

Jan. 17, 2024 (JP) ................................. 2024-004952

(51) Int. Cl.
H03K 17/00 (2006.01)
*G01J 1/44* (2006.01)
*H03F 3/45* (2006.01)

(52) U.S. Cl.
CPC .............. H03K 17/002 (2013.01); *G01J 1/44* (2013.01); *H03F 3/45475* (2013.01)

(58) Field of Classification Search
CPC .. H03K 17/002; H03K 17/005; H03K 17/007;

H03K 17/51; H03K 17/62; H03K 17/66; H03K 17/735; H03K 17/76; H03K 17/81; G01J 1/44; H03F 1/305; H03F 3/45475
See application file for complete search history.

(56) References Cited

U.S. PATENT DOCUMENTS

2024/0035893 A1 * 2/2024 Senriuchi ................ G01L 1/205

FOREIGN PATENT DOCUMENTS

JP H08-094443 A 4/1996

* cited by examiner

*Primary Examiner* — Long Nguyen
(74) *Attorney, Agent, or Firm* — Oliff PLC

(57) ABSTRACT

An element array circuit includes one or more first wirings, second wirings, impedance elements, one or more operational amplifiers, one or more first selectors, and one or more second selectors. The one or more first selectors each select one option from a first option group including a first option to apply a first potential to one of respective one or more first ends of the one or more first wirings and a second option to apply a second potential different from the first potential to the one of the one or more first ends. The one or more second selectors each select one option from a second option group including a third option to apply the first potential to one of respective one or more second ends of the first wiring(s) and a fourth option to apply the second potential to the one of the one or more second ends.

16 Claims, 26 Drawing Sheets

START

S701

CAUSE ALL SWITCHES TO BE
IN NONCONDUCTING STATE

S702

SELECT ROW LINE CORRESPONDING TO SELECTED
RESISTOR RS TO BE SELECTED ROW LINE AS

S703

SELECT COLUMN LINE CORRESPONDING TO SELECTED
RESISTOR RS TO BE SELECTED COLUMN LINE BS

S704

MEASURE OUTPUT VOLTAGE Vout CORRESPONDING
TO SELECTED RESISTOR RS

END

ELEMENT ARRAY CIRCUIT AND SENSOR

CROSS-REFERENCE TO RELATED APPLICATIONS

The present application claims priority from Japanese Patent Application No. 2024-004952 filed on Jan. 17, 2024, the entire contents of which are hereby incorporated by reference.

BACKGROUND

The disclosure relates to an element array circuit including an element array in which multiple impedance elements are arranged, and to a sensor including the element array circuit.

A resistor array circuit has been proposed that includes multiple resistors arranged in a matrix. Such a resistor array circuit is used as, for example, an infrared detection circuit. For example, reference is made to Japanese Unexamined Patent Application Publication No. H08-094443. Such an infrared detection circuit includes infrared-sensitive resistors arranged therein. Examples of the infrared-sensitive resistors may include a thermistor whose electrical resistance value changes with changing temperature.

SUMMARY

An element array circuit according to one embodiment of the disclosure includes one or more first wirings, a plurality of second wirings, a plurality of impedance elements, one or more operational amplifiers, one or more first selectors, and one or more second selectors. The one or more first wirings include respective one or more first ends and respective one or more second ends. The second wirings each extend in a direction different from a direction in which the one or more first wirings each extend. The impedance elements are each coupled to both one of the one or more first wirings and one of the second wirings. The one or more operational amplifiers each include a positive input terminal to be set to a first potential, and a negative input terminal couplable to one of the second wirings. The one or more first selectors are each coupled to corresponding one of the one or more first ends and configured to select one option from a first option group. The first option group includes a first option to apply the first potential to the corresponding one of the one or more first ends and a second option to apply a second potential different from the first potential to the corresponding one of the one or more first ends. The one or more second selectors are each coupled to corresponding one of the one or more second ends and configured to select one option from a second option group. The second option group includes a third option to apply the first potential to the corresponding one of the one or more second ends and a fourth option to apply the second potential to the corresponding one of the one or more second ends.

An element array circuit according to one embodiment of the disclosure includes a plurality of first wirings, one or more second wirings, a plurality of impedance elements, one or more operational amplifiers, a plurality of first selectors, and a plurality of second selectors. The first wirings include respective first ends and respective second ends. The one or more second wirings each extend in a direction different from a direction in which the first wirings each extend. The impedance elements are each coupled to both one of the first wirings and one of the one or more second wirings. The one or more operational amplifiers each include a positive input terminal to be set to a first potential, and a negative input terminal couplable to one of the one or more second wirings. The first selectors are each coupled to corresponding one of the first ends and configured to select one option from a first option group. The first option group includes a first option to apply the first potential to the corresponding one of the first ends and a second option to apply a second potential different from the first potential to the corresponding one of the first ends. The second selectors are each coupled to corresponding one of the second ends and configured to select one option from a second option group. The second option group includes a third option to apply the first potential to the corresponding one of the second ends and a fourth option to apply the second potential to the corresponding one of the second ends.

A sensor according to one embodiment of the disclosure includes an element array circuit. The element array circuit includes one or more first wirings, a plurality of second wirings, a plurality of impedance elements, one or more operational amplifiers, one or more first selectors, and one or more second selectors. The one or more first wirings include respective one or more first ends and respective one or more second ends. The second wirings each extend in a direction different from a direction in which the one or more first wirings each extend. The impedance elements are each coupled to both one of the one or more first wirings and one of the second wirings. The one or more operational amplifiers each include a positive input terminal to be set to a first potential, and a negative input terminal couplable to one of the second wirings. The one or more first selectors are each coupled to corresponding one of the one or more first ends and configured to select one option from a first option group. The first option group includes a first option to apply the first potential to the corresponding one of the one or more first ends and a second option to apply a second potential different from the first potential to the corresponding one of the one or more first ends. The one or more second selectors are each coupled to corresponding one of the one or more second ends and configured to select one option from a second option group. The second option group includes a third option to apply the first potential to the corresponding one of the one or more second ends and a fourth option to apply the second potential to the corresponding one of the one or more second ends.

A sensor according to one embodiment of the disclosure includes an element array circuit. The element array circuit includes a plurality of first wirings, one or more second wirings, a plurality of impedance elements, one or more operational amplifiers, a plurality of first selectors, and a plurality of second selectors. The first wirings include respective first ends and respective second ends. The one or more second wirings each extend in a direction different from a direction in which the first wirings each extend. The impedance elements are each coupled to both one of the first wirings and one of the one or more second wirings. The one or more operational amplifiers each include a positive input terminal to be set to a first potential, and a negative input terminal couplable to one of the one or more second wirings. The first selectors are each coupled to corresponding one of the first ends and configured to select one option from a first option group. The first option group includes a first option to apply the first potential to the corresponding one of the first ends and a second option to apply a second potential different from the first potential to the corresponding one of the first ends. The second selectors are each coupled to corresponding one of the second ends and configured to select one option from a second option group. The second option group includes a third option to apply the first potential to the corresponding one of the second ends and a fourth option to apply the second potential to the corresponding one of the second ends.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
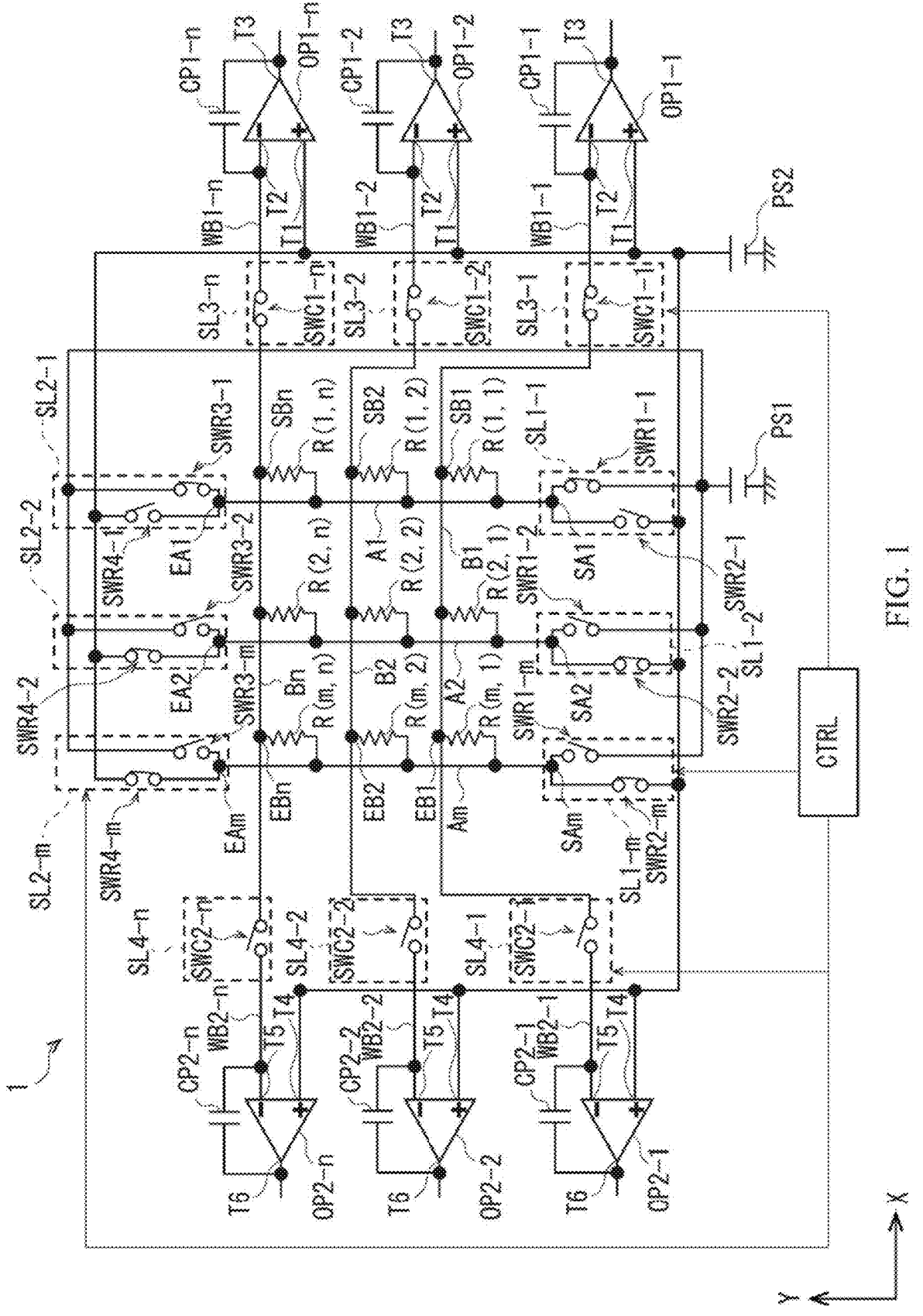
FIG. 1 is a circuit diagram illustrating a configuration example of an element array circuit according to one example embodiment of the disclosure.

It is desired that in an element array circuit including multiple sensor elements, outputs be obtained from a larger number of sensor elements even when any damage, such as a break, has occurred in a portion of the element array circuit.

It is desirable to provide an element array circuit that achieves high reliability, and to provide a sensor including such an element array circuit.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings. Note that the description is given in the following order.

1. First Example Embodiment: a first example of an element array circuit including a plurality of column lines and a plurality of operational amplifiers
2. Second Example Embodiment: a second example of the element array circuit including the column lines and the operational amplifiers
3. Third Example Embodiment: an example of a sensor device including the element array circuit
4. Modification Examples

1. First Example Embodiment

[Overall Configuration Example of Element Array Circuit 1]

FIG. 1 is a circuit diagram schematically illustrating a configuration example of an element array circuit 1 according to a first example embodiment of the disclosure. The element array circuit 1 may be mountable on, for example, an infrared thermography, and may be configured to output an output voltage corresponding to an intensity of infrared rays applied to the element array circuit 1.

As illustrated in FIG. 1, the element array circuit 1 may include, for example, a plurality of row lines A denoted as A1 to Am in FIG. 1, a plurality of column lines B denoted as B1 to Bn in FIG. 1, a plurality of resistors R denoted as R(1, 1) to R(m, n) in FIG. 1, a plurality of first selectors SL1 denoted as SL1-1 to SL1-*m* in FIG. 1, a plurality of second selectors SL2 denoted as SL2-1 to SL2-*m* in FIG. 1, a plurality of third selectors SL3 denoted as SL3-1 to SL3-*n* in FIG. 1, a plurality of fourth selectors SL4 denoted as SL4-1 to SL4-*n* in FIG. 1, a plurality of operational amplifiers OP including first operational amplifiers OP1 denoted as OP1-1 to OP1-*n* in FIG. 1 and second operational amplifiers OP2 denoted as OP2-1 to OP2-*n* in FIG. 1, a plurality of capacitors CP including first capacitors CP1 denoted as CP1-1 to CP1-*n* in FIG. 1 and second capacitors CP2 denoted as CP2-1 to CP2-*n* in FIG. 1, and a processor CTRL. In FIG. 1, "m" row lines A are provided by way of example; however, the number of the row lines A is not limited to "m", and may be chosen as desired. Similarly, although "n" column lines B are provided in FIG. 1 by way of example, the number of the column lines B is not limited to "n", and may be chosen as desired. Further, in FIG. 1, one resistor R coupled to both an "a"-th row line Aa among the "m" row lines A1 to Am and a "b"-th column line Bb among the "n" column lines B1 to Bn is denoted as R(a, b). The same applies to the drawings subsequent to FIG. 1. Further, the row lines A and the column lines B may not be in direct contact with each other.

[Row Line A]

The row lines A may correspond to a specific but non-limiting example of "one or more first wirings" or "a plurality of first wirings" in one embodiment of the disclosure.

The row lines A may each extend in a first direction and may be arranged to be adjacent to each other in a second direction different from the first direction. In the example embodiment illustrated in FIG. 1, the row lines A may each extend, for example, in a Y-axis direction and may be arranged to be adjacent to each other in an X-axis direction orthogonal to the Y-axis direction, although they are not limited thereto.

The row lines A denoted as A1 to Am in FIG. 1 have their respective first ends SA denoted as SA1 to SAm in FIG. 1. The first ends SA (SA1 to SAm) may each be couplable to a direct-current power supply PS1 via corresponding one of respective first switches SWR1 (SWR1-1 to SWR1-*m* in FIG. 1) of the first selectors SL1, and may each be couplable to a direct-current power supply PS2 via corresponding one of respective second switches SWR2 (SWR2-1 to SWR2-*m* in FIG. 1) of the first selectors SL1. To each single row line A, multiple ones of the resistors R may be coupled at their respective first ends. In the example embodiment illustrated in FIG. 1, "n" resistors R may be coupled in parallel to each single row line A. For example, to the row line A1 extending in the Y-axis direction, the resistors R(1, 1) to R(1, n) arranged in the Y-axis direction in the order of proximity to the first end SA1 may be coupled at their respective first ends. Similarly, to the row line A2 extending in the Y-axis direction, the resistors R(2, 1) to R(2, n) arranged in the Y-axis direction in the order of proximity to the first end SA2 may be coupled at their respective first ends; and to the row line Am extending in the Y-axis direction, the resistors R(m, 1) to R(m, n) arranged in the Y-axis direction in the order of proximity to the first end SAm may be coupled at their respective first ends.

In the example embodiment illustrated in FIG. 1, the row lines A (A1 to Am in FIG. 1) have their respective second ends EA (EA1 to EAm in FIG. 1) opposite to the first ends SA. The second ends EA may each be couplable to the direct-current power supply PS1 via corresponding one of respective third switches SWR3 (SWR3-1 to SWR3-*m* in FIG. 1) of the second selectors SL2, and may each be couplable to the direct-current power supply PS2 via corresponding one of respective fourth switches SWR4 (SWR4-1 to SWR4-*m* in FIG. 1) of the second selectors SL2.

For convenience, one resistor R selected from the plurality of resistors R in the element array circuit 1 will be referred to as a selected resistor RS. One row line A that corresponds to the selected resistor RS will be referred to as a selected row line AS. All the row lines A except the selected row line AS will each be referred to as an unselected row line AU. In performing measurement on the selected resistor RS, the first to fourth switches SWR1 to SWR4 may be brought into the following state. The following state will be referred to as State A, for convenience.

First, one of the first switches SWR1, i.e., a first one of the first switches SWR1, that corresponds to the selected row line AS may be caused to be in a conducting state to cause a first potential V1 to be applied from the direct-current power supply PS1 to the first end SA of the selected row line AS. Further, ones of the second switches SWR2, i.e., first ones of the second switches SWR2, that correspond to the unselected row lines AU may all be caused to be in the conducting state to cause a second potential V2 not equal to the first potential V1 to be applied from the direct-current power supply PS2 to the first ends SA of the unselected row lines AU. Accordingly, another one of the second switches SWR2, i.e., a second one of the second switches SWR2, that corresponds to the selected row line AS may be caused to be in a nonconducting state, and another ones of the first switches SWR1, i.e., second ones of the first switches SWR1, that correspond to the unselected row lines AU may all be caused to be in the nonconducting state.

At the same time, one of the third switches SWR3, i.e., a first one of the third switches SWR3, that corresponds to the selected row line AS may be caused to be in the conducting state to cause the first potential V1 to be applied also to the second end EA of the selected row line AS from the direct-current power supply PS1. Ones of the fourth switches SWR4, i.e., first ones of the fourth switches SWR4, that correspond to the unselected row lines AU may all be caused to be in the conducting state to cause the second potential V2 to be applied also to the second ends EA of the unselected row lines AU from the direct-current power supply PS2. Accordingly, another one of the fourth switches SWR4, i.e., a second one of the fourth switches SWR4, that corresponds to the selected row line AS may be caused to be in the nonconducting state, and another ones of the third switches SWR3, i.e., second ones of the third switches SWR3, that correspond to the unselected row lines AU may all be caused to be in the nonconducting state. In some embodiments, the ones of the fourth switches SWR4 that correspond to the unselected row lines AU may be in the nonconducting state.

State A may be as described above. State A may be where the first potential V1 is applied to both the first end SA and the second end EA of the selected row line AS. State A may correspond to a specific but non-limiting example of a "second state" in one embodiment of the disclosure.

As an example of State A, FIG. 1 illustrates a state where the resistors R(1, 1) to R(1, n) are selected. In other words, FIG. 1 illustrates a state where the first switch SWR1-1 is in the conducting state to cause the first potential V1 to be applied from the direct-current power supply PS1 to the first end SA of the selected row line A1 corresponding to the selected resistors R(1, 1) to R(1, n), and where the second switches SWR2-2 to SWR2-$m$ are in the conducting state to cause the second potential V2 not equal to the first potential V1 to be applied from the direct-current power supply PS2 to the first ends SA2 to SAm of the unselected row lines A2 to Am, that is, all the row lines A except the selected row line A1. In this situation, the first switches SWR1-2 to SWR1-$m$ coupled to the unselected row lines A2 to Am are all in the nonconducting state, and the second switch SWR2-1 coupled to the selected row line A1 is also in the noncon-ducting state. Either the first potential V1 or the second potential V2 may be 0 V.

In some embodiments, in performing measurement on the selected resistor RS in the element array circuit 1, the first to fourth switches SWR1 to SWR4 may be brought into the following state. The following state will be referred to as State B, for convenience.

For State B, first, one of the first switches SWR1 that corresponds to the selected row line AS may be caused to be in the conducting state, ones of the second switches SWR2 that correspond to the unselected row lines AU may all be caused to be in the conducting state, the other one of the second switches SWR2 that corresponds to the selected row line AS may be caused to be in the nonconducting state, and the other ones of the first switches SWR1 that correspond to the unselected row lines AU may all be caused to be in the nonconducting state. Thus, states of the first and second switches SWR1 and SWR2 in State B may be the same as those in State A.

In State B, however, the second end EA of the selected row line AS may be open. Thus, one of the third switches SWR3 that corresponds to the selected row line AS may be caused to be in the nonconducting state, and one of the fourth switches SWR4 that corresponds to the selected row line AS may be caused to be in the nonconducting state. All the third switches SWR3 may be in the nonconducting state. The other ones of the fourth switches SWR4 that correspond to the unselected row lines AU may be in the conducting state or in the nonconducting state.

State B may be as described above. State B may be where the first potential V1 is applied to the first end SA of the selected row line AS and where the second end EA of the selected row line AS is open. State B may correspond to a specific but non-limiting example of a "first state" in one embodiment of the disclosure.

[Column Line B]

The column lines B may correspond to a specific but non-limiting example of "a plurality of second wirings" or "one or more second wirings" in one embodiment of the disclosure. The column lines B each extend in a direction different from the direction in which the row lines A each extend. For example, the column lines B may each extend in the second direction, and may be arranged to be adjacent to each other in the first direction different from the second direction. In the example embodiment illustrated in FIG. 1, the column lines B may each extend, for example, in the X-axis direction and may be arranged to be adjacent to each other in the Y-axis direction, although they are not limited thereto.

The column lines B may have their respective third ends SB denoted as SB1 to SBn in FIG. 1. The third ends SB (SB1 to SBn) may each be coupled to corresponding one of the first operational amplifiers OP1 denoted as OP1-1 to OP1-$n$ in FIG. 1, via corresponding one of the third selectors SL3. For example, the third end SB1 of the column line B1 may be coupled to a negative input terminal T2 of the first operational amplifier OP1-1 via a fifth switch SWC1-1 to be described later. The third end SB2 of the column line B2 may be coupled to the negative input terminal T2 of the first operational amplifier OP1-2 via a fifth switch SWC1-2 to be described later. The third end SBn of the column line Bn may be coupled to the negative input terminal T2 of the first operational amplifier OP1-$n$ via a fifth switch SWC1-$n$ to be described later.

To each single column line B, multiple ones of the resistors R may be coupled at their respective second ends. The respective second ends of the resistors R may be opposite to the respective first ends that are each coupled to corresponding one of the row lines A. In the example embodiment illustrated in FIG. 1, "m" resistors R may be coupled in parallel to each single column line B. For example, to the column line B1 extending in the X-axis direction, the resistors R(1, 1) to R(m, 1) arranged in the X-axis direction in the order of proximity to the third end SB1 may be coupled at their respective second ends. Simi-larly, to the column line B2 extending in the X-axis direc-tion, the resistors R(1, 2) to R(m, 2) arranged in the X-axis direction in the order of proximity to the third end SB2 may be coupled at their respective second ends; and to the column line Bn extending in the X-axis direction, the resistors R(1, n) to R(m, n) arranged in the X-axis direction in the order of proximity to the third end SBn may be coupled at their respective second ends. In the configuration example of FIG. 1, the second end of the resistor R(1, 1) may be coupled to the third end SB1 of the column line B1, the second end of the resistor R(1, 2) may be coupled to the third end SB2 of the column line B2, and the second end of the resistor R(1, n) may be coupled to the third end SBn of the column line Bn.

The column lines B may have their respective fourth ends EB denoted as EB1 to EBn in FIG. 1. The fourth ends EB (EB1 to EBn) may each be coupled to corresponding one of the second operational amplifiers OP2 denoted as OP2-1 to OP2-$n$ in FIG. 1, via corresponding one of the fourth selectors SL4. For example, the fourth end EB1 of the column line B1 may be coupled to a negative input terminal T5 of the second operational amplifier OP2-1 via a sixth switch SWC2-1 to be described later. The fourth end EB2 of the column line B2 may be coupled to the negative input terminal T5 of the second operational amplifier OP2-2 via a sixth switch SWC2-2 to be described later. The fourth end EBn of the column line Bn may be coupled to the negative input terminal T5 of the second operational amplifier OP2-$n$ via a sixth switch SWC2-$n$ to be described later. In the configuration example of FIG. 1, the second end of the resistor R(m, 1) may be coupled to the fourth end EB1 of the column line B1, the second end of the resistor R(m, 2) may be coupled to the fourth end EB2 of the column line B2, and the second end of the resistor R(m, n) may be coupled to the fourth end EBn of the column line Bn.

[Resistor R]

The resistors R may correspond to a specific but non-limiting example of "a plurality of impedance elements" in one embodiment of the disclosure.

The resistors R are each coupled to both one of the row lines A and one of the column lines B. The resistors R may each have the first end coupled to the one of the row lines A, and the second end coupled to the one of the column lines B. As described above, in the example embodiment illustrated in FIG. 1, "n" resistors R may be coupled to each single one of the row lines A, and "m" resistors R may be coupled to each single one of the column lines B. The number of the resistors R coupled to both one of the row lines A and one of the column lines B is one. Accordingly, it is possible to specify a single resistor R by selecting one row line A from the plurality of row lines A and selecting one column line B from the plurality of column lines B.

The resistor R may be a component of an infrared light receiving device that converts infrared rays condensed by, for example, a lens into an electric signal. For example, the resistor R may include a resistance change layer whose resistance changes with changing temperature. Non-limiting examples of the resistance change layer may include a thermistor film. The thermistor film may include a material such as vanadium oxide, amorphous silicon, polycrystalline silicon, a manganese-containing oxide having a spinel crystal structure, titanium oxide, or yttrium-barium-copper oxide. In the infrared light receiving device, an infrared absorption layer may be provided adjacent to the thermistor film. The infrared absorption layer may absorb infrared rays and generate heat. The infrared absorption layer may include a material such as silicon oxide ($SiO_2$), aluminum oxide ($AlO_3$), silicon nitride ($Si_3N_4$), or aluminum nitride (AlN). Temperatures of the infrared absorption layer and the resistance change layer may change with intensity of received infrared rays, and as a result, the resistance change layer may change in resistance value.

[First Selector SL1]

The first selectors SL1 (SL1-1 to SL1-$m$) may each be coupled to corresponding one of the first ends SA (SA1 to SAm) of the row lines A (A1 to Am). Based on a command from the processor CTRL, the first selectors SL1 (SL1-1 to SL1-$m$) each select one option from a first option group. The first option group includes a first option to apply the first potential V1 to the corresponding one of the first ends SA (SA1 to SAm) of the row lines A and a second option to apply the second potential V2 to the corresponding one of the first ends SA (SA1 to SAm). The second potential V2 is different from the first potential V1. The first selector SL1-1 may include the first switch SWR1-1 and the second switch SWR2-1, for example. The first selector SL1-2 may include the first switch SWR1-2 and the second switch SWR2-2, for example. The first selector SL1-$m$ may include the first switch SWR1-$m$ and the second switch SWR2-$m$, for example.

The first switches SWR1 (SWR1-1 to SWR1-$m$) may each be provided between the first end SA of corresponding one of the row lines A (A1 to Am) and the direct-current power supply PS1 that serves as a first potential part to be set to the first potential V1. The second switches SWR2 (SWR2-1 to SWR2-$m$) may each be provided between the first end SA of corresponding one of the row lines A (A1 to Am) and the direct-current power supply PS2 that serves as a second potential part to be set to the second potential V2. Each of the first switches SWR1 (SWR1-1 to SWR1-$m$) and each of the second switches SWR2 (SWR2-1 to SWR2-$m$) may be coupled to corresponding one of the first ends SA (SA1 to SAm) of the row lines A. The first switches SWR1 (SWR1-1 to SWR1-$m$) may each perform a selection operation to select either an electrically continuous state or an electrically discontinuous state between corresponding one of the first ends SA (SA1 to SAm) of the row lines A and the direct-current power supply PS1. The second switches SWR2 (SWR2-1 to SWR2-$m$) may each perform a selection operation to select either an electrically continuous state or an electrically discontinuous state between corresponding one of the first ends SA (SA1 to SAm) of the row lines A and the direct-current power supply PS2.

Of the first selectors SL1 (SL1-1 to SL1-$m$), one first selector SL1 that corresponds to the first end SA of the selected row line AS selected by the processor CTRL may couple the first end SA of the selected row line AS to the direct-current power supply PS1 to thereby cause the first potential V1 to be applied to the first end SA of the selected row line AS. In contrast, of the first selectors SL1 (SL1-1 to SL1-$m$), the other first selectors SL1 each corresponding to one of the first ends SA of the unselected row lines AU may couple the corresponding one of the first ends SA of the unselected row lines AU to the direct-current power supply PS2 to thereby cause the second potential V2 to be applied to the corresponding one of the first ends SA of the unselected row lines AU.

Note that the first selectors SL1 may each also have an option to cause the first end SA of corresponding one of the row lines A to be open. Upon selecting this option, the first selectors SL1 may each cause both the first switch SWR1 and the second switch SWR2 that correspond to the first end SA of the corresponding one of the row lines A to be in the nonconducting state. Respective operations of the first selectors SL1 (SL1-1 to SL1-$m$) may be controlled by the processor CTRL. For example, respective switching operations of the first switches SWR1 (SWR1-1 to SWR1-$m$) and the second switches SWR2 (SWR2-1 to SWR2-$m$) of the first selectors SL1 (SL1-1 to SL1-$m$) may be executed based on commands from the processor CTRL.

[Second Selector SL2]

The second selectors SL2 (SL2-1 to SL2-$m$) may each be coupled to corresponding one of the second ends EA (EA1 to EAm) of the row lines A (A1 to Am). Based on a command from the processor CTRL, the second selectors SL2 (SL2-1 to SL2-$m$) each select one option from a second option group. The second option group includes a third option to apply the first potential V1 to the corresponding one of the second ends EA (EA1 to EAm) of the row lines A and a fourth option to apply the second potential V2 to the corresponding one of the second ends EA (EA1 to EAm). The second selector SL2-1 may include the third switch SWR3-1 and the fourth switch SWR4-1, for example. The second selector SL2-2 may include the third switch SWR3-2 and the fourth switch SWR4-2, for example. The second selector SL2-$m$ may include the third switch SWR3-$m$ and the fourth switch SWR4-$m$, for example. The third switches SWR3 (SWR3-1 to SWR3-$m$) may each be provided between the second end EA of corresponding one of the row lines A (A1 to Am) and the direct-current power supply PS1. The fourth switches SWR4 (SWR4-1 to SWR4-$m$) may each be provided between the second end EA of corresponding one of the row lines A (A1 to Am) and the direct-current power supply PS2. Each of the third switches SWR3 (SWR3-1 to SWR3-$m$) and each of the fourth switches SWR4 (SWR4-1 to SWR4-$m$) may be coupled to corresponding one of the second ends EA (EA1 to EAm) of the row lines A. The third switches SWR3 (SWR3-1 to SWR3-$m$) may each perform a selection operation to select either an electrically continuous state or an electrically discontinuous state between corresponding one of the second ends EA (EA1 to EAm) of the row lines A and the direct-current power supply PS1. The fourth switches SWR4 (SWR4-1 to SWR4-m) may each perform a selection operation to select either an electrically continuous state or an electrically discontinuous state between corresponding one of the second ends EA (EA1 to EAm) of the row lines A and the direct-current power supply PS2. Note that the second selectors SL2 may each also have an option to cause the second end EA of corresponding one of the row lines A to be open. Upon selecting this option, the second selectors SL2 may each cause both the third switch SWR3 and the fourth switch SWR4 that correspond to the second end EA of the corresponding one of the row lines A to be in the nonconducting state.

Of the second selectors SL2 (SL2-1 to SL2-m), one second selector SL2 that corresponds to the second end EA of the selected row line AS selected by the processor CTRL may couple the second end EA of the selected row line AS to the direct-current power supply PS1 to thereby cause the first potential V1 to be applied to the second end EA of the selected row line AS. In contrast, of the second selectors SL2 (SL2-1 to SL2-m), the other second selectors SL2 each corresponding to one of the second ends EA of the unselected row lines AU may couple the corresponding one of the second ends EA of the unselected row lines AU to the direct-current power supply PS2 to thereby cause the second potential V2 to be applied to the corresponding one of the second ends EA of the unselected row lines AU. Respective operations of the second selectors SL2 (SL2-1 to SL2-m) may be controlled by the processor CTRL. For example, respective switching operations of the third switches SWR3 (SWR3-1 to SWR3-m) and the fourth switches SWR4 (SWR4-1 to SWR4-m) of the second selectors SL2 (SL2-1 to SL2-m) may be executed based on commands from the processor CTRL.

In the element array circuit 1, the application of the first potential V1 to the first end SA of the selected row line AS through the first selector SL1 and the application of the first potential V1 to the second end EA of the selected row line AS through the second selector SL2 may be performed in synchronization with each other. In some embodiments, the application of the first potential V1 to the first end SA of the selected row line AS through the first selector SL1 and the application of the first potential V1 to the second end EA of the selected row line AS through the second selector SL2 may be performed independently of each other.

In the element array circuit 1, the selection operation to select the electrically continuous state by one first switch SWR1 coupled to one first end SA selected from the plurality of first ends SA, the selection operation to select the electrically discontinuous state by one second switch SWR2 coupled to the selected first end SA, the selection operation to select the electrically continuous state by one third switch SWR3 coupled to one second end EA corresponding to the selected first end SA, and the selection operation to select the electrically discontinuous state by one fourth switch SWR4 coupled to the second end EA corresponding to the selected first end SA may be performed in synchronization with each other.

[First Operational Amplifier OP1]

The first operational amplifiers OP1 (OP1-1 to OP1-n) may each be coupled to corresponding one of the column lines B (B1 to Bn) via corresponding one of the third selectors SL3 (SL3-1 to SL3-n). The first operational amplifiers OP1 (OP1-1 to OP1-n) may each include a positive input terminal T1, the negative input terminal T2, and an output terminal T3. The positive input terminal T1 may be coupled to the direct-current power supply PS2, and the second potential V2 may be applied to the positive input terminal T1. The negative input terminal T2 of each of the first operational amplifiers OP1 (OP1-1 to OP1-n) may be coupled to the corresponding one of the column lines B via corresponding one of the fifth switches SWC1 (SWC1-1 to SWC1-n) of the corresponding one of the third selectors SL3 (SL3-1 to SL3-n). The respective negative input terminals T2 of the first operational amplifiers OP1 (OP1-1 to OP1-n) and the respective third ends SB (SB1 to SBn) of the column lines B (B1 to Bn) may be electrically coupled to each other via respective coupling lines WB1 (WB1-1 to WB1-n) and the respective fifth switches SWC1 (SWC1-1 to SWC1-n) of the third selectors SL3 (SL3-1 to SL3-n). The fifth switches SWC1 (SWC1-1 to SWC1-n) may each be positioned at a point along corresponding one of the coupling lines WB1 (WB1-1 to WB1-n). Each of the first operational amplifiers OP1 (OP1-1 to OP1-n) may operate to cause the positive input terminal T1 and the negative input terminal T2 to be at the same potential, which causes the potential at the negative input terminal T2 to be substantially equal to the second potential V2. The output terminal T3 may be coupled to the negative input terminal T2 via one of the first capacitors CP1 (CP1-1 to CP1-n).

[Second Operational Amplifier OP2]

The second operational amplifiers OP2 (OP2-1 to OP2-n) may each be coupled to corresponding one of the column lines B (B1 to Bn) via corresponding one of the fourth selectors SL4 (SL4-1 to SL4-n). The second operational amplifiers OP2 (OP2-1 to OP2-n) may each include a positive input terminal T4, the negative input terminal T5, and an output terminal T6. The positive input terminal T4 may be coupled to the direct-current power supply PS2, and the second potential V2 may be applied to the positive input terminal T4. The negative input terminal T5 of each of the second operational amplifiers OP2 (OP2-1 to OP2-n) may be coupled to the corresponding one of the column lines B via corresponding one of the sixth switches SWC2 (SWC2-1 to SWC2-n) of the corresponding one of the fourth selectors SL4 (SL4-1 to SL4-n). The respective negative input terminals T5 of the second operational amplifiers OP2 (OP2-1 to OP2-n) and the respective fourth ends EB (EB1 to EBn) of the column lines B (B1 to Bn) may be electrically coupled to each other via respective coupling lines WB2 (WB2-1 to WB2-n) and the respective sixth switches SWC2 (SWC2-1 to SWC2-n) of the fourth selectors SL4 (SL4-1 to SL4-n). The sixth switches SWC2 (SWC2-1 to SWC2-n) may each be positioned at a point along corresponding one of the coupling lines WB2 (WB2-1 to WB2-n). Each of the second operational amplifiers OP2 (OP2-1 to OP2-n) may operate to cause the positive input terminal T4 and the negative input terminal T5 to be at the same potential, which causes the potential at the negative input terminal T5 to be substantially equal to the second voltage V2. The output terminal T6 may be coupled to the negative input terminal T5 via one of the second capacitors CP2 (CP2-1 to CP2-n).

[First Capacitor CP1]

The first capacitors CP1 may each be coupled to both the negative input terminal T2 and the output terminal T3 of corresponding one of the first operational amplifiers OP1, and may each convert a current flowing through the column line B coupled to the negative input terminal T2 into a voltage. For example, in the example embodiment illustrated in FIG. 1, the first capacitor CP1-1 may be coupled to both the negative input terminal T2 and the output terminal T3 of the first operational amplifier OP1-1 and may convert a current flowing through the column line B1 into a voltage. Similarly, the first capacitor CP1-2 may be coupled to both the negative input terminal T2 and the output terminal T3 of the first operational amplifier OP1-2 and may convert a current flowing through the column line B2 into a voltage. Further, the first capacitor CP1-n may be coupled to both the negative input terminal T2 and the output terminal T3 of the first operational amplifier OP1-n and may convert a current flowing through the column line Bn into a voltage.

[Second Capacitor CP2]

The second capacitors CP2 may each be coupled to both the negative input terminal T5 and the output terminal T6 of corresponding one of the second operational amplifiers OP2, and may each convert a current flowing through the column line B coupled to the negative input terminal T5 into a voltage. For example, in the example embodiment illustrated in FIG. 1, the second capacitor CP2-1 may be coupled to both the negative input terminal T5 and the output terminal T6 of the second operational amplifier OP2-1 and may convert a current flowing through the column line B1 into a voltage. Similarly, the second capacitor CP2-2 may be coupled to both the negative input terminal T5 and the output terminal T6 of the second operational amplifier OP2-2 and may convert a current flowing through the column line B2 into a voltage. Further, the second capacitor CP2-n may be coupled to both the negative input terminal T5 and the output terminal T6 of the second operational amplifier OP2-n and may convert a current flowing through the column line Bn into a voltage.

[Third Selector SL3]

Based on a command from the processor CTRL, the third selectors SL3 (SL3-1 to SL3-n) may each perform a selection operation to select either an electrically continuous state or an electrically discontinuous state between corresponding one of the third ends SB (SB1 to SBn) of the column lines B and corresponding one of the negative input terminals T2 of the first operational amplifiers OP1 (OP1-1 to OP1-n). For example, the fifth switch SWC1-1 may perform the selection operation to select either the electrically continuous state or the electrically discontinuous state between the third end SB1 of the column line B1 and the negative input terminal T2 of the first operational amplifier OP1-1, the fifth switch SWC1-2 may perform the selection operation to select either the electrically continuous state or the electrically discontinuous state between the third end SB2 of the column line B2 and the negative input terminal T2 of the first operational amplifier OP1-2, and the fifth switch SWC1-n may perform the selection operation to select either the electrically continuous state or the electrically discontinuous state between the third end SBn of the column line Bn and the negative input terminal T2 of the first operational amplifier OP1-n.

[Fourth Selector SL4]

Based on a command from the processor CTRL, the fourth selectors SL4 (SL4-1 to SL4-n) may each perform a selection operation to select either an electrically continuous state or an electrically discontinuous state between corresponding one of the fourth ends EB (EB1 to EBn) of the column lines B and corresponding one of the negative input terminals T5 of the second operational amplifiers OP2 (OP2-1 to OP2-n). For example, the sixth switch SWC2-1 may perform the selection operation to select either the electrically continuous state or the electrically discontinuous state between the fourth end EB1 of the column line B1 and the negative input terminal T5 of the second operational amplifier OP2-1, the sixth switch SWC2-2 may perform the selection operation to select either the electrically continuous state or the electrically discontinuous state between the fourth end EB2 of the column line B2 and the negative input terminal T5 of the second operational amplifier OP2-2, and the sixth switch SWC2-n may perform the selection operation to select either the electrically continuous state or the electrically discontinuous state between the fourth end EBn of the column line Bn and the negative input terminal T5 of the second operational amplifier OP2-n.

[Processor CTRL]

The processor CTRL may be a microcomputer, for example. The processor CTRL may execute predetermined control processing by causing a central processing unit (CPU) to execute a control program. For example, the processor CTRL may control respective switching operations of the first to fourth selectors SL1 to SL4. The processor CTRL may receive an output from each of the first operational amplifiers OP1 and an output from each of the second operational amplifiers OP2 either directly or indirectly.

The processor CTRL may command each of the first selectors SL1 (SL1-1 to SL1-m) to select one option from the first option group including the first option to apply the first potential V1 to corresponding one of the first ends SA (SA1 to SAm) of the row lines A and the second option to apply the second potential V2 to the corresponding one of the first ends SA (SA1 to SAm). Note that the first option group may further include the option to cause the corresponding one of the first ends SA (SA1 to SAm) of the row lines A to be open. Further, the processor CTRL may command each of the second selectors SL2 (SL2-1 to SL2-m) to select one option from the second option group including the third option to apply the first potential V1 to corresponding one of the second ends EA (EA1 to EAm) of the row lines A and the fourth option to apply the second potential V2 to the corresponding one of the second ends EA (EA1 to EAm). Note that the second option group may further include the option to cause the corresponding one of the second ends EA (EA1 to EAm) of the row lines A to be open. Further, the processor CTRL may command each of the third selectors SL3 (SL3-1 to SL3-n) to execute the selection operation to select either the electrically continuous state or the electrically discontinuous state between corresponding one of the third ends SB (SB1 to SBn) of the column lines B and corresponding one of the negative input terminals T2 of the first operational amplifiers OP1 (OP1-1 to OP1-n). Further, the processor CTRL may command each of the fourth selectors SL4 (SL4-1 to SL4-n) to execute the selection operation to select either the electrically continuous state or the electrically discontinuous state between corresponding one of the fourth ends EB (EB1 to EBn) of the column lines B and corresponding one of the negative input terminals T5 of the second operational amplifiers OP2 (OP2-1 to OP2-n).

The direct-current power supplies PS1 and PS2 may each be provided inside the element array circuit 1 or outside the element array circuit 1.

[Measurement Operation in Element Array Circuit 1]

In the element array circuit 1, a resistance value of each of the resistors R may be measured in the following manner, for example. The following measurement operation may be performed in accordance with commands from the processor CTRL. To facilitate understanding, the following description is given without consideration of voltage drops caused by currents flowing through the row lines A and resistances of the row lines A, or voltage drops caused by currents flowing through the column lines B and resistances of the column lines B.

[Example of Measurement Operation in State A]

First, an example where measurement is performed in State A above will be described with reference to FIGS. 1 and 2.

Figure 2:
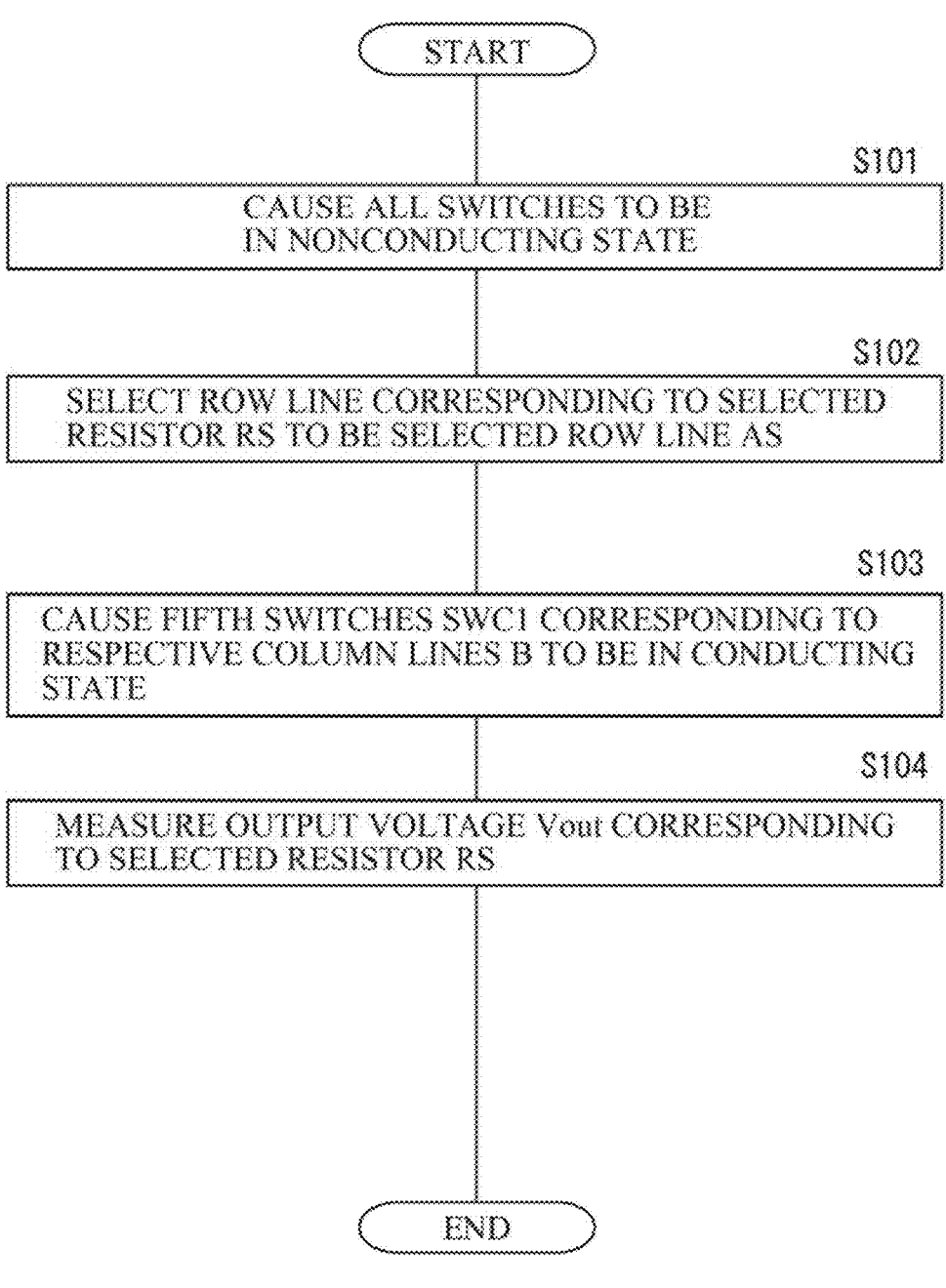
FIG. 2 is a flowchart describing a measurement operation example of the element array circuit illustrated in FIG. 1.

FIG. 2 is a flowchart describing a measurement operation example of the element array circuit 1 illustrated in FIG. 1. First, for example, all the switches of the first to fourth selectors SL1 to SL4 may be caused to be in the nonconducting state (step S101). For example, the first switches SWR1 (SWR1-1 to SWR1-m), the second switches SWR2 (SWR2-1 to SWR2-m), the third switches SWR3 (SWR3-1 to SWR3-m), the fourth switches SWR4 (SWR4-1 to SWR4-m), the fifth switches SWC1 (SWC1-1 to SWC1-n), and the sixth switches SWC2 (SWC2-1 to SWC2-n) illustrated in FIG. 1 may all be caused to be in the nonconducting state.

Thereafter, one row line corresponding to the selected resistor RS targeted for the measurement may be selected to be the selected row line AS (step S102). For example, as illustrated in FIG. 1, the processor CTRL may apply the first potential V1 to the first end SA of the selected row line AS by performing a selection operation to cause one of the first switches SWR1 that corresponds to the selected row line AS coupled to the selected resistor RS to be in the conducting state and keep one of the second switches SWR2 that corresponds to the selected row line AS in the nonconducting state. The processor CTRL may apply the second potential V2 to the first ends SA of the unselected row lines AU by performing a selection operation to keep the other ones of the first switches SWR1 that correspond to the unselected row lines AU in the nonconducting state and cause the other ones of the second switches SWR2 that correspond to the unselected row lines AU to be in the conducting state. Further, the processor CTRL may apply the first potential V1 to the second end EA of the selected row line AS by performing a selection operation to cause one of the third switches SWR3 that corresponds to the selected row line AS to be in the conducting state and keep one of the fourth switches SWR4 that corresponds to the selected row line AS in the nonconducting state. The processor CTRL may apply the second potential V2 to the second ends EA of the unselected row lines AU by performing a selection operation to keep the other ones of the third switches SWR3 that correspond to the unselected row lines AU in the nonconducting state and cause the other ones of the fourth switches SWR4 that correspond to the unselected row lines AU to be in the conducting state. In this way, the selection operation to cause the one of the third switches SWR3 that corresponds to the selected row line AS to be in the conducting state and keep the one of the fourth switches SWR4 that corresponds to the selected row line AS in the nonconducting state may be performed in synchronization with the selection operation to cause the one of the first switches SWR1 that corresponds to the selected row line AS to be in the conducting state and keep the one of the second switches SWR2 that corresponds to the selected row line AS in the nonconducting state. Note that FIG. 1 illustrates an example case where the selected row line AS is the row line A1. Accordingly, in the first selectors SL1-1 to SL1-m, the first switch SWR1-1 may be in the conducting state, the first switches SWR1-2 to SWR1-m may be in the nonconducting state, the second switch SWR2-1 may be in the nonconducting state, and the second switches SWR2-2 to SWR2-m may be in the conducting state. Further, in the second selectors SL2-1 to SL2-m, the third switch SWR3-1 may be in the conducting state, the third switches SWR3-2 to SWR3-m may be in the nonconducting state, the fourth switch SWR4-1 may be in the nonconducting state, and the fourth switches SWR4-2 to SWR4-m may be in the conducting state.

Thereafter, for example, the processor CTRL may cause all the fifth switches SWC1-1 to SWC1-n of the third selectors SL3-1 to SL3-n to be in the conducting state (step S103). In the element array circuit 1, the negative input terminal T2 of each of the first operational amplifiers OP1-1 to OP1-n may be at the second potential V2. Accordingly, a voltage (V2−V1) corresponding to a difference between the first potential V1 and the second potential V2 may be applied to the resistors R(1, 1) to R(1, n), causing currents dependent on the respective resistance values of the resistors R(1, 1) to R(1, n) to flow through the respective resistors R(1, 1) to R(1, n), and through the respective column lines B1 to Bn toward the respective first capacitors CP1-1 to CP1-n. In contrast, the second potential V2 may be applied to each of the row lines A2 to Am other than the row line A1 as the selected row line AS, and to each of the column lines B1 to Bn. Accordingly, a zero voltage may be applied to each of the resistors R other than the resistors R(1, 1) to R(1, n) as the selected resistors RS, causing no current to flow through each of the resistors R other than the resistors R(1, 1) to R(1, n).

Thereafter, an output voltage corresponding to each selected resistor RS may be measured (step S104). For example, an output voltage may be measured that results from each selected resistor RS coupled to both the selected row line AS and one of the column lines B and that is outputted from the output terminal T3 of one of the first operational amplifiers OP1 corresponding to the one of the column lines B. In the example embodiment illustrated in FIG. 1, an output voltage Vout may be measured that is outputted from the output terminal T3 of the first operational amplifier OP1-1 corresponding to the resistor R(1, 1) coupled to both the row line A1 and the column line B1. Similarly, an output voltage Vout may be measured that is outputted from the output terminal T3 of the first operational amplifier OP1-2 corresponding to the resistor R(1, 2) coupled to both the row line A1 and the column line B2; and an output voltage Vout may be measured that is outputted from the output terminal T3 of the first operational amplifier OP1-n corresponding to the resistor R(1, n) coupled to both the row line A1 and the column line Bn. Currents flowing through the respective column lines B1 to Bn may be converted into voltages by the respective first capacitors CP1-1 to CP1-n, and may be outputted as the output voltages Vout from the output terminals T3 of the first operational amplifiers OP1-1 to OP1-n that respectively correspond to the resistors R(1, 1) to R(1, n). The resistance value of each of the selected resistors RS or an intensity of an electromagnetic wave (e.g., infrared rays) applied to each of the selected resistors RS is calculable from corresponding one of the output voltages Vout.

The measurement operation in the element array circuit 1 in State A may thus be completed. To measure the output voltage Vout corresponding to each of the resistors R other than the resistors R(1, 1) to R(1, n), steps S101 to S104 described above may be repeated. Note that the above-described method of measuring the resistance values of the resistors R in the element array circuit 1 is one example, and an embodiment of the disclosure is not limited thereto. The above-described measurement example is where the measurement is performed in State A, that is, in the state where the first potential V1 is applied to both the first end SA and the second end EA of the selected row line AS. According to this measurement example, the measurement operation is continuable even if a break occurs in the selected row line AS.

In State A, when the output voltage Vout from the output terminal T3 of any one of the first operational amplifiers OP1-1 to OP1-n that respectively correspond to the resistors R(1, 1) to R(1, n) as the selected resistors RS is at an abnormal value, the processor CTRL may cause one of the sixth switches SWC2 that is coupled to the fourth end EB of the column line B corresponding to the one of the first operational amplifiers OP1 that has outputted the output voltage Vout of the abnormal value to be in the conducting state. This allows the output terminal T6 of one of the second operational amplifiers OP2 that corresponds to the above-described one of the sixth switches SWC2 to output an output voltage Vout corresponding to the resistor R regarding which the output voltage Vout from the first operational amplifier OP1 has exhibited the abnormal value. In this situation, one of the fifth switches SWC1 that is coupled to the third end SB of the column line B corresponding to the above-described one of the first operational amplifiers OP1 may be kept in the conducting state or may be switched to the nonconducting state. The measurement operation on the selected resistor RS is continuable if the output voltage Vout from the output terminal T6 of the above-described one of the second operational amplifiers OP2 is at a normal value. Note that as used herein, the "abnormal value" refers to a value of the output voltage Vout below a predetermined threshold, such as a value substantially equal to zero.

According to the above-described example of measurement operation in the element array circuit 1 in State A, selecting one row line to be the selected row line AS in step S102 is followed by causing the fifth switches SWC1 to be in the conducting state in step S103 to thereby measure the output voltages Vout from the output terminals T3 of the first operational amplifiers OP1 in step S104. However, in some embodiments, the sixth switches SWC2 may be caused to be in the conducting state in step S103 to thereby measure the output voltages Vout from the output terminals T6 of the second operational amplifiers OP2 in step S104. In this situation, if the output voltage Vout from the output terminal T6 of any one of the second operational amplifiers OP2 is at an abnormal value, one of the fifth switches SWC1 that is coupled to the third end SB of the column line B corresponding to the one of the second operational amplifiers OP2 that has outputted the output voltage Vout of the abnormal value to be in the conducting state. This allows the output terminal T3 of one of the first operational amplifiers OP1 that corresponds to the above-described one of the fifth switches SWC1 to output an output voltage Vout corresponding to the resistor R regarding which the output voltage Vout from the second operational amplifier OP2 has exhibited the abnormal value. In this situation, one of the sixth switches SWC2 that is coupled to the fourth end EB of the column line B corresponding to the above-described one of the second operational amplifiers OP2 may be kept in the conducting state or may be switched to the nonconducting state. The measurement operation on the selected resistor RS is continuable if the output voltage Vout from the output terminal T3 of the above-described one of the first operational amplifiers OP1 is at a normal value in this stage.

[Example of Measurement Operation in State B]

Figure 3:
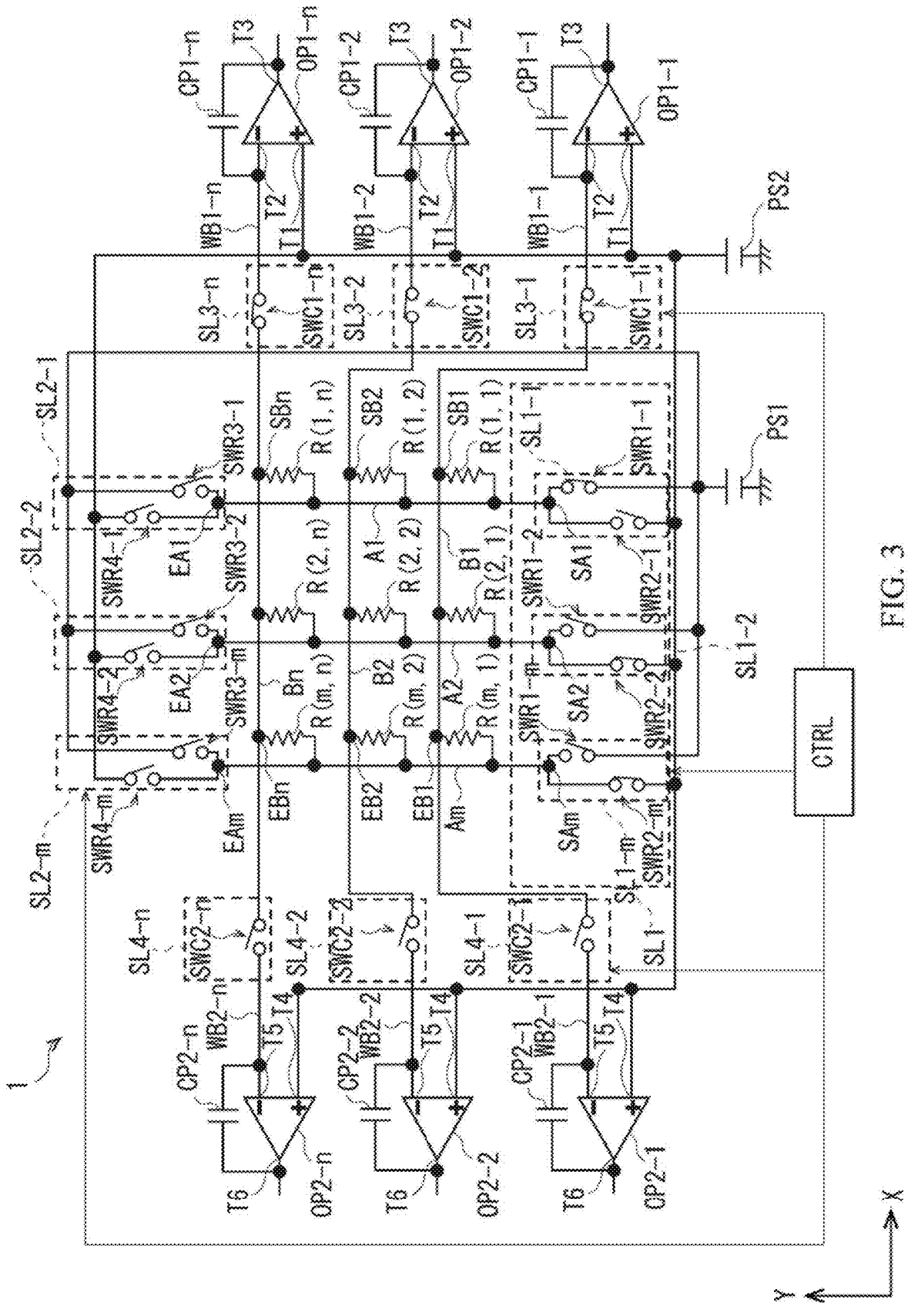
FIG. 3 is a first explanatory diagram describing the measurement operation example of the element array circuit illustrated in FIG. 1.

An example of measurement operation in State B will now be described with reference to FIGS. 2 and 3. FIG. 3 is a circuit diagram for describing the example of measurement operation in State B. As with the above-described example of measurement operation in State A, for example, all the switches of the first to fourth selectors SL1 to SL4 may be caused to be in the nonconducting state (step S101). For example, the first switches SWR1 (SWR1-1 to SWR1-m), the second switches SWR2 (SWR2-1 to SWR2-m), the third switches SWR3 (SWR3-1 to SWR3-m), the fourth switches SWR4 (SWR4-1 to SWR4-m), the fifth switches SWC1 (SWC1-1 to SWC1-n), and the sixth switches SWC2 (SWC2-1 to SWC2-n) may all be caused to be in the nonconducting state.

Thereafter, one row line corresponding to the selected resistor RS targeted for the measurement may be selected to be the selected row line AS (step S102). For example, as illustrated in FIG. 3, the processor CTRL may apply the first potential V1 to the first end SA of the selected row line AS by performing the selection operation to cause one of the first switches SWR1 that corresponds to the selected row line AS coupled to the selected resistor RS to be in the conducting state and keep one of the second switches SWR2 that corresponds to the selected row line AS in the nonconducting state. At the same time, the processor CTRL may apply the second potential V2 to the first ends SA of the unselected row lines AU by performing the selection operation to keep the other ones of the first switches SWR1 that correspond to the unselected row lines AU in the nonconducting state and cause the other ones of the second switches SWR2 that correspond to the unselected row lines AU to be in the conducting state. At this time, the processor CTRL may perform a selection operation to keep the third switches SWR3 corresponding to all the row lines A in the nonconducting state and keep the fourth switches SWR4 corresponding to all the row lines A in the nonconducting state. In other words, the processor CTRL may cause the second end EA of the selected row line AS and the second ends EA of the unselected row lines AU to be all open. Note that FIG. 3 illustrates an example case where the selected row line AS is the row line A1. Accordingly, in the first selectors SL1-1 to SL1-m, the first switch SWR1-1 may be in the conducting state, the first switches 1-2 to 1-m may be in the nonconducting state, the second switch SWR2-1 may be in the nonconducting state, and the second switches SWR2-2 to SWR2-m may be in the conducting state. Further, in the second selectors SL2-1 to SL2-m, the third switches SWR3-1 to SWR3-m and the fourth switches SWR4-1 to SWR4-m may all be in the nonconducting state.

Following a procedure similar to that described in relation to the example of measurement operation in State A, the processor CTRL may cause all the fifth switches SWC1-1 to SWC1-n of the third selectors SL3-1 to SL3-n to be in the conducting state (step S103), and may measure the output voltage corresponding to each selected resistor RS (step S104). The measurement operation in the element array circuit 1 in State B may thus be completed.

The above-described measurement example is where the measurement is performed in State B, that is, in the state where the first potential V1 is applied to the first end SA of the selected row line AS and not to the second end EA of the selected row line AS. According to this measurement example, if a break occurs in the selected row line AS, the output voltage Vout from the output terminal T3 of one of the first operational amplifiers OP1 that corresponds to the selected row line AS is to exhibit an abnormal value. In such a case, in some embodiments, the processor CTRL may cause the element array circuit 1 to change from State B to State A. In other words, the first potential V1 may be applied to the second end EA of the selected row line AS. For example, the processor CTRL may apply the first potential V1 to the second end EA of the selected row line AS by performing the selection operation to cause, in the second selectors SL2, one of the third switches SWR3 that corresponds to the selected row line AS to be in the conducting state and keep one of the fourth switches SWR4 that corresponds to the selected row line AS in the nonconducting state. At the same time, the processor CTRL may keep the other ones of the third switches SWR3 that correspond to the unselected row lines AU in the nonconducting state and also keep the other ones of the fourth switches SWR4 that correspond to the unselected row lines AU in the nonconducting state. The measurement operation is continuable if the output voltage Vout from the output terminal T3 of the above-described one of the first operational amplifiers OP1 reaches a normal value after the above-described operation.

If, however, the output voltage Vout from the output terminal T3 of the above-described one of the first operational amplifiers OP1 is still at the abnormal value even after the application of the first potential V1 to the second end EA of the selected row line AS, the processor CTRL may cause one of the sixth switches SWC2 that is coupled to the fourth end EB of the column line B corresponding to the one of the first operational amplifiers OP1 that has outputted the output value Vout of the abnormal value to be in the conducting state. In this situation, one of the fifth switches SWC1 that is coupled to the third end SB of the column line B corresponding to the above-described one of the first operational amplifiers OP1 may be kept in the conducting state or may be switched to the nonconducting state. The above-described operation allows the output terminal T6 of one of the second operational amplifiers OP2 that corresponds to the above-described one of the sixth switches SWC2 to output an output voltage Vout corresponding to the resistor R regarding which the output voltage Vout from the first operational amplifier OP1 has exhibited the abnormal value. The measurement operation on the selected resistor RS is continuable if the output voltage Vout from the output terminal T6 of the above-described one of the second operational amplifiers OP2 is at a normal value.

In some embodiments, when the output voltage Vout from the output terminal T3 of any one of the first operational amplifiers OP1 exhibits an abnormal value upon performing the measurement operation in State B, the following measures may be taken to continue the measurement operation. For example, the processor CTRL may first cause one of the sixth switches SWC2 that is coupled to the fourth end EB of the column line B corresponding to the one of the first operational amplifiers OP1 that has outputted the output voltage Vout of the abnormal value to be in the conducting state. In this situation, one of the fifth switches SWC1 that is coupled to the third end SB of the column line B corresponding to the above-described one of the first operational amplifiers OP1 may be kept in the conducting state or may be switched to the nonconducting state. The measurement operation is continuable if the output voltage Vout from the output terminal T6 of one of the second operational amplifiers OP2 that corresponds to the above-described one of the sixth switches SWC2 is at a normal value after the above-described operation.

Suppose, however, that the output voltage Vout from the output terminal T6 of the above-described one of the second operational amplifiers OP2 exhibits an abnormal value after the sixth switch SWC2 coupled to the fourth end EB of the column line B corresponding to the above-described one of the first operational amplifiers OP1 has been caused to be in the conducting state. In such a case, in some embodiments, the processor CTRL may cause the element array circuit 1 to change from State B to State A. In other words, the processor CTRL may cause the first potential V1 to be applied to the second end EA of the selected row line AS. The measurement operation is continuable if the output voltage Vout from the output terminal T6 of the above-described one of the second operational amplifiers OP2 reaches a normal value after the above-described operation.

If the output voltage Vout from the output terminal T6 of the above-described one of the second operational amplifiers OP2 is still at the abnormal value, the processor CTRL may cause the fifth switch SWC1 coupled to the third end SB of the column line B corresponding to the one of the second operational amplifiers OP2 that has outputted the output voltage Vout of the abnormal value to be in the conducting state, while keeping the state where the first potential V1 is applied to the second end EA of the selected row line AS, and may thereby obtain an output voltage Vout from the output terminal T3 of the first operational amplifier OP1. In this situation, the sixth switch SWC2 coupled to the fourth end EB of the column line B corresponding to the above-described one of the second operational amplifiers OP2 may be kept in the conducting state or may be switched to the nonconducting state. The measurement operation is continuable if the output voltage Vout from the output terminal T3 is at a normal value in this stage. Note that in the above-described measurement example in State B, ones of the fourth switches SWR4 that correspond to the unselected row lines AU may be kept in the nonconducting state. In some embodiments, however, the ones of the fourth switches SWR4 that correspond to the unselected row lines AU may be caused to be in the conducting state at or after step S102.

According to the above-described example of measurement operation in the element array circuit 1 in State B, selecting one row line to be the selected row line AS in step S102 is followed by causing the fifth switches SWC1 to be in the conducting state in step S103 to thereby measure the output voltages Vout from the output terminals T3 of the first operational amplifiers OP1 in step S104. However, in some embodiments, the sixth switches SWC2 may be caused to be in the conducting state in step S103 to thereby measure the output voltages Vout from the output terminals T6 of the second operational amplifiers OP2 in step S104. In this situation, if the output voltage Vout from the output terminal T6 of any one of the second operational amplifiers OP2 is at an abnormal value, the processor CTRL may cause the element array circuit 1 to change from State B to State A, in some embodiments. If the output voltage Vout from the output terminal T6 of the above-described one of the second operational amplifiers OP2 is still at the abnormal value even after the change to State A, the processor CTRL may cause one of the fifth switches SWC1 that is coupled to the third end SB of the column line B corresponding to the one of the second operational amplifiers OP2 that has outputted the output voltage Vout of the abnormal value to be in the conducting state. This allows the output terminal T3 of one of the first operational amplifiers OP1 that corresponds to the above-described one of the fifth switches SWC1 to output an output voltage Vout corresponding to the resistor R regarding which the output voltage Vout from the second operational amplifier OP2 has exhibited the abnormal value. The measurement operation on the selected resistor RS is continuable if the output voltage Vout from the output terminal T3 of the foregoing one of the first operational amplifiers OP1 is at a normal value in this stage.

In the above-described measurement operation in the element array circuit 1 in State B, if the output voltage Vout from the output terminal T6 of any one of the second operational amplifiers OP2 exhibits an abnormal value in step S104, the processor CTRL may cause, in some embodiments, one of the fifth switches SWC1 that is coupled to the third end SB of the column line B corresponding to the one of the second operational amplifiers OP2 that has outputted the output voltage Vout of the abnormal value to be in the conducting state. The measurement operation is continuable if the output voltage Vout from the output terminal T3 of corresponding one of the first operational amplifiers OP1 is at a normal value in this stage. If, however, the output voltage Vout from the output terminal T3 of the corresponding one of the first operational amplifiers OP1 is at an abnormal value after the fifth switch SWC1 coupled to the third end SB of the column line B corresponding to the above-described one of the second operational amplifiers OP2 has been caused to be in the conducting state, the processor CTRL may cause the element array circuit 1 to change from State B to State A. The measurement operation is continuable if the output voltage Vout from the output terminal T3 of the one of the first operational amplifiers OP1 reaches a normal value after the above-described operation. If, however, the output voltage Vout from the output terminal T3 of the one of the first operational amplifiers OP1 is still at the abnormal value, the processor CTRL may cause the sixth switch SWC2 coupled to the fourth end EB of the column line B corresponding to the one of the first operational amplifiers OP1 that has outputted the output voltage Vout of the abnormal value to be in the conducting state, while keeping the state where the first potential V1 is applied to the second end EA of the selected row line AS, and may thereby obtain an output voltage Vout from the output terminal T6 of the above-described one of the second operational amplifiers OP2. The measurement operation is continuable if the output voltage Vout from the output terminal T6 is at a normal value in this stage.

[Determining Location of Break in Element Array Circuit 1]

A description will now be given of a method of determining a location of a break that is assumed to be present somewhere in the element array circuit 1.

1. First Example

First, the following will describe how to determine the location of a break in the element array circuit 1 in State A described above.

Figure 4A:
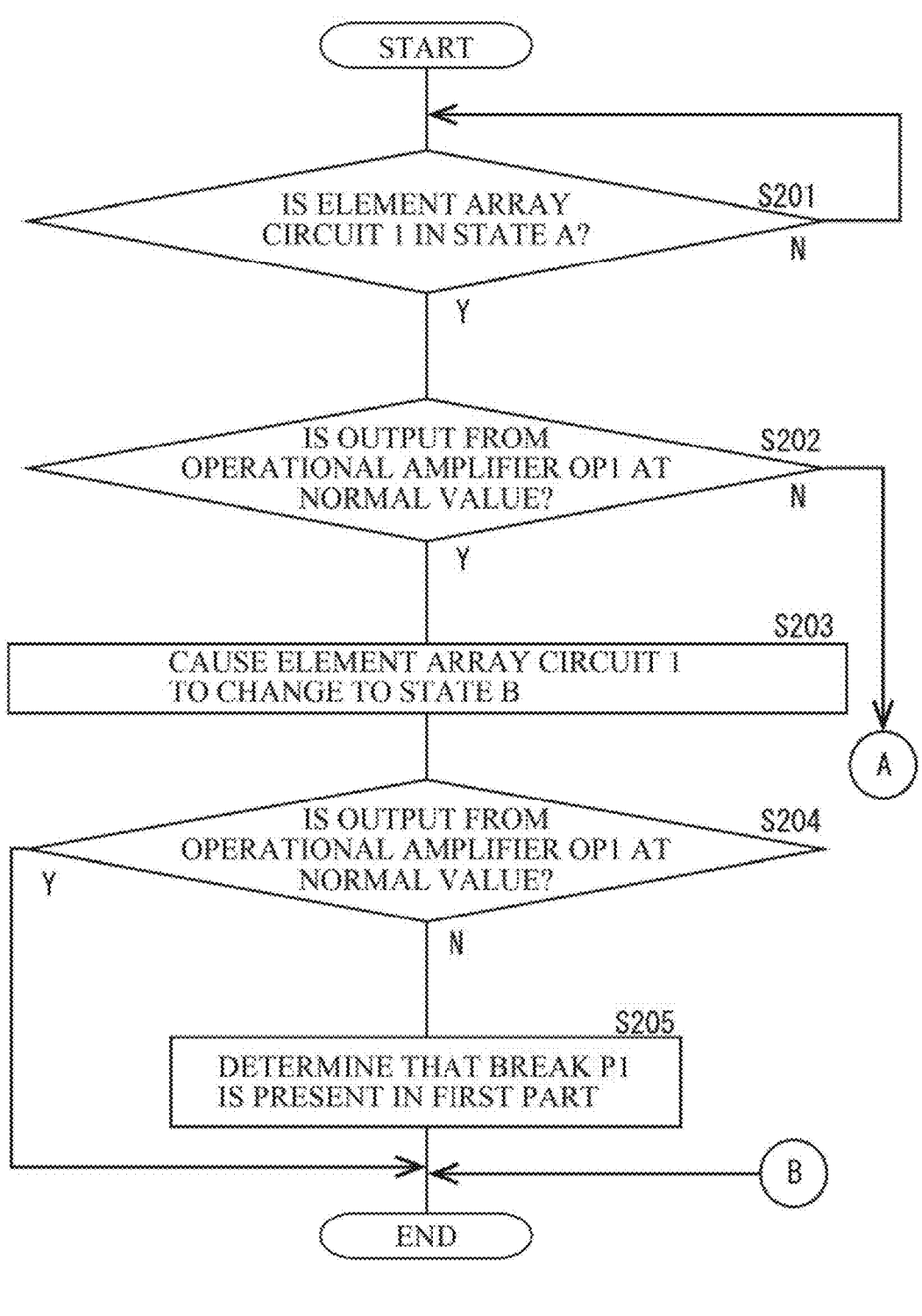
FIG. 4A is a first flowchart describing a first example of a procedure of determining a location of a break in the element array circuit illustrated in FIG. 1.
Figure 4B:
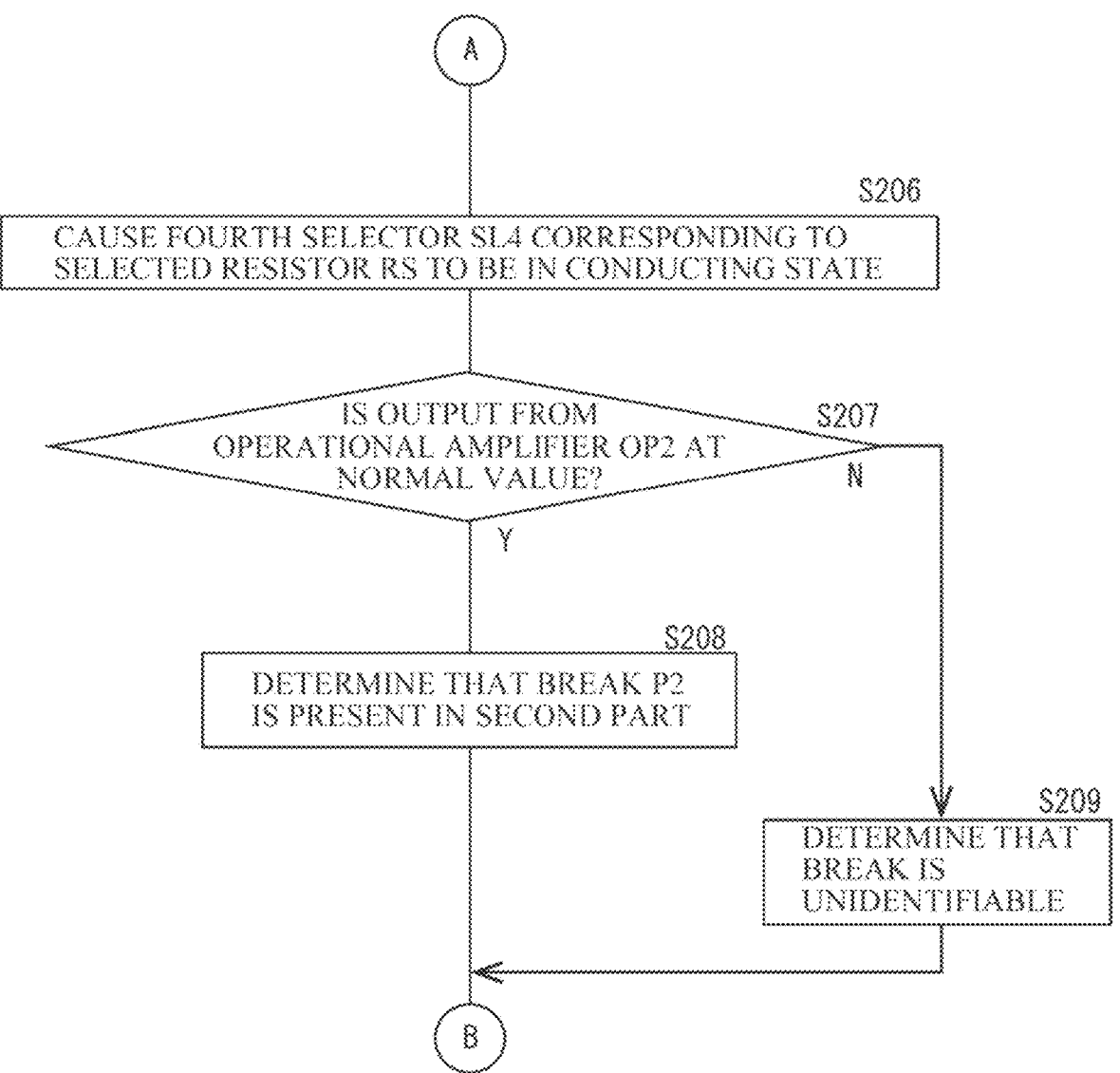
FIG. 4B is a second flowchart describing the first example of the procedure of determining the location of a break in the element array circuit illustrated in FIG. 1.

FIGS. 4A and 4B are flowcharts describing a first example of a procedure of determining the location of a break in the element array circuit 1. First, as illustrated in FIG. 4A, a determination may be made as to whether the element array circuit 1 is in State A (step S201). If it is determined that the element array circuit 1 is in State A (Y in Step S201), a determination may be made as to whether an output from one first operational amplifier OP1 corresponding to the selected resistor RS is at a normal value (step S202). If it is determined that the output from the one first operational amplifier OP1 corresponding to the selected resistor RS is at a normal value (Y in step S202), the processor CTRL may cause the element array circuit 1 to change to State B (step S203). For example, the processor CTRL may cause the second end EA of the selected row line AS to be open, while keeping the state where the first potential V1 is applied via one first selector SL1 to the first end SA of the selected row line AS coupled to the selected resistor RS. Thereafter, a determination may be made again as to whether the output from the one first operational amplifier OP1 corresponding to the selected resistor RS is at a normal value (step S204). If it is determined that the output from the one first operational amplifier OP1 corresponding to the selected resistor RS is not at a normal value, that is, at an abnormal value (N in step S204), the processor CTRL may determine that a break is present in a first part from the selected resistor RS to the one first selector SL1 corresponding to the selected resistor RS along the selected row line AS (step S205), and may cause the process to end (End).

Figure 5:
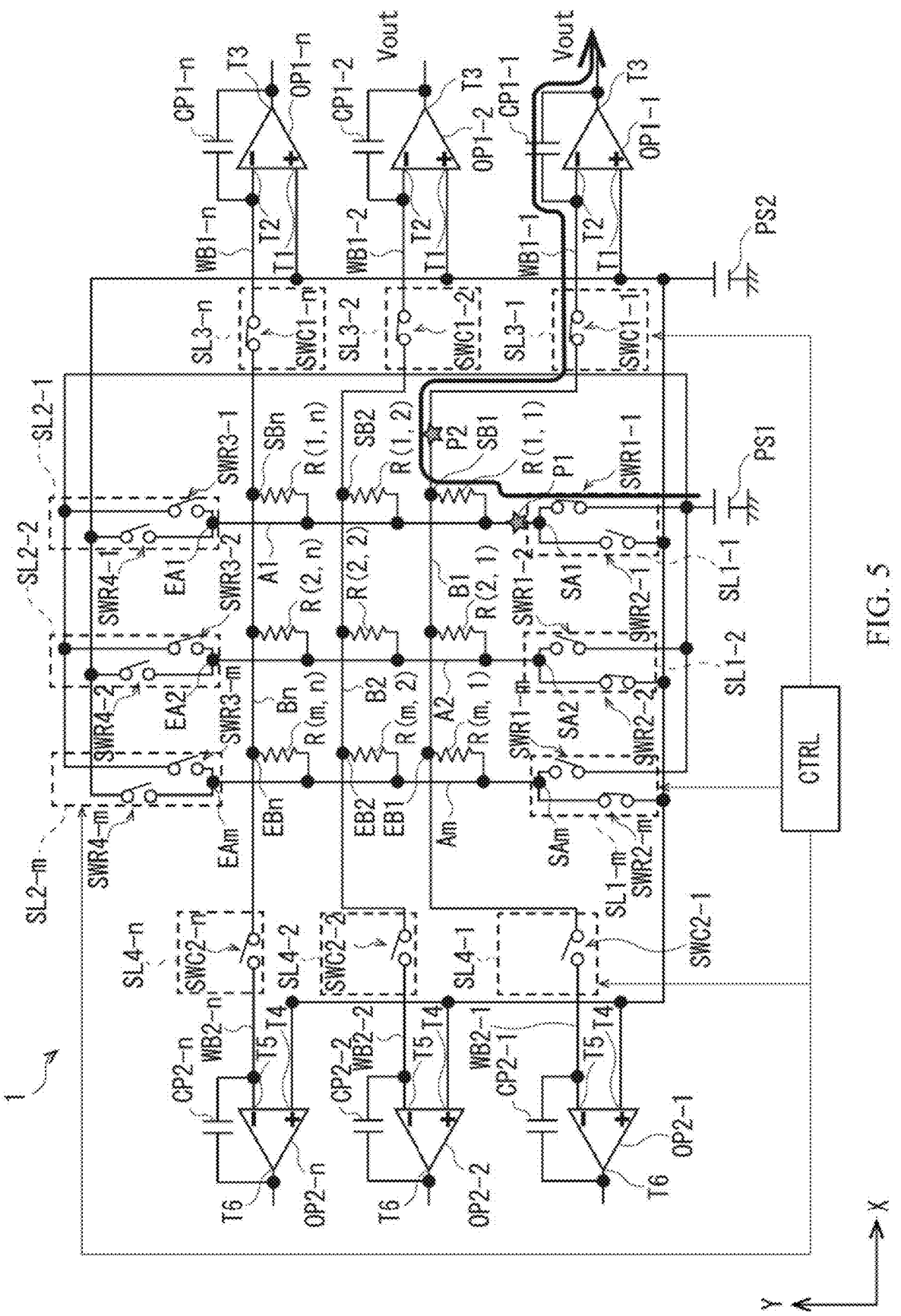
FIG. 5 is a first explanatory diagram describing the first example of the procedure of determining the location of a break in the element array circuit illustrated in FIG. 1.

For example, as exemplified in FIG. 5, in the element array circuit 1 in State B where the first potential V1 is applied to the first end SA1 of the row line A1 as the selected row line AS and the second end EA1 of the row line A1 as the selected row line AS is open, if the output voltage Vout that corresponds to the resistor R(1, 1) and is outputted from the first operational amplifier OP1-1 along a solid-line path is at an abnormal value (N in step S204), the processor CTRL may determine that a break P1 is present in the first part from the resistor R(1, 1) to the first selector SL1-1 along the row line A1 (step S205). In FIG. 5, the row line A1 is the selected row line AS and the resistor R(1, 1) is the selected resistor RS. FIG. 5 illustrates an example case where, while the first switch SWR1-1 of the first selector SL1-1 corresponding to the row line A1 is caused to be in the conducting state to thereby apply the first potential V1 to the first end SA1, the second switch SWR2-1 of the first selector SL1-1 corresponding to the row line A1 is caused to be in the nonconducting state, and the third switch SWR3-1 and the fourth switch SWR4-1 of the second selector SL2-1 corresponding to the row line A1 are both caused to be in the nonconducting state. Note that the second potential V2 may be applied to each of the first ends SA2 to SAm of the row lines A2 to Am as the unselected row lines AU, and the second ends EA2 to EAm of the row lines A2 to Am as the unselected row lines AU may be open. For example, the first switches SWR1-2 to SWR1-$m$ of the first selectors SL1-2 to SL1-$m$ may be caused to be in the nonconducting state, the second switches SWR2-2 to SWR2-$m$ of the first selectors SL1-2 to SL1-$m$ may be caused to be in the conducting state, the third switches SWR3-2 to SWR3-$m$ of the second selectors SL2-2 to SL2-$m$ may be caused to be in the nonconducting state, and the fourth switches SWR4-2 to SWR4-$m$ of the second selectors SL2-2 to SL2-$m$ may be caused to be in the nonconducting state. In some embodiments, the fourth switches SWR4-2 to SWR4-$m$ of the second selectors SL2-2 to SL2-$m$ may be caused to be in the conducting state to thereby apply the second potential V2 to the second ends EA2 to EAm of the row lines A2 to Am as the unselected row lines AU. The fifth switches SWC1-1 to SWC1-$n$ of the third selectors SL3-1 to SL3-$n$ may all be caused to be in the conducting state, and the sixth switches SWC2-1 to SWC2-$n$ of the fourth selectors SL4-1 to SL4-$n$ may all be caused to be in the nonconducting state.

If it is determined in step S204 that the output from the one first operational amplifier OP1 corresponding to the selected resistor RS is at a normal value (Y in step S202), the processor CTRL may determine that no break is present in a second part from the selected resistor RS to the first operational amplifier OP1 corresponding to the selected resistor RS along one column line B and one coupling line WB1 that are coupled to the selected resistor RS, and that no break is present in the selected row line AS, either. The processor CTRL may thus cause the process to end (End).

If it is determined in step S202 that the output from the one first operational amplifier OP1 corresponding to the selected resistor RS is not at a normal value, that is, at an abnormal value (N in step S202), the process may proceed to step S206 (FIG. 4B). In step S206, one fourth selector SL4 corresponding to the selected resistor RS may be caused to be in the conducting state. In this situation, one third selector SL3 corresponding to the selected resistor RS may be kept in the conducting state or may be switched to the nonconducting state. Thereafter, a determination may be made as to whether an output from one second operational amplifier OP2 coupled to the fourth selector SL4 corresponding to the selected resistor RS is at a normal value (step S207). If it is determined that the output from the one second operational amplifier OP2 corresponding to the selected resistor RS is at a normal value (Y in step S207), the processor CTRL may determine that a break is present in the second part from the selected resistor RS to the one first operational amplifier OP1 corresponding to the selected resistor RS along the one column line B and the one coupling line WB1 that are coupled to the selected resistor RS (step S208).

Figure 6:
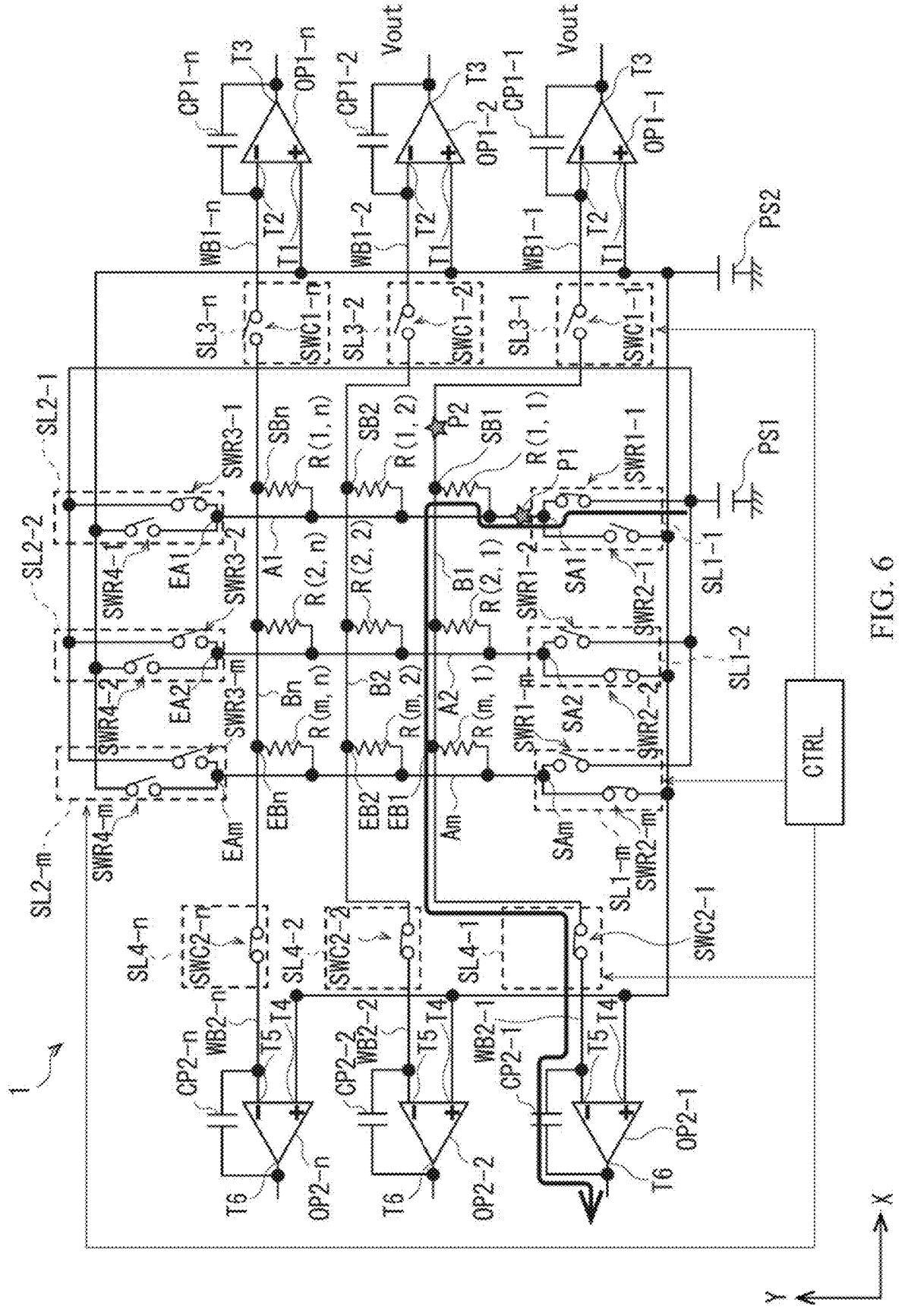
FIG. 6 is a second explanatory diagram describing the first example of the procedure of determining the location of a break in the element array circuit illustrated in FIG. 1.

For example, as exemplified in FIG. 6, in the element array circuit 1 in State A where the first potential V1 is applied to the first end SA1 of the row line A1 as the selected row line AS and to the second end EA1 of the row line A1 as the selected row line AS, if the output voltage Vout from the first operational amplifier OP1-1 corresponding to the resistor R(1, 1) as the selected resistor RS exhibits an abnormal value (N in step S202), the sixth switch SWC2-1 coupled to the fourth end EB1 of the column line B1 corresponding to the first operational amplifier OP1-1 that has outputted the output voltage Vout of the abnormal value may be caused to be in the conducting state in accordance with a command from the processor CTRL (step S206). In this situation, the fifth switch SWC1-1 corresponding to the first operational amplifier OP1-1 that has outputted the output voltage Vout of the abnormal value may be kept in the conducting state or may be switched to the nonconducting state. Causing the sixth switch SWC2-1 to be in the conducting state allows an output voltage Vout reflecting a resistance value of the resistor R(1, 1) to be outputted from the output terminal T6 of the second operational amplifier OP2-1 along a solid-line path in FIG. 6. If the output voltage Vout that corresponds to the resistor R(1, 1) and is outputted from the second operational amplifier OP2-1 along the solid-line path in FIG. 6 is at a normal value (Y in step S207), the processor CTRL may determine that a break P2 is present in the second part along the coupling line WB1-1 (step S208), and may cause the process to end (End). Further, if it is determined in step S207 that the output from the one second operational amplifier OP2 corresponding to the selected resistor RS is not at a normal value, that is, at an abnormal value (N in step S207), the processor CTRL may determine that a break is unidentifiable (step S209), and may cause the process to end (End).

If the break P2 is present in the coupling line WB1-1 as illustrated in FIG. 6, the output voltage Vout from the first operational amplifier OP1-1 would also exhibit an abnormal value for each of the resistors R(2, 1) to R(m, 1). To address this, the processor CTRL may sequentially select the row lines A2 to Am to be the selected row line AS while causing the sixth switch SWC2-1 to be in the conducting state. This allows output voltages Vout reflecting the respective resistance values of the resistors R(2, 1) to R(m, 1) to be sequentially outputted from the output terminal T6 of the second operational amplifier OP2-1.

2. Second Example

Figure 7A:
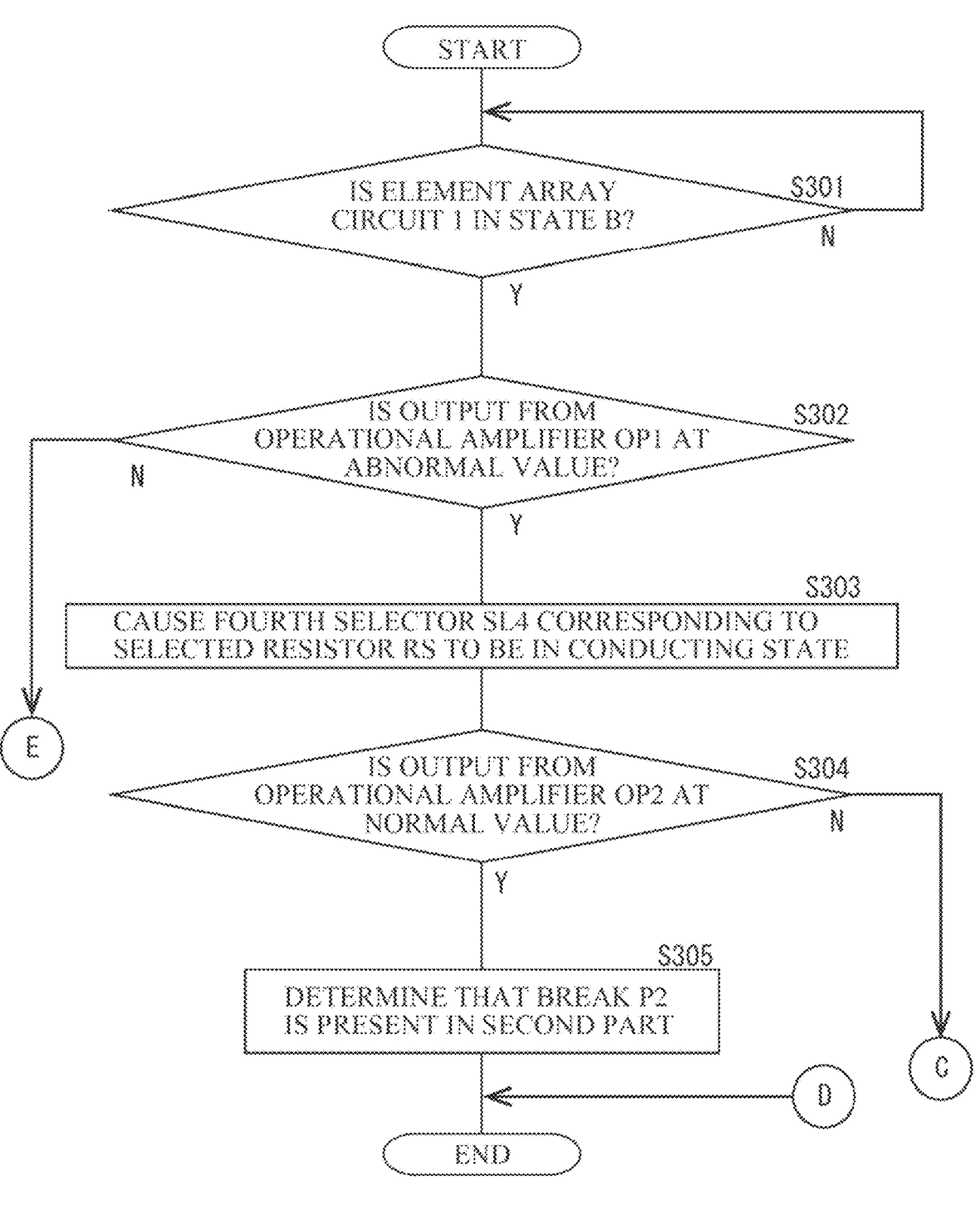
FIG. 7A is a first flowchart describing a second example of the procedure of determining the location of a break in the element array circuit illustrated in FIG. 1.
Figure 7B:
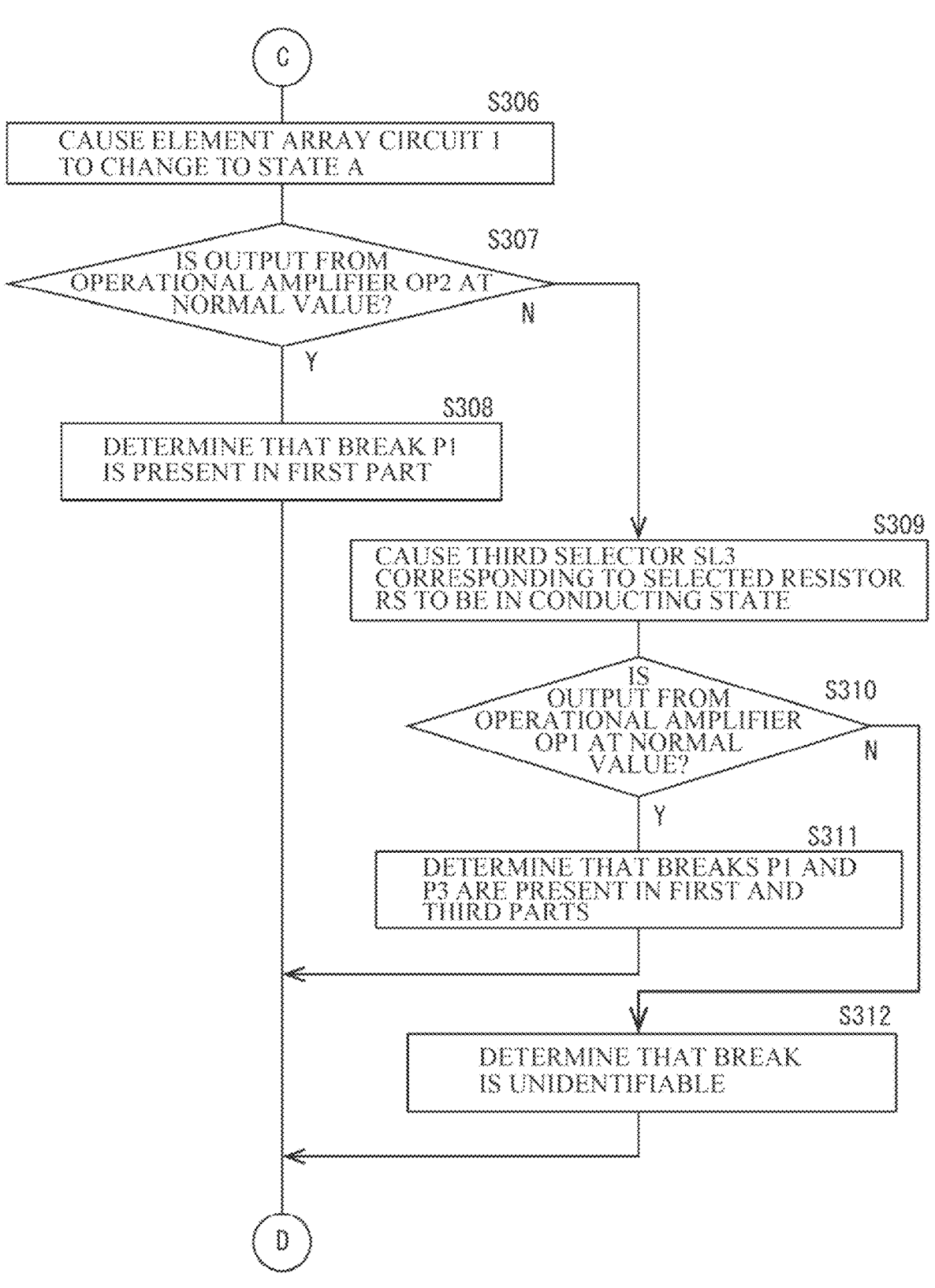
FIG. 7B is a second flowchart describing the second example of the procedure of determining the location of a break in the element array circuit illustrated in FIG. 1.
Figure 7C:
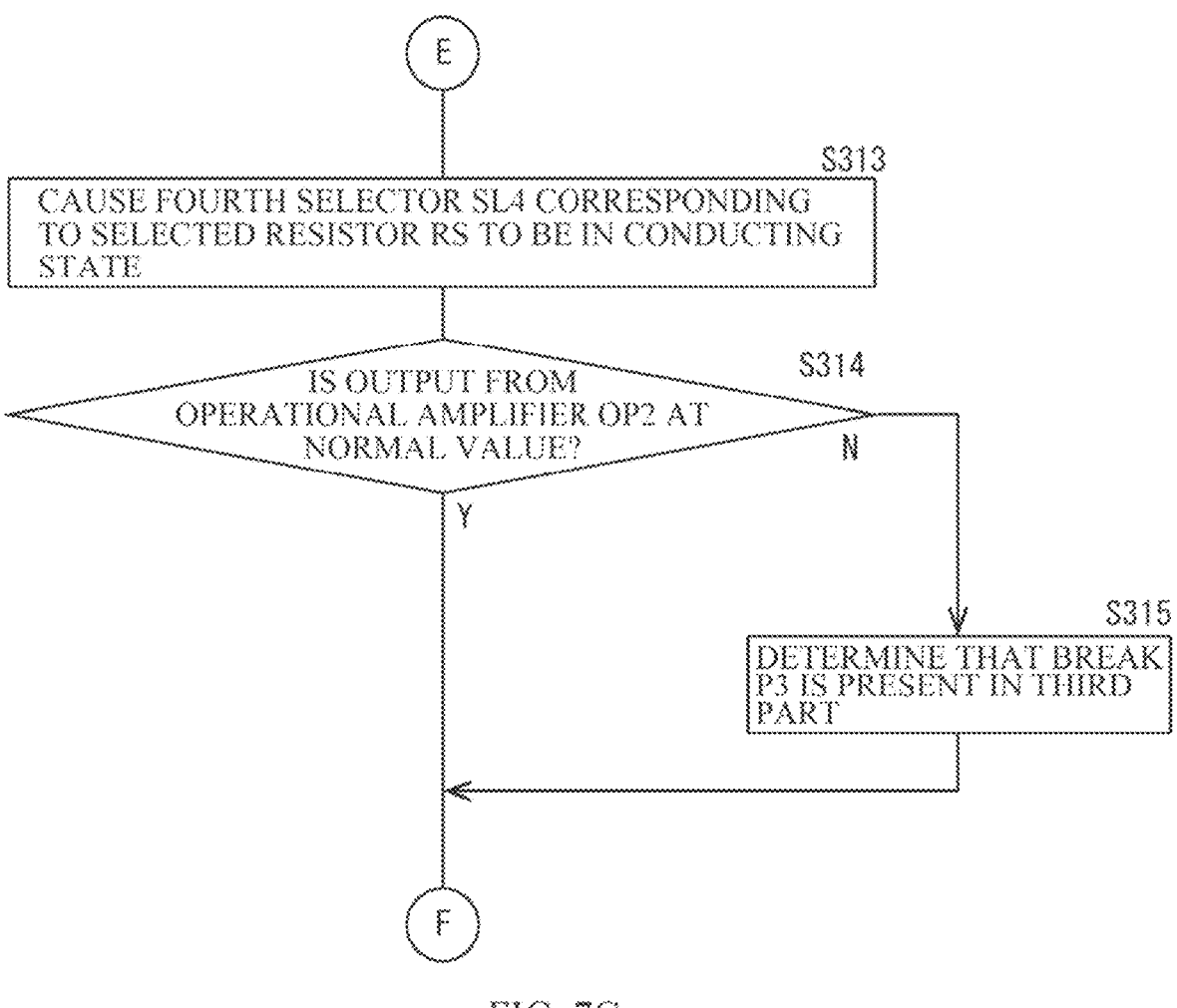
FIG. 7C is a third flowchart describing the second example of the procedure of determining the location of a break in the element array circuit illustrated in FIG. 1.

FIGS. 7A to 7C are flowcharts describing a second example of the procedure of determining the location of a break in the element array circuit 1. First, as illustrated in FIG. 7A, a determination may be made as to whether the element array circuit 1 is in State B (step S301). If it is determined that the element array circuit 1 is in State B (Y in Step S301), a determination may be made as to whether an output from one first operational amplifier OP1 corresponding to the selected resistor RS is at an abnormal value (step S302). If it is determined that the output from the one first operational amplifier OP1 corresponding to the selected resistor RS is at an abnormal value (Y in step S302), the process may proceed to step S303. In step S303, one fourth selector SL4 corresponding to the selected resistor RS may be caused to be in the conducting state. In this situation, one third selector SL3 corresponding to the selected resistor RS may be kept in the conducting state or may be switched to the nonconducting state. Thereafter, a determination may be made as to whether an output from one second operational amplifier OP2 coupled to the one fourth selector SL4 corresponding to the selected resistor RS is at a normal value (step S304). If it is determined that the output from the one second operational amplifier OP2 corresponding to the selected resistor RS is at a normal value (Y in step S304), the processor CTRL may determine that a break is present in the second part from the selected resistor RS to the one first operational amplifier OP1 corresponding to the selected resistor RS along one column line B and one coupling line WB1 that are coupled to the selected resistor RS (step S305).

Figure 8:
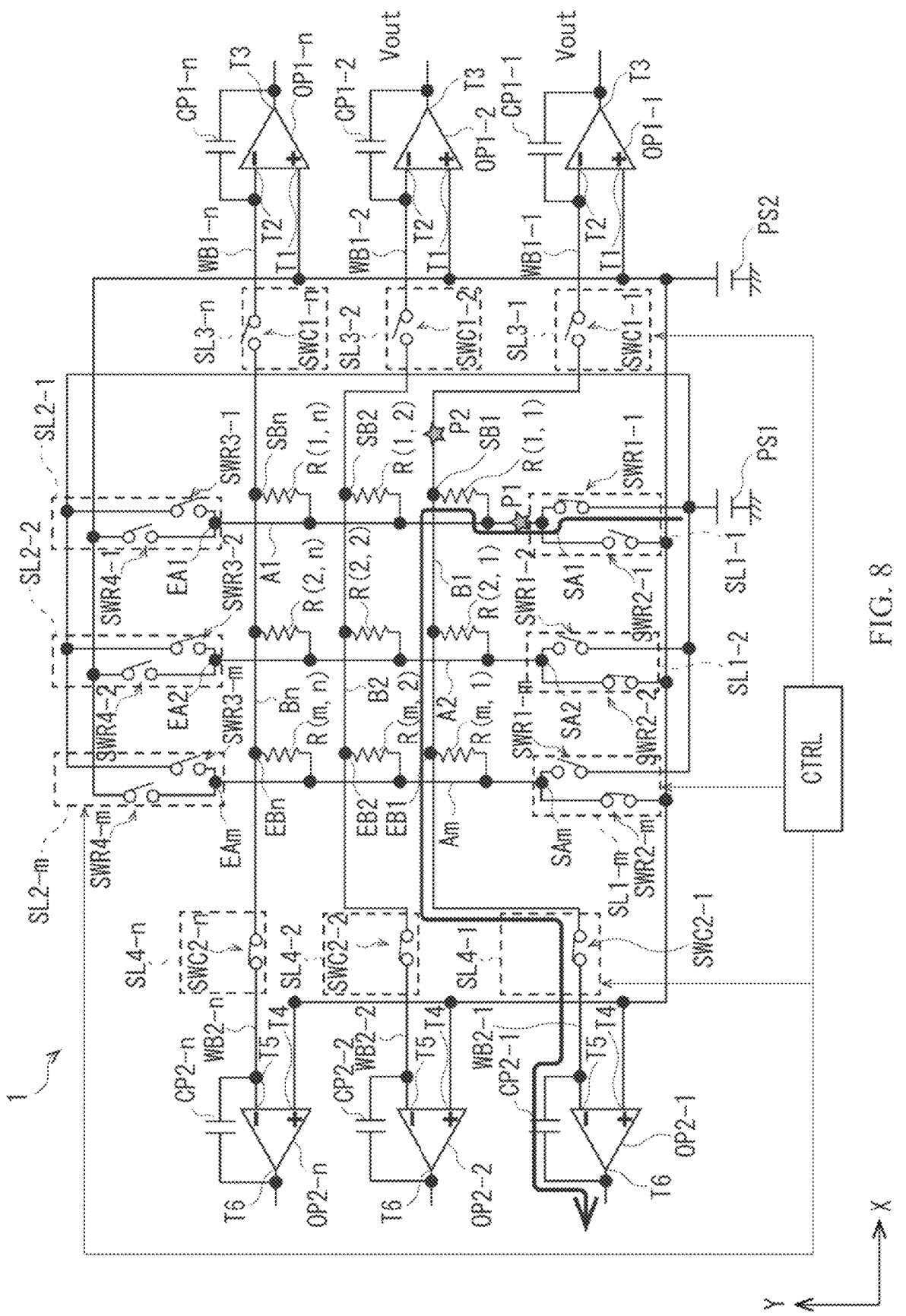
FIG. 8 is a first explanatory diagram describing the second example of the procedure of determining the location of a break in the element array circuit illustrated in FIG. 1.

For example, as exemplified in FIG. 8, in the element array circuit 1 in State B where the first potential V1 is applied to the first end SA1 of the row line A1 as the selected row line AS and the second end EA1 of the row line A1 as the selected row line AS is open, if the output voltage Vout that corresponds to the resistor R(1, 1) and is outputted from the second operational amplifier OP2-1 along the solid-line path is at a normal value (Y in step S304), the processor CTRL may determine that the break P2 is present in the second part along the coupling line WB1-1 (step S305).

If it is determined in step S304 of FIG. 7A that the output from the one second operational amplifier OP2 corresponding to the selected resistor RS is at an abnormal value (N in step S304), the process may proceed to step S306 (FIG. 7B). In step S306, the processor CTRL may cause the element array circuit 1 to change to State A. In other words, the processor CTRL may apply the first potential V1 to the first end SA of the selected row line AS via the first selector SL1, and apply the first potential V1 to the second end EA of the selected row line AS via the second selector SL2. Thereafter, a determination may be made as to whether the output from the one second operational amplifier OP2 coupled to the one fourth selector SL4 corresponding to the selected resistor RS is at a normal value (step S307). If it is determined that the output from the one second operational amplifier OP2 corresponding to the selected resistor RS is at a normal value (Y in step S307), the processor CTRL may determine that a break is present in the first part from the selected resistor RS to the one first selector SL1 corresponding to the selected resistor RS along the selected row line AS (step S308), and may cause the process to end (End).

Figure 9:
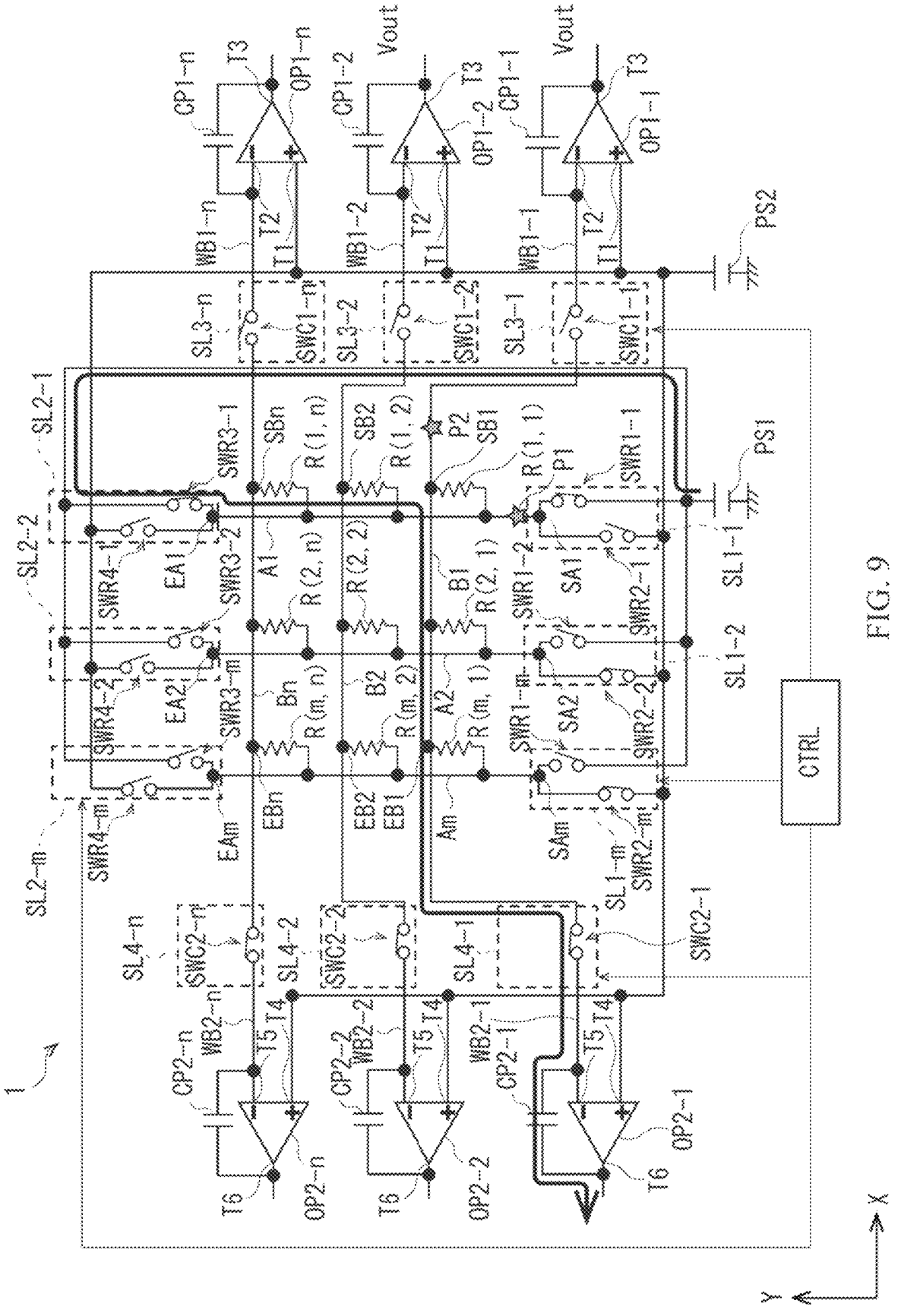
FIG. 9 is a second explanatory diagram describing the second example of the procedure of determining the location of a break in the element array circuit illustrated in FIG. 1.
Figure 10:
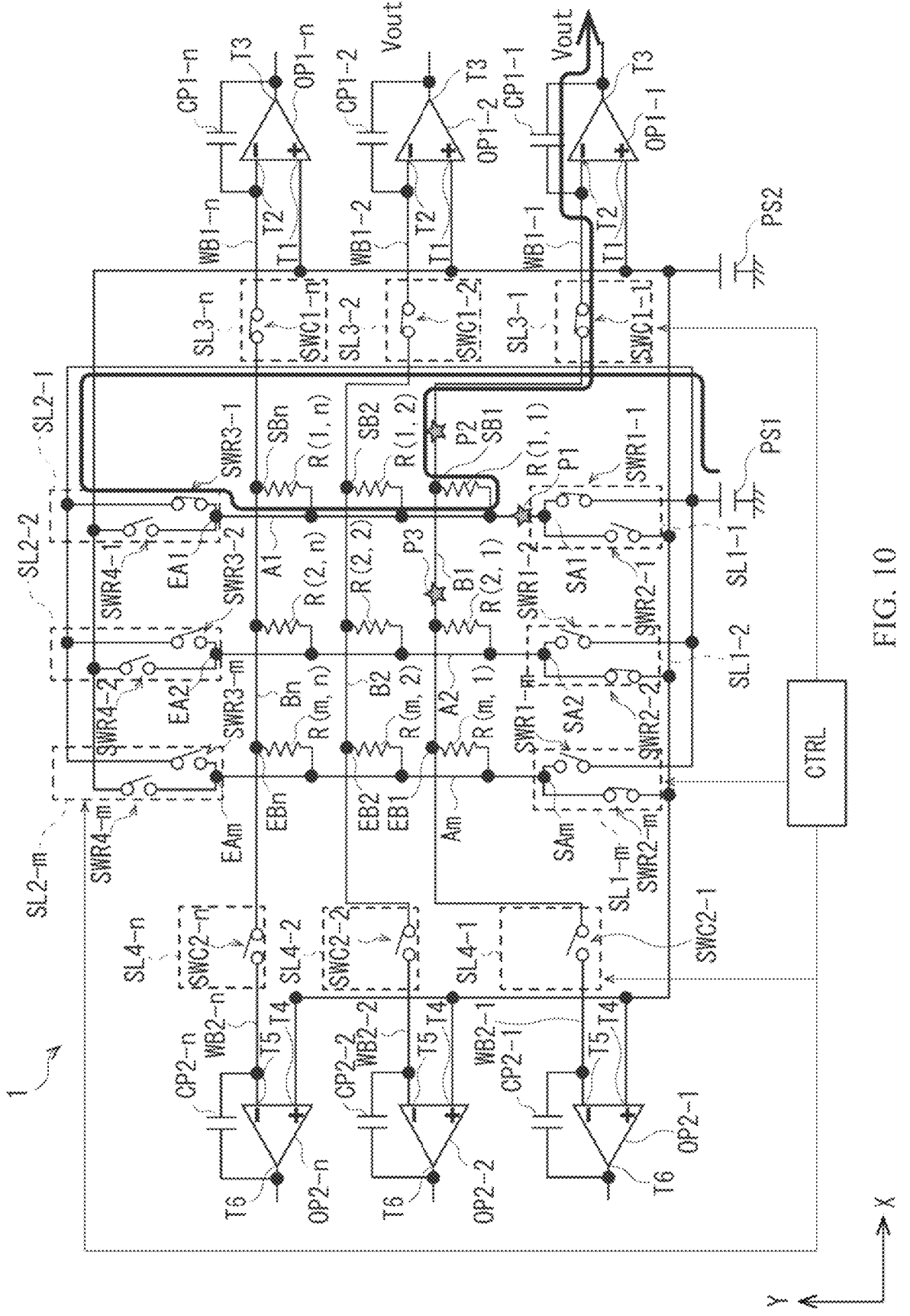
FIG. 10 is a third explanatory diagram describing the second example of the procedure of determining the location of a break in the element array circuit illustrated in FIG. 1.

For example, as exemplified in FIG. 9, in the element array circuit 1 in State A where the first potential V1 is applied to the first end SA1 of the row line A1 as the selected row line AS and to the second end EA1 of the row line A1 as the selected row line AS, if the output voltage Vout that corresponds to the resistor R(1, 1) and is outputted from the second operational amplifier OP2-1 along the solid-line path is at a normal value (Y in step S307), the processor CTRL may determine that the break P1 is present in the first part from the resistor R(1, 1) to the first selector SL1-1 along the row line A1 (step S308). If it is determined in step S307 of FIG. 7B that the output from the one second operational amplifier OP2 corresponding to the selected resistor RS is at an abnormal value (N in step S307), the process may proceed to step S309. In step S309, one third selector SL3 corresponding to the selected resistor RS may be caused to be in the conducting state. In this situation, one fourth selector SL4 corresponding to the selected resistor RS may be kept in the conducting state or may be switched to the nonconducting state. Thereafter, a determination may be made as to whether the output from the one first operational amplifier OP1 coupled to the one third resistor SL3 corresponding to the selected resistor RS is at a normal value (step S310). If it is determined that the output from the one first operational amplifier OP1 corresponding to the selected resistor RS is at a normal value (Y in step S310), the processor CTRL may determine that breaks are present in both the first part from the selected resistor RS to the one first selector SL1 corresponding to the selected resistor RS along the selected row line AS and a third part from the selected resistor RS to the one second operational amplifier OP2 corresponding to the selected resistor RS along one column line B and one coupling line WB2 that are coupled to the selected resistor RS (step S311). The processor CTRL may thus cause the process to end (End). For example, as exemplified in FIG. 10, in the element array circuit 1 in State A where the first selector SL1-1 operates to apply the first potential V1 to the first end SA1 of the row line A1 as the selected row line AS and the second selector SL2-1 operates to apply the first potential V1 to the second end EA1 of the row line A1 as the selected row line AS, if the output voltage Vout that corresponds to the resistor R(1, 1) and is outputted from the first operational amplifier OP1-1 along the solid-line path is at a normal value (Y in step S310), the processor CTRL may determine that the break P1 is present in the first part from the resistor R(1, 1) to the first selector SL1-1 along the row line A1 and a break P3 is present in the third part from the resistor R(1, 1) to the second operational amplifier OP2-1 along the column line B1 and coupling line WB2-1 (step S311), and may cause the process to end (End). If it is determined in step S310 that the output voltage Vout that corresponds to the resistor R(1, 1) and is outputted from the first operational amplifier OP1-1 is at an abnormal value (N in step S310), the processor CTRL may determine that a break is unidentifiable (step S312), and may cause the process to end (End). If it is determined in step S310 that the output voltage Vout that corresponds to the resistor R(1, 1) and is outputted from the first operational amplifier OP1-1 is at a normal value (Y in step S310) and furthermore, if the output voltage Vout from the second operational amplifier OP2-1 reflecting a resistance value of the resistor R(2, 1) is at a normal value where the resistor R(2, 1) is the selected resistor RS, it is possible for the processor CTRL to determine that the break P3 is present at a point between the resistor R(1, 1) and the resistor R(2, 1) along the column line B1.

If it is determined in step S302 that the output from the one first operational amplifier OP1 corresponding to the selected resistor RS is at a normal value (N in step S302), the process may proceed to step S313 in FIG. 7C. In step S313, the one fourth selector SL4 corresponding to the selected resistor RS may be caused to be in the conducting state. In this situation, the one third selector SL3 corresponding to the selected resistor RS may be kept in the conducting state or may be switched to the nonconducting state. Thereafter, a determination may be made as to whether the output from the one second operational amplifier OP2 coupled to the one fourth resistor SL4 corresponding to the selected resistor RS is at a normal value (step S314). If it is determined in step S314 that the output from the one second operational amplifier OP2 corresponding to the selected resistor RS is at a normal value (Y in step S314), the processor CTRL may determine that no break is present in any of the column line B and the coupling lines WB1 and WB2 that are coupled to the selected resistor RS, or in the first part from the selected resistor RS to the one first selector SL1 along the selected row line AS. The processor CTRL may thus cause the process to end (End). If it is determined in step S314 that the output from the one second operational amplifier OP2 corresponding to the selected resistor RS is at an abnormal value (N in step S314), the processor CTRL may determine that a break is present in the third part from the selected resistor RS to the one second operational amplifier OP2 corresponding to the selected resistor RS along the one column line B and the one coupling line WB2 that are coupled to the selected resistor RS (step S315). The processor CTRL may thus cause the process to end (End).

Figure 11:
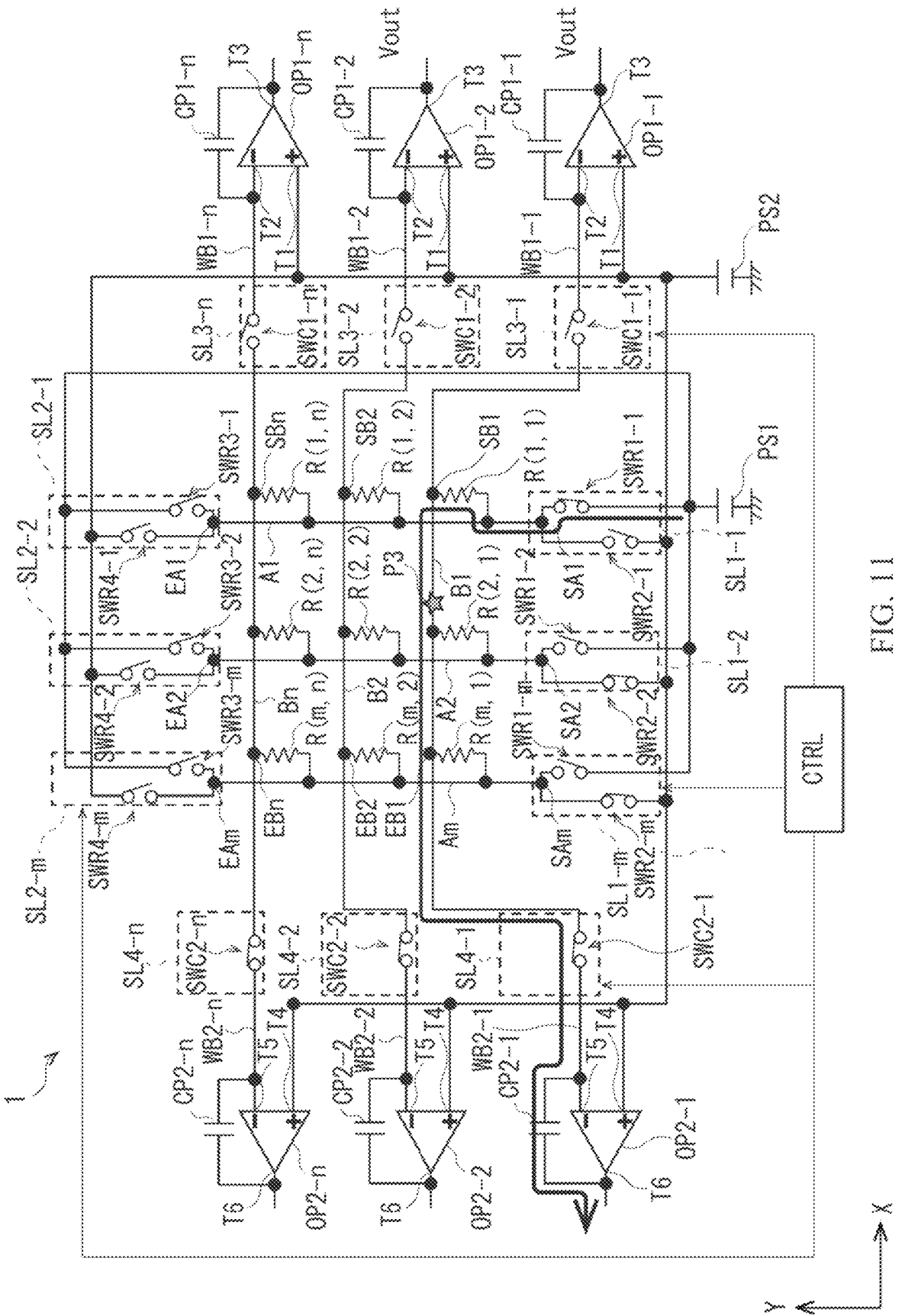
FIG. 11 is a fourth explanatory diagram describing the second example of the procedure of determining the location of a break in the element array circuit illustrated in FIG. 1.

For example, as exemplified in FIG. 11, in the element array circuit 1 in State B where the first potential V1 is applied to the first end SA1 of the row line A1 as the selected row line AS and the second end EA1 of the row line A1 as the selected row line AS is open, if the output voltage Vout that corresponds to the resistor R(1, 1) and is outputted from the second operational amplifier OP2-1 along the solid-line path is at an abnormal value (N in step S314), the processor CTRL may determine that the break P3 is present in the third part from the resistor R(1, 1) to the second operational amplifier OP2-1 along the column line B1 and coupling line WB2-1 (step S315).

If it is determined in step S302 that the output voltage Vout that corresponds to the resistor R(1, 1) and is outputted from the first operational amplifier OP1-1 is at a normal value (N in step S302) and furthermore, if the output Vout from the second operational amplifier OP2-1 reflecting the resistance value of the resistor R(2, 1) is at a normal value where the resistor R(2, 1) is the selected resistor RS, it is possible for the processor CTRL to determine that the break P3 is present at a point between the resistor R(1, 1) and the resistor R(2, 1) along the column line B1. Note that if the output voltages Vout corresponding to all the resistors R(1, 1) to R(m, n) except the resistor R(1, 1) are at normal values whereas the respective output voltages Vout from the first operational amplifier OP1-1 and the second operational amplifier OP2-1 that correspond to the resistor R(1, 1) are both at abnormal values, the processor CTRL may determine that the breaks P2 and P3 are both present.

3. Third Example

Figure 12:
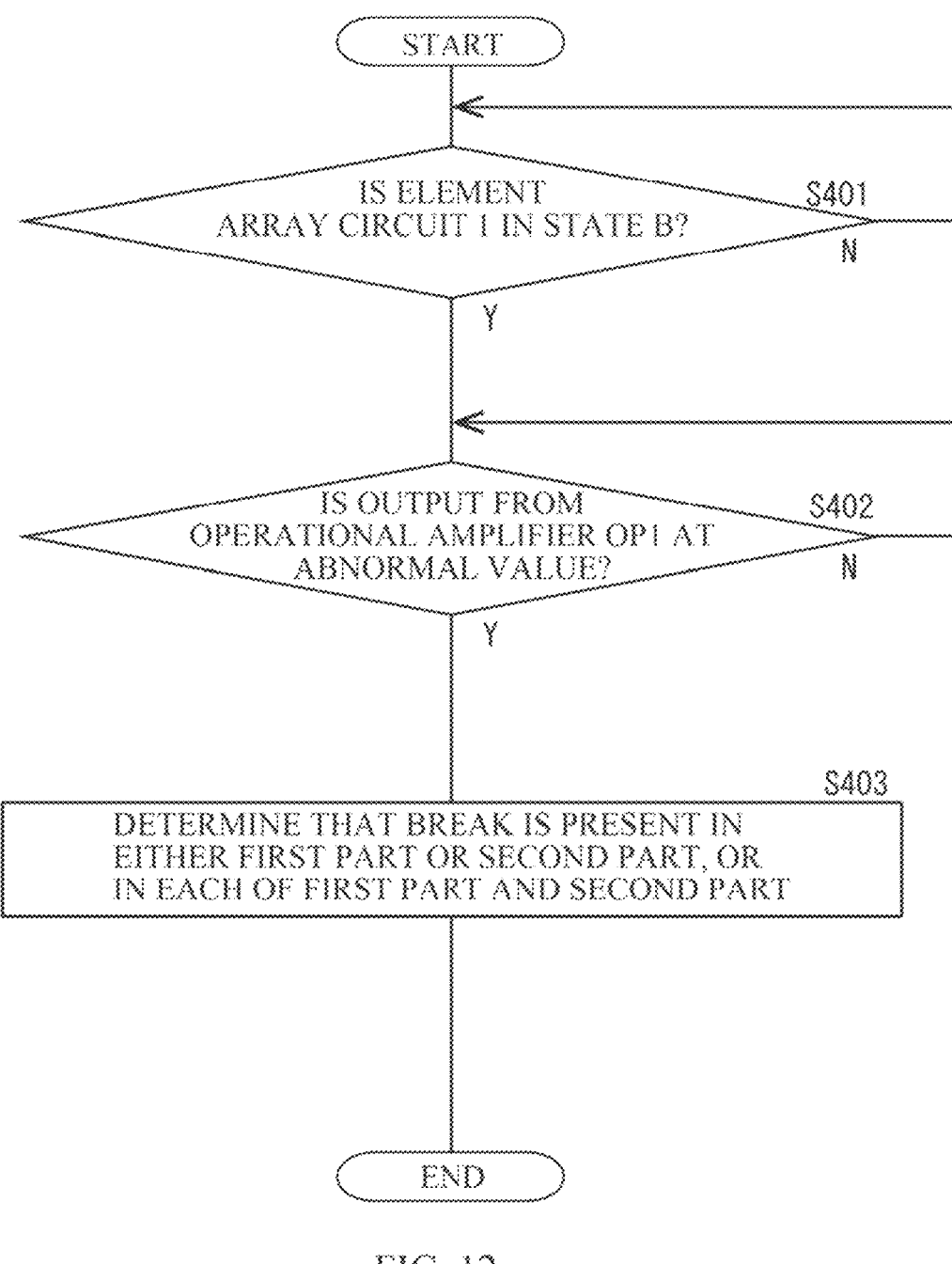
FIG. 12 is a flowchart describing a third example of the procedure of determining the location of a break in the element array circuit illustrated in FIG. 1.
Figure 13:
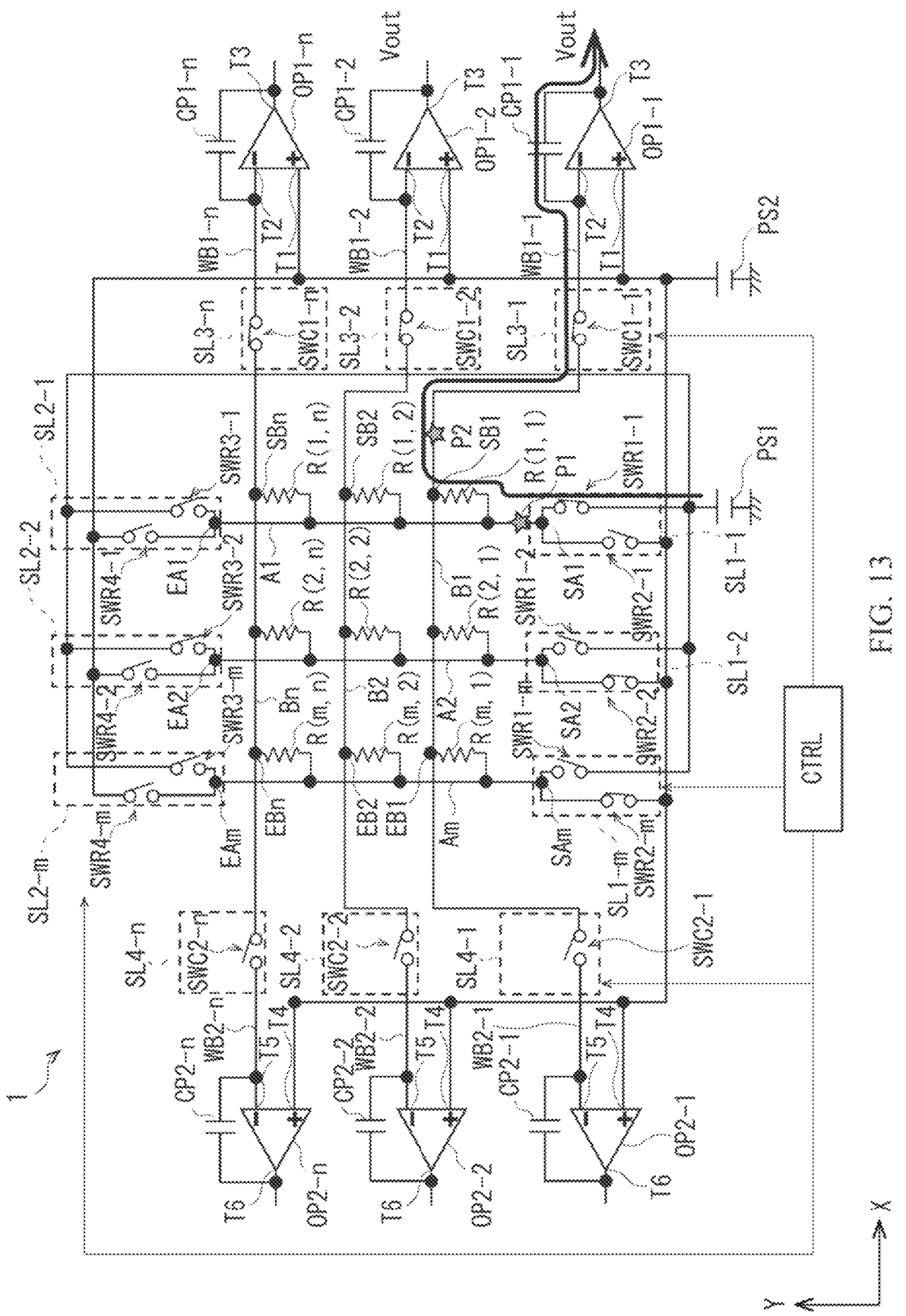
FIG. 13 is an explanatory diagram describing the third example of the procedure of determining the location of a break in the element array circuit illustrated in FIG. 1.

FIG. 12 is a flowchart describing a third example of the procedure of determining the location of a break in the element array circuit 1. First, a determination may be made as to whether the element array circuit 1 is in State B (step S401). If it is determined that the element array circuit 1 is in State B (Y in Step S401), a determination may be made as to whether the output from one first operational amplifier OP1 corresponding to the selected resistor RS is at an abnormal value (step S402). If it is determined that the output from the one first operational amplifier OP1 corresponding to the selected resistor RS is at an abnormal value (Y in step S402), the processor CTRL may determine that a break is present in either the first part from the selected resistor RS to one first selector SL1 corresponding to the selected resistor RS along the selected row line AS or the second part from the selected resistor RS to the one first operational amplifier OP1 along one column line B and one coupling line WB1 that are coupled to the selected resistor RS, or in each of the first part and the second part (step S403). The processor CTRL may thus cause the process to end (End). For example, as exemplified in FIG. 13, in the element array circuit 1 in State B where the first potential V1 is applied to the first end SA1 of the row line A1 as the selected row line AS and the second end EA1 of the row line A1 as the selected row line AS is open, if the output voltage Vout that corresponds to the resistor R(1, 1) and is outputted from the first operational amplifier OP1-1 along the solid-line path is at an abnormal value (Y in step S402), the processor CTRL may determine that a break is present in either the first part from the resistor R(1, 1) to the first selector SL1-1 along the row line A1 or the second part from the resistor R(1, 1) to the first operational amplifier OP1-1 along the coupling line WB1-1, or in each of the first part and the second part (step S403).

4. Fourth Example

Figure 14A:
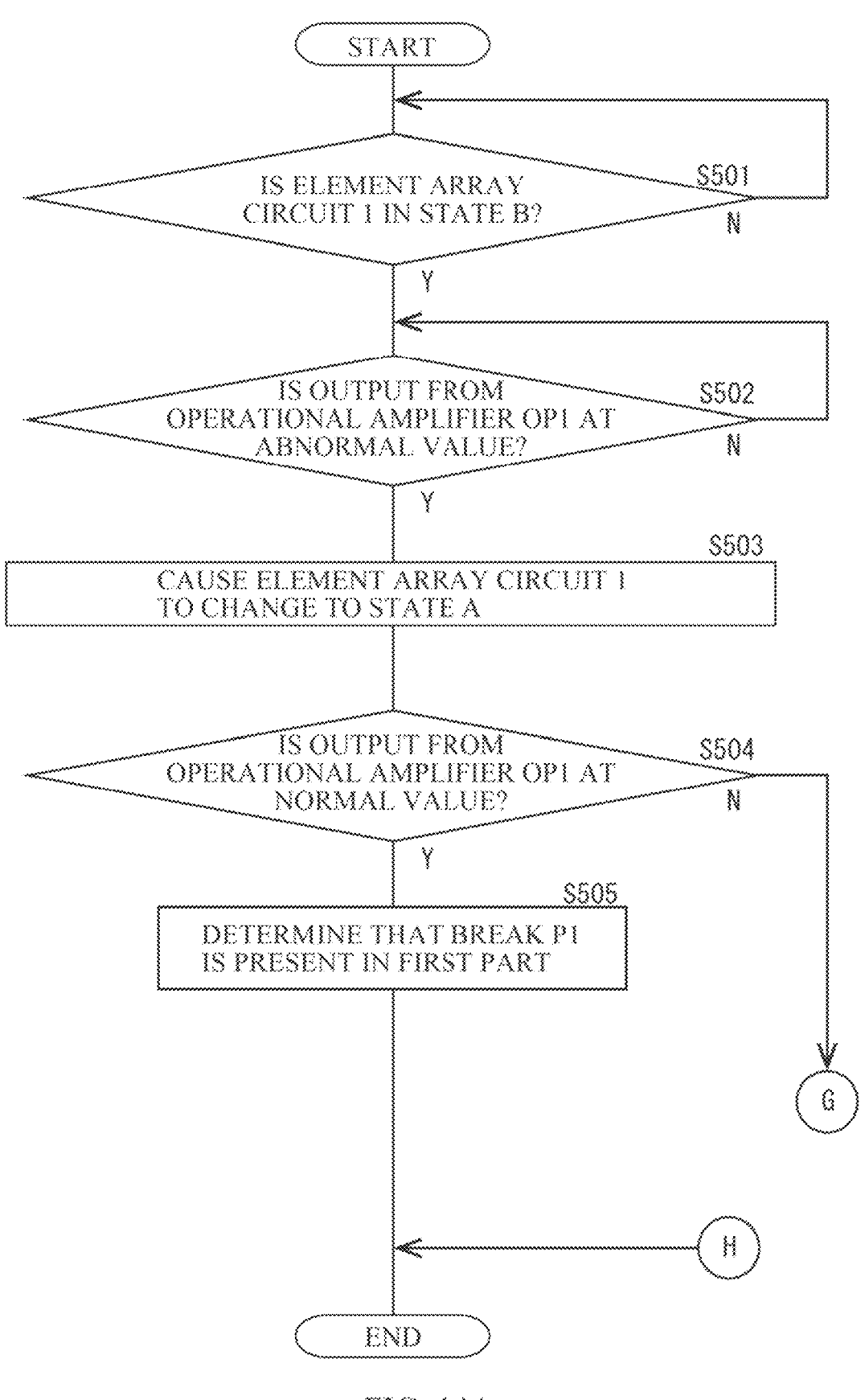
FIG. 14A is a first flowchart describing a fourth example of the procedure of determining the location of a break in the element array circuit illustrated in FIG. 1.
Figure 14B:
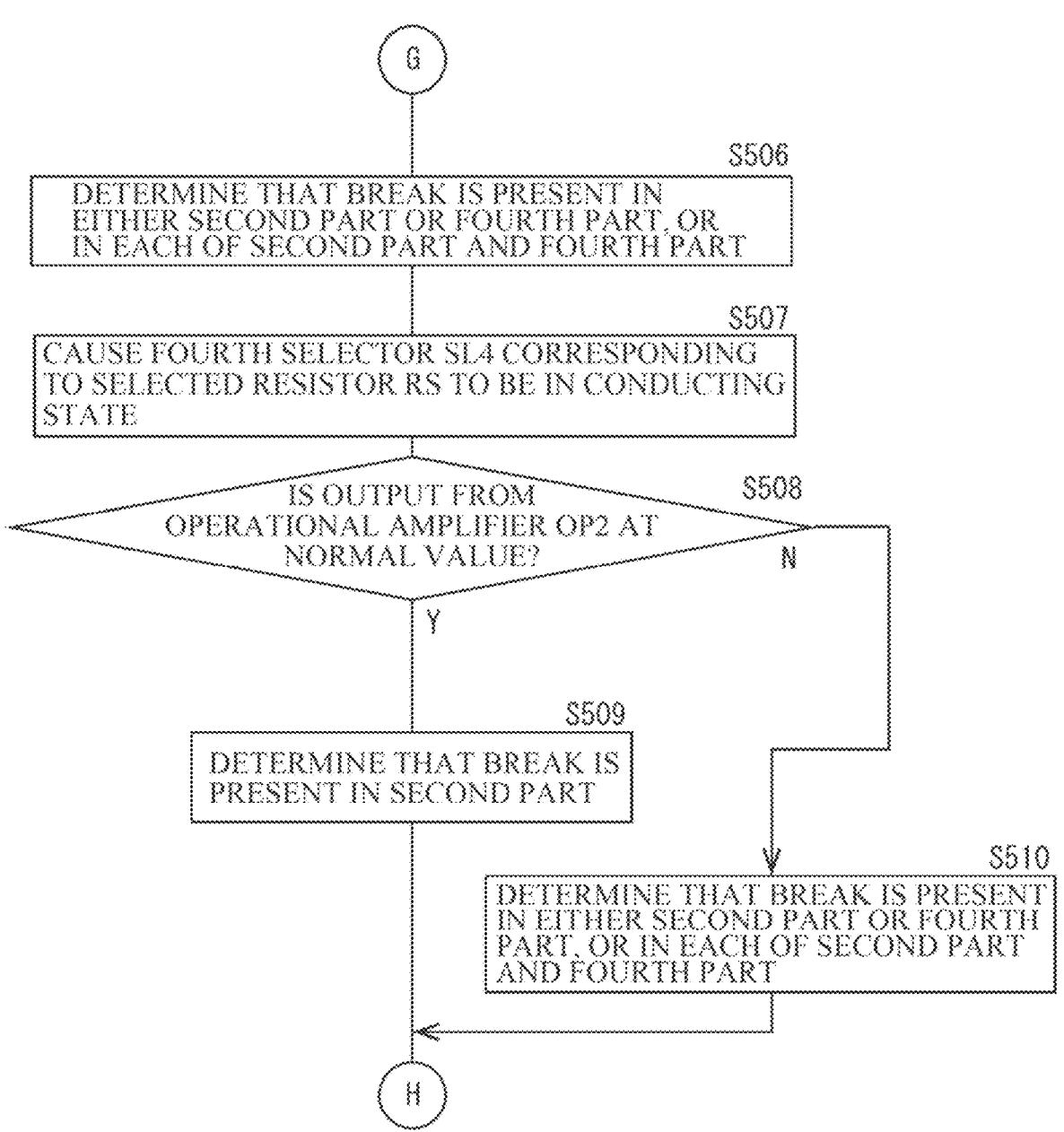
FIG. 14B is a second flowchart describing the fourth example of the procedure of determining the location of a break in the element array circuit illustrated in FIG. 1.

FIGS. 14A and 14B are flowcharts describing a fourth example of the procedure of determining the location of a break in the element array circuit 1. In this example, as in the above-described third example illustrated in FIG. 12, a determination may be made as to whether the element array circuit 1 is in State B (step S501). If it is determined that the element array circuit 1 is in State B (Y in Step S501), a determination may be made as to whether the output from one first operational amplifier OP1 corresponding to the selected resistor RS is at an abnormal value (step S502). If it is determined that the output from the one first operational amplifier OP1 corresponding to the selected resistor RS is at an abnormal value (Y in step S502), the processor CTRL may cause the element array circuit 1 to change to State A (step S503). In other words, the processor CTRL may cause the element array circuit 1 to change to the state where the first potential V1 is applied to the first end SA of the selected row line AS via the first selector SL1 and to the second end EA of the selected row line AS via the second selector SL2. After the change to State A, a determination may be made as to whether the output from the one first operational amplifier OP1 corresponding to the selected resistor RS is at a normal value (step S504). If it is determined in step S504 that the output from the first operational amplifier OP1 is at a normal value (Y in step S504), the processor CTRL may determine that a break is present in the first part from the selected resistor RS to one first selector SL1 corresponding to the selected resistor RS along the selected row line AS (step S505), and may cause the process to end (End). If it is determined in step S504 that the output from the first operational amplifier OP1 is at an abnormal value (N in step S504), the processor CTRL may determine that a break is present in either the second part from the selected resistor RS to the one first operational amplifier OP1 corresponding to the selected resistor RS along one column line B and one coupling line WB1 that are coupled to the selected resistor RS or a fourth part from the selected resistor RS to one second selector SL2 corresponding to the selected resistor RS along the selected row line AS, or in each of the second part and the fourth part (step S506). Thereafter, the processor CTRL may cause one fourth selector SL4 corresponding to the selected resistor RS to be in the conducting state (step S507). In this situation, one third selector SL3 corresponding to the selected resistor RS may be kept in the conducting state or may be switched to the nonconducting state. Thereafter, a determination may be made as to whether an output from one second operational amplifier OP2 coupled to the one fourth resistor SL4 corresponding to the selected resistor RS is at a normal value (step S508). If it is determined in step S508 that the output from the one second operational amplifier OP2 corresponding to the selected resistor RS is at a normal value (Y in step S508), the processor CTRL may determine that a break is present in the second part described above (step S509), and may cause the process to end (End). If it is determined in step S508 that the output from the one second operational amplifier OP2 corresponding to the selected resistor RS is at an abnormal value (N in step S508), the processor CTRL may determine that a break is present in either the second part described above or the fourth part described above, or in each of the second part and the fourth part (step S510), and may cause the process to end (End).

Figure 15A:
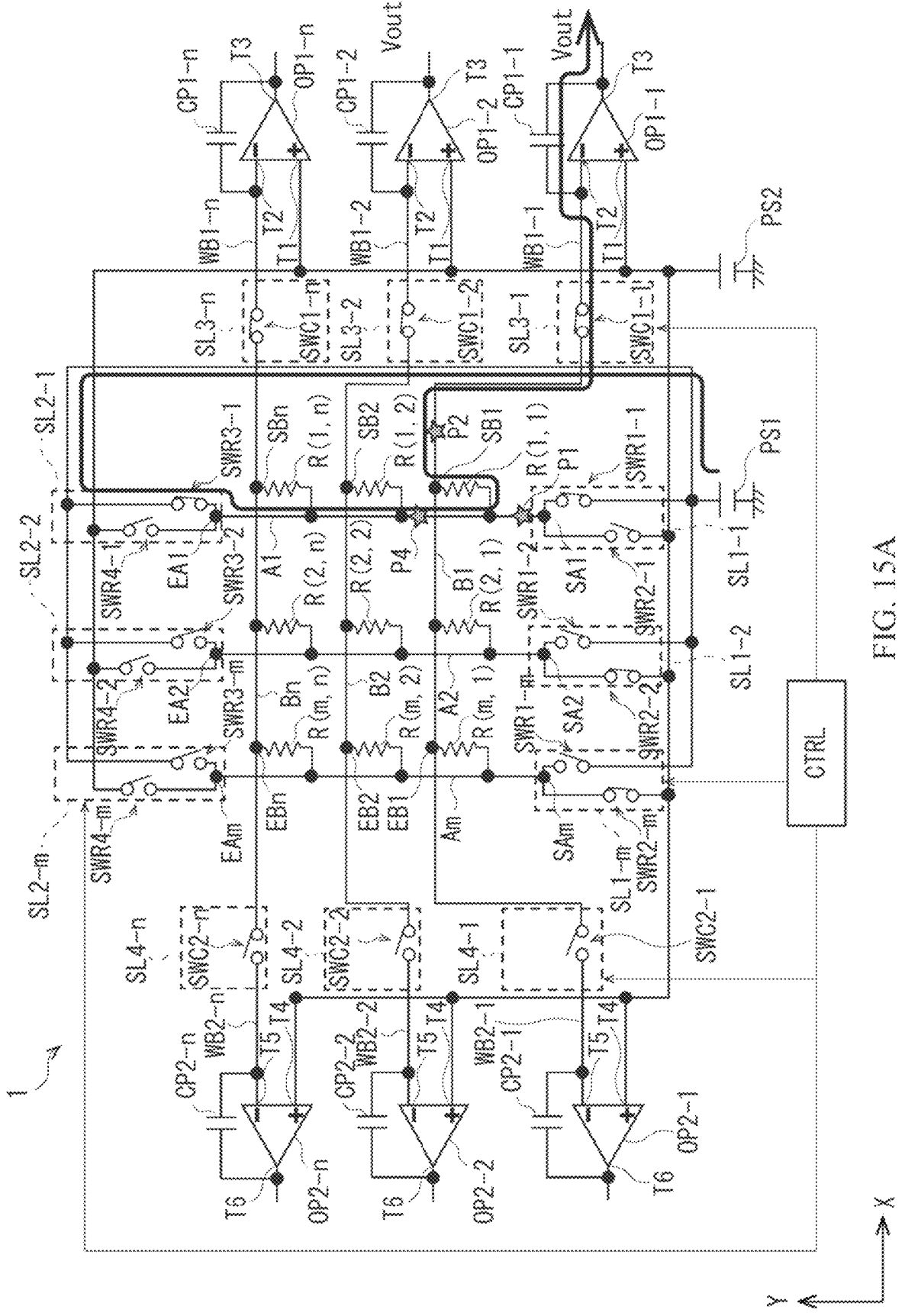
FIG. 15A is a first explanatory diagram describing the fourth example of the procedure of determining the location of a break in the element array circuit illustrated in FIG. 1.
Figure 15B:
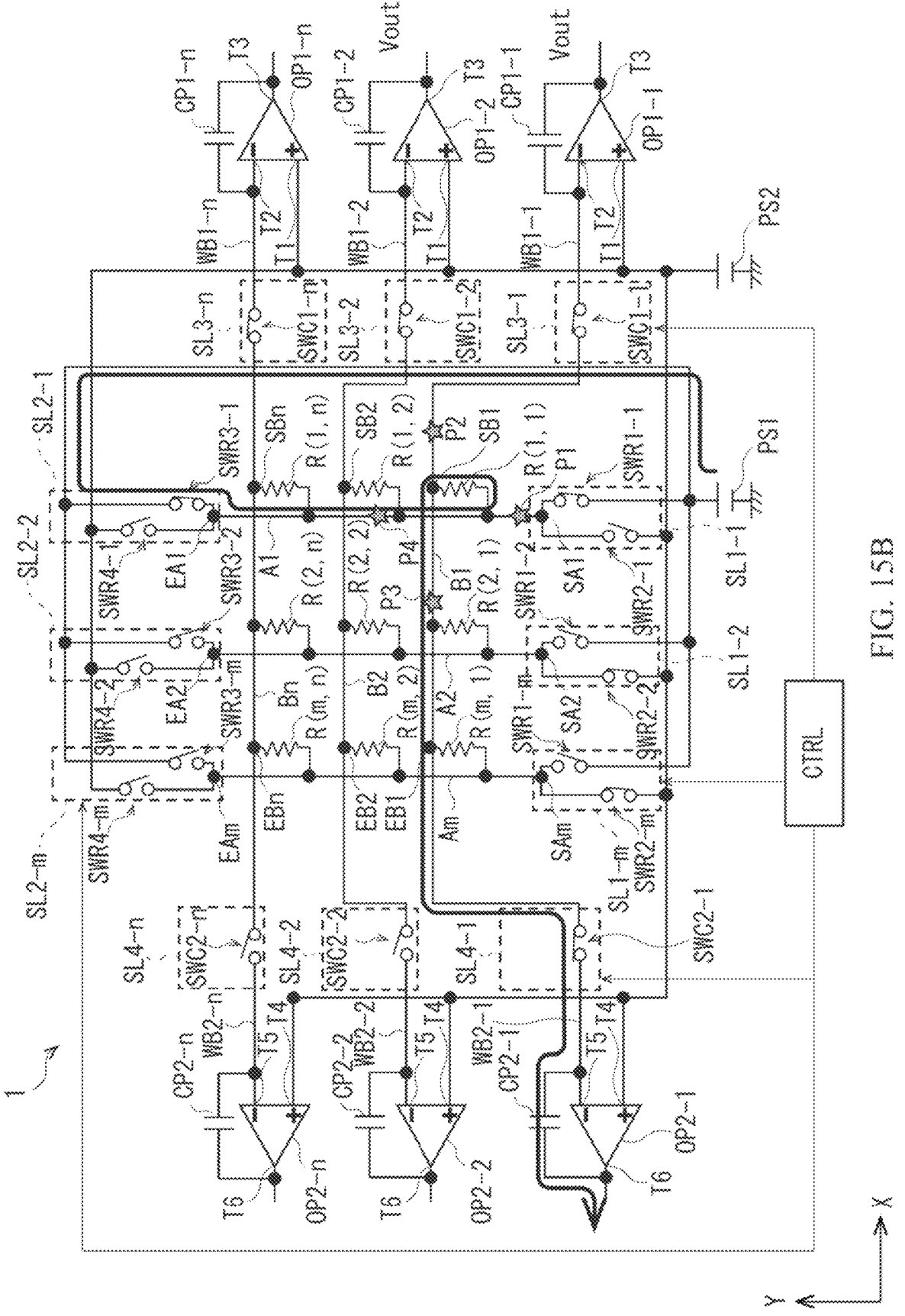
FIG. 15B is a second explanatory diagram describing the fourth example of the procedure of determining the location of a break in the element array circuit illustrated in FIG. 1.

For example, as exemplified in FIG. 15A, in the element array circuit 1 in State A where the first selector SL1-1 operates to apply the first potential V1 to the first end SA1 of the row line A1 as the selected row line AS and the second selector SL2-1 operates to apply the first potential V1 to the second end EA1 of the row line A1 as the selected row line AS, if the output voltage Vout that corresponds to the resistor R(1, 1) and is outputted from the first operational amplifier OP1-1 along a solid-line path in FIG. 15A is at a normal value (Y in step S504), the processor CTRL may determine that the break P1 is present in the first part (step S505), and may cause the process to end (End). If the output voltage Vout that corresponds to the resistor R(1, 1) and is outputted from the first operational amplifier OP1-1 along the solid-line path in FIG. 15A is at an abnormal value (N in step S504), the processor CTRL may determine that a break is present in either the second part or the fourth part, or in each of the second part and the fourth part (step S506). Thereafter, as exemplified in FIG. 15B, the processor CTRL may cause the sixth switch SWC2-1 of the fourth selector SL4-1 corresponding to the resistor R(1, 1) to be in the conducting state (step S507). If the output from the second operational amplifier OP2-1 corresponding to the resistor R(1, 1) is at a normal value (Y in step S508) in this stage, the processor CTRL may determine that the break P2 is present in the second part described above (step S509), and may cause the process to end (End). If the output from the second operational amplifier OP2-1 is at an abnormal value (N in step S508) in that stage, the processor CTRL may determine that a break is present in either the second part or the fourth part, or in each of the second part and the fourth part (step S510), and may cause the process to end (End).

[Example Workings and Example Effects of Element Array Circuit 1]

As described above, the element array circuit 1 according to the present example embodiment may include the plurality of row lines A, the plurality of column lines B, the plurality of operational amplifiers OP, the plurality of first selectors SL1, and the plurality of second selectors SL2. The first selectors SL1 may each be coupled to corresponding one of the first ends SA of the row lines A and configured to cause the first potential V1 to be applied to the corresponding one of the first ends SA and to cause the second potential V2 not equal to the first potential V1 to be applied to the corresponding one of the first ends SA. The second selectors SL2 may each be coupled to corresponding one of the second ends EA of the row lines A and configured to cause the first potential V1 to be applied to the corresponding one of the second ends EA and to cause the second potential V2 not equal to the first potential V1 to be applied to the corresponding one of the second ends EA. This helps to set each of the resistors R to the first potential V1 through two different paths. Accordingly, even when a break is present in each of one or more of the row lines A, output voltages reflecting the respective resistance values of the resistors R are outputtable from the operational amplifiers OP corresponding to the respective resistors R. Furthermore, even when two or more breaks are present in any single row line A, output voltages each reflecting the resistance value of corresponding one of the resistors R are obtainable for a larger number of ones of the resistors R coupled to the row line A. The element array circuit 1 according to the present example embodiment is thus superior in operational reliability.

In the element array circuit 1, the first operational amplifiers OP1 may each be coupled to corresponding one of the third ends SB of the column lines B, and the second operational amplifiers OP2 may each be coupled to corresponding one of the fourth ends EB of the column lines B. This helps to allow an output voltage reflecting the resistance value of the selected resistor RS to be outputted from corresponding one of the first operational amplifiers OP1 or corresponding one of the second operational amplifiers OP2 even if a break is present in relevant one of the column lines B in the element array circuit 1, which in turn helps to achieve higher operational reliability.

In the element array circuit 1 according to the example embodiment of the disclosure, when an abnormal value is noted for the output of any of the operational amplifiers OP, respective switching operations of the first to fourth switches SWR1 to SWR4 of the first and second selectors SL1 and SL2 and the fifth and sixth switches SWC1 and SWC2 of the third and fourth selectors SL3 and SL4 may be performed in accordance with the predetermined procedure. This helps to identify a range of the row line A, the column line B, the coupling line WB1, or the coupling line WB2 over which a break is present.

How to determine the location of a break in the element array circuit 1 has been described hereinabove with reference to the four examples; however, methods of determining the location of a break in the element array circuit 1 according to an embodiment of the disclosure are not limited to those described above. Further, the processor CTRL may perform determination of the location of a break in the element array circuit 1 during a normal measurement operation to measure the respective resistance values of the resistors R or during an inspection operation, other than the normal measurement operation, to inspect for any defects, such as breaks, in the row lines A, the column lines B, the coupling lines WB1 and WB2, and other components.

2. Second Example Embodiment

[Overall Configuration Example of Element Array Circuit 2]

Figure 16:
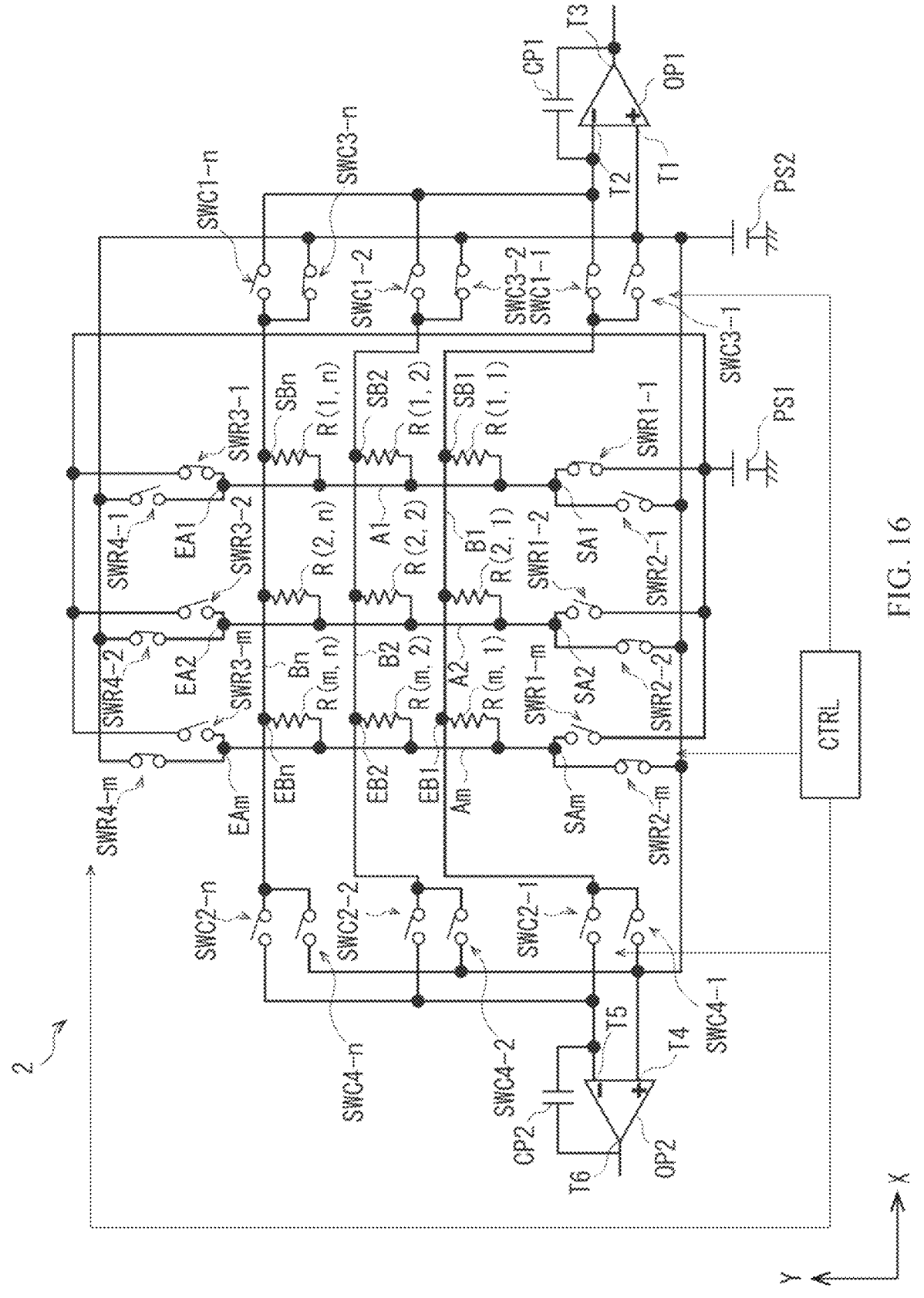
FIG. 16 is a circuit diagram illustrating a configuration example of an element array circuit according to one example embodiment of the disclosure.

FIG. 16 is a circuit diagram schematically illustrating an overall configuration example of an element array circuit 2 according to a second example embodiment of the disclosure. As illustrated in FIG. 16, the element array circuit 2 may have a configuration different from the configuration of the element array circuit 1 of FIG. 1 in that: seventh switches SWC3 (SWC3-1 to SWC3-$n$) are further provided as fifth selectors SL5; eighth switches SWC4 (SWC4-1 to SWC4-$n$) are further provided as sixth selectors SL6; and the number of the first capacitors CP1, the number of the second capacitors CP2, the number of the first operational amplifiers OP1, and the number of the second operational amplifiers OP2 are each set to one. The following description will thus focus on the components of the element array circuit 2 different from those of the element array circuit 1 of FIG. 1, and descriptions of the other components will be omitted as appropriate. Note that although FIG. 16 illustrates an example state where "m" row lines A are provided, the number of the row lines A is not limited to "m", and may be chosen as desired. Similarly, although FIG. 16 illustrates the example state where "n" column lines B are provided, the number of the column lines B is not limited to "n", and may be chosen as desired. In the example embodiment illustrated in FIG. 16, one first capacitor CP1, one second capacitor CP2, one first operational amplifier OP1, and one second operational amplifier OP2 may be provided for the "n" column lines B; however, this is non-limiting. In some embodiments, "k" first capacitors CP1, "k" second capacitors CP2, "k" first operational amplifiers OP1, and "k" second operational amplifiers OP2 may be provided for the "n" column lines B, where "k" is a natural number greater than or equal to 2 and less than "n". For example, "n" may be a multiple of "k", and (n/k) column lines B may be coupled to the "k" first capacitors CP1, the "k" second capacitors CP2, the "k" first operational amplifiers OP1, and the "k" second operational amplifiers OP2.

In the element array circuit 2, the seventh switches SWC3 (SWC3-1 to SWC3-$n$) may each be provided between corresponding one of the column lines B (B1 to Bn) and the direct-current power supply PS2. The seventh switches SWC3 (SWC3-1 to SWC3-$n$) may each perform a selection operation to select either an electrically continuous state or an electrically discontinuous state between corresponding one of the third ends SB (SB1 to SBn) of the column lines B and the direct-current power supply PS2. For example, the seventh switch SWC3-1 may perform the selection operation to select either the electrically continuous state or the electrically discontinuous state between the third end SB1 of the column line B1 and the first operational amplifier OP1, the seventh switch SWC3-2 may perform the selection operation to select either the electrically continuous state or the electrically discontinuous state between the third end SB2 of the column line B2 and the first operational amplifier OP1, and the seventh switch SWC3-$n$ may perform the selection operation to select either the electrically continuous state or the electrically discontinuous state between the third end SBn of the column line Bn and the first operational amplifier OP1.

In the element array circuit 2, the eighth switches SWC4 (SWC4-1 to SWC4-$n$) may each be provided between corresponding one of the column lines B (B1 to Bn) and the direct-current power supply PS2. The eighth switches SWC4 (SWC4-1 to SWC4-$n$) may each perform a selection operation to select either an electrically continuous state or an electrically discontinuous state between corresponding one of the fourth ends EB (EB1 to EBn) of the column lines B and the direct-current power supply PS2. For example, the eighth switch SWC4-1 may perform the selection operation to select either the electrically continuous state or the electrically discontinuous state between the fourth end EB1 of the column line B1 and the second operational amplifier OP2, the eighth switch SWC4-2 may perform the selection operation to select either the electrically continuous state or the electrically discontinuous state between the fourth end EB2 of the column line B2 and the second operational amplifier OP2, and the eighth switch SWC4-$n$ may perform the selection operation to select either the electrically continuous state or the electrically discontinuous state between the fourth end EBn of the column line Bn and the second operational amplifier OP2.

In the element array circuit 2, one of the fifth switches SWC1 (SWC1-1 to SWC1-$n$) and one of the seventh switches SWC3 (SWC3-1 to SWC3-*n*) that are coupled to the same one of the third ends SB (SB1 to SBn) are not to be in the conducting state together. However, it is possible for the one of the fifth switches SWC1 (SWC1-1 to SWC1-*n*) and the one of the seventh switches SWC3 (SWC3-1 to SWC3-*n*) that are coupled to the same one of the third ends SB (SB1 to SBn) to be in the nonconducting state together. In other words, either or both of one of the fifth switches SWC1 (SWC1-1 to SWC1-*n*) and one of the seventh switches SWC3 (SWC3-1 to SWC3-*n*) that are coupled to the same one of the third ends SB (SB1 to SBn) may be brought into the nonconducting state. When the one of the fifth switches SWC1 (SWC1-1 to SWC1-*n*) is in the conducting state and the one of the seventh switches SWC3 (SWC3-1 to SWC3-*n*) is in the nonconducting state, the corresponding one of the third ends SB (SB1 to SBn) of the column lines B (B1 to Bn) is to be at the first potential V1. Conversely, when the one of the fifth switches SWC1 (SWC1-1 to SWC1-*n*) is in the nonconducting state and the one of the seventh switches SWC3 (SWC3-1 to SWC3-*n*) is in the conducting state, the corresponding one of the third ends SB (SB1 to SBn) of the column lines B (B1 to Bn) is to be at the second potential V2. Thus, in the element array circuit 2, the respective conducting states of the fifth switches SWC1 (SWC1-1 to SWC1-*n*) and the respective conducting states of the seventh switches SWC3 (SWC3-1 to SWC3-*n*) may be selected in accordance with commands from the processor CTRL. This allows for setting of each of the third ends SB (SB1 to SBn) of the column lines B to either the first potential V1 or the second potential V2.

In the element array circuit 2, one of the sixth switches SWC2 (SWC2-1 to SWC2-*n*) and one of the eighth switches SWC4 (SWC4-1 to SWC4-*n*) that are coupled to the same one of the fourth ends EB (EB1 to EBn) are not to be in the conducting state together. However, it is possible for the one of the sixth switches SWC2 (SWC2-1 to SWC2-*n*) and the one of the eighth switches SWC4 (SWC4-1 to SWC4-*n*) that are coupled to the same one of the fourth ends EB (EB1 to EBn) to be in the nonconducting state together. In other words, either or both of one of the sixth switches SWC2 (SWC2-1 to SWC2-*n*) and one of the eighth switches SWC4 (SWC4-1 to SWC4-*n*) that are coupled to the same one of the fourth ends EB (EB1 to EBn) may be brought into the nonconducting state. When the one of the sixth switches SWC2 (SWC2-1 to SWC2-*n*) is in the conducting state and the one of the eighth switches SWC4 (SWC4-1 to SWC4-*n*) is in the nonconducting state, the corresponding one of the fourth ends EB (EB1 to EBn) of the column lines B (B1 to Bn) is to be at the first potential V1. Conversely, when the one of the sixth switches SWC2 (SWC2-1 to SWC2-*n*) is in the nonconducting state and the one of the eighth switches SWC4 (SWC4-1 to SWC4-*n*) is in the conducting state, the corresponding one of the fourth ends EB (EB1 to EBn) of the column lines B (B1 to Bn) is to be at the second potential V2. Thus, in the element array circuit 2, the respective conducting states of the sixth switches SWC2 (SWC2-1 to SWC2-*n*) and the respective conducting states of the eighth switches SWC4 (SWC4-1 to SWC4-*n*) may be selected in accordance with commands from the processor CTRL. This allows for setting of each of the fourth ends EB (EB1 to EBn) of the column lines B to either the first potential V1 or the second potential V2.

[Measurement Operation in Element Array Circuit 2]

In the element array circuit 2, measurement may be performed on each of the resistors R in the following manner, for example. The following measurement operation may be performed in accordance with a command from the processor CTRL.

Figure 17:
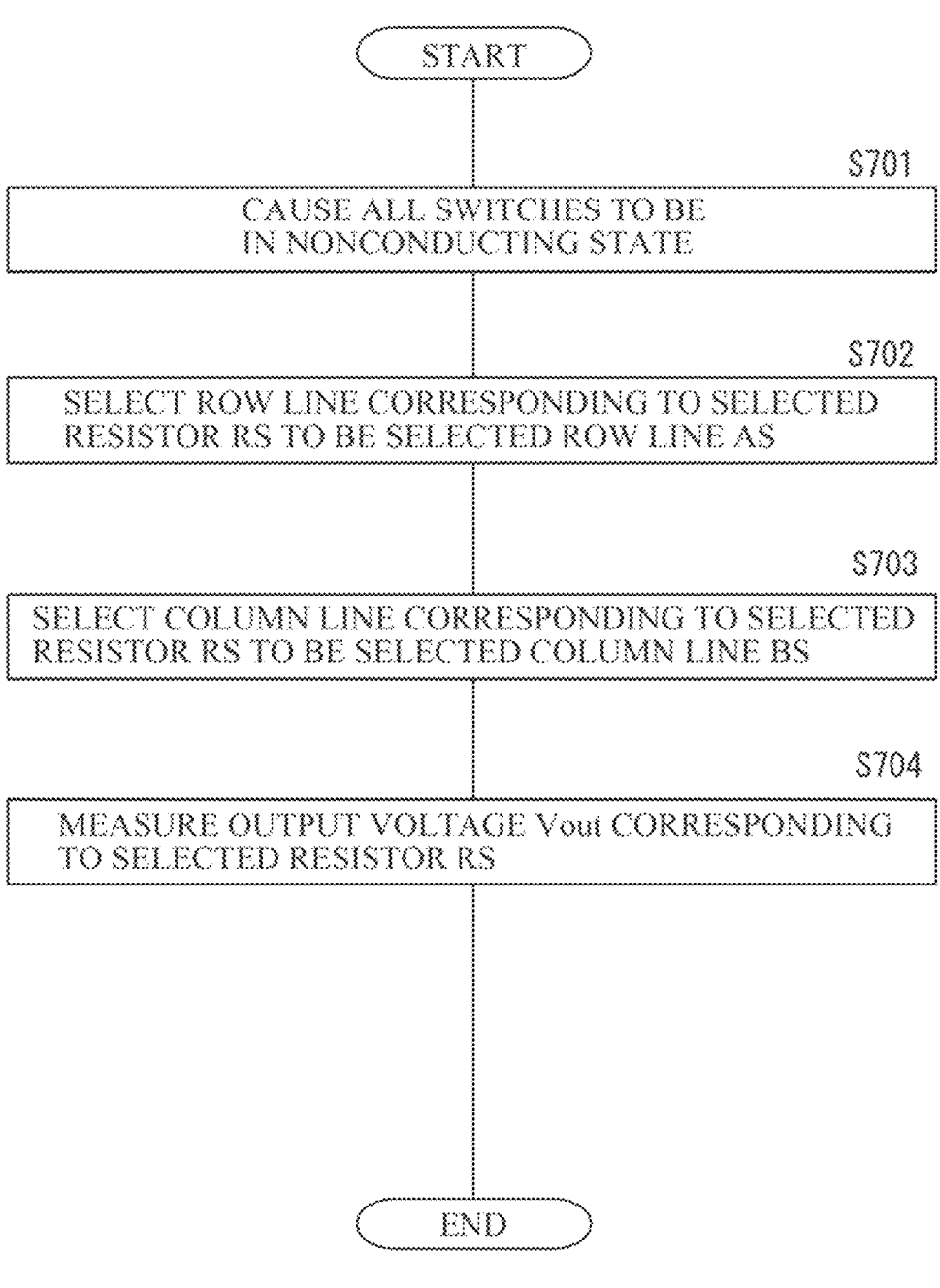
FIG. 17 is a flowchart describing a measurement operation example of the element array circuit illustrated in FIG. 16.

FIG. 17 is a flowchart describing the measurement operation in the element array circuit 2. First, for example, all the switches of the first to fourth selectors SL1 to SL4 may be caused to be in the nonconducting state (step S701). For example, the first switches SWR1 (SWR1-1 to SWR1-*m*), the second switches SWR2 (SWR2-1 to SWR2-*m*), the third switches SWR3 (SWR3-1 to SWR3-*m*), the fourth switches SWR4 (SWR4-1 to SWR4-*m*), the fifth switches SWC1 (SWC1-1 to SWC1-*n*), the sixth switches SWC2 (SWC2-1 to SWC2-*n*), the seventh switches SWC3 (SWC3-1 to SWC3-*n*), and the eighth switches SWC4 (SWC4-1 to SWC4-*n*) illustrated in FIG. 16 may all be caused to be in the nonconducting state.

Thereafter, one row line corresponding to the selected resistor RS targeted for the measurement may be selected to be the selected row line AS (step S702). Step S702 may be performed in a manner similar to that for step S102 of FIG. 2 described in relation to the foregoing first example embodiment. Note that FIG. 16 illustrates an example case where the selected row line AS is the row line A1.

Thereafter, one column line corresponding to the selected resistor RS targeted for the measurement may be selected to be the selected column line BS (step S703). For example, one of the fifth switches SWC1, i.e., a first one of the fifth switches SWC1, that corresponds to the selected column line BS to which the selected resistor RS is coupled may be caused to be in the conducting state and one of the seventh switches SWC3, i.e., a first one of the seventh switches SWC3, that corresponds to the selected column line BS may be caused to be in the nonconducting state. The selected column line BS may be thereby coupled to the first operational amplifier OP1. Further, another ones of the fifth switches SWC1, i.e., second ones of the fifth switches SWC1, that correspond to the unselected column lines BU may be kept in the nonconducting state and another ones of the seventh switches SWC3, i.e., second ones of the seventh switches SWC3, that correspond to the unselected column lines BU may be caused to be in the conducting state. Note that FIG. 16 illustrates an example case where the selected column line BS is the column line B1. Accordingly, the fifth switch SWC1-1 and the seventh switches SWC3-2 to SWC3-*n* may be in the conducting state, and the fifth switches SWC1-2 to SWC1-*n* and the seventh switch SWC3-1 may be in the nonconducting state. In the element array circuit 2, the voltage (V2-V1) corresponding to the difference between the first potential V1 and the second potential V2 may be applied to the resistor R(1, 1) as the selected resistor RS, causing a current dependent on the resistance value of the resistor R(1, 1) to flow through the resistor R(1, 1), and to flow toward the first capacitor CP1 via the column line B1. In contrast, the second potential V2 may be applied to each of the row lines A2 to Am other than the row line A1 as the selected row line AS, and to each of the column lines B1 to Bn. Accordingly, a zero voltage may be applied to each of the resistors R other than the resistor R(1, 1) as the selected resistor RS, causing no current to flow through each of the resistors R other than the resistor R(1, 1).

Thereafter, the output voltage corresponding to the selected resistor RS may be measured (step S704). For example, an output voltage may be measured that results from the selected resistor RS coupled to both the selected row line AS and the selected the column line BS and that is outputted from the output terminal T3 of the first operational amplifier OP1. A current flowing through the selected column line BS may be converted into a voltage by the first capacitor CP1 and outputted as the output voltage Vout from the output terminal T3 of the first operational amplifier OP1. The resistance value of the selected resistor RS or the intensity of an electromagnetic wave (infrared radiation) applied to the selected resistor RS is calculable from the output voltage Vout.

The measurement operation in the element array circuit 2 may thus be completed. To measure the output voltage Vout corresponding to each of the resistors R other than the resistor R(1, 1), steps S301 to S304 described above may be repeated. Note that the above-described method of measuring the resistance values of the resistors R in the element array circuit 2 is one example, and an embodiment of the disclosure is not limited thereto.

[Example Workings and Example Effects of Element Array Circuit 2]

The element array circuit 2 according to the second example embodiment is expected to provide effects similar to those of the element array circuit 1 according to the foregoing first example embodiment. Moreover, in the element array circuit 2 according to the second example embodiment, each of the column lines B is selectively couplable to the single first operational amplifier OP1 and the single second operational amplifier OP2. This helps to achieve further downsizing of the configuration as compared with the element array circuit 1 of the foregoing first example embodiment.

3. Third Example Embodiment

[Overall Configuration Example of Element Array Circuit 4]

Figure 18:
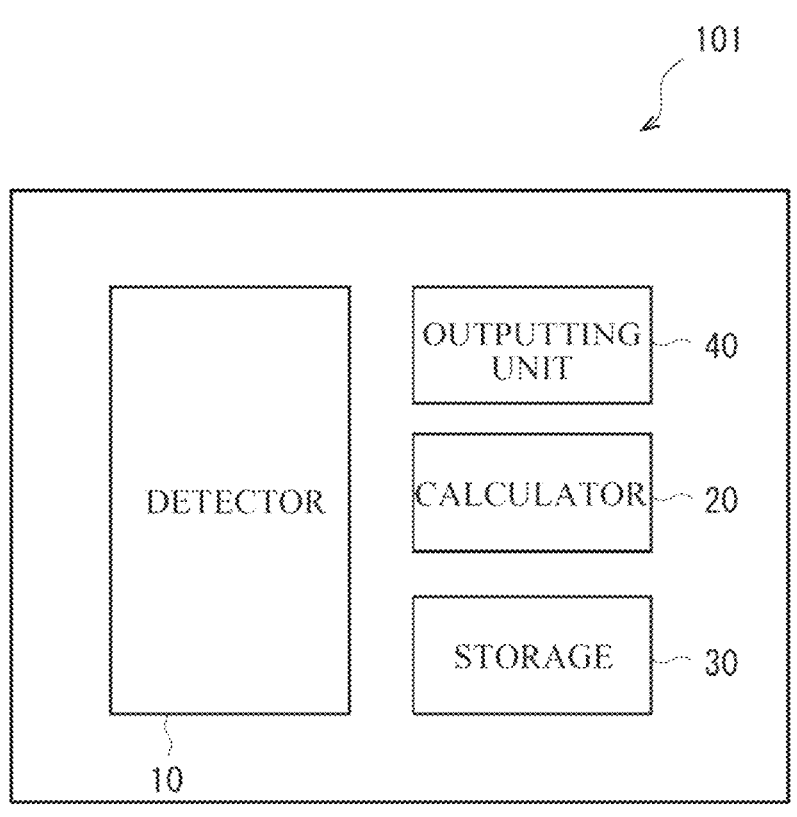
FIG. 18 is a schematic diagram illustrating a configuration example of a sensor device according to one example embodiment of the disclosure.

FIG. 18 schematically illustrates a configuration example of a sensor device 101 including the element array circuit according to an embodiment of the disclosure. As illustrated in FIG. 18, the sensor device 101 may include a detector 10, an arithmetic processor 20, a storage 30, and an outputting unit 40. Non-limiting examples of the sensor device 101 may include an electromagnetic wave sensor that detects an intensity of a received electromagnetic wave. Note that the configuration of the sensor device 101 illustrated in FIG. 18 is one example, and possible configurations of the sensor device 101 are not limited thereto.

The detector 10 may include the element array circuit 1 described in relation to the foregoing first example embodiment, the element array circuit 2 described in relation to the foregoing second example embodiment, or both. Non-limiting examples of the detector 10 may include an infrared detector that receives infrared rays and outputs a voltage that changes with the intensity of the received infrared rays. In some embodiments, the detector 10 may receive an electromagnetic wave other than infrared rays, such as a terahertz wave, and may output a voltage that changes with the intensity of the received electromagnetic wave.

The arithmetic processor 20 may receive an output voltage from the detector 10 and perform arithmetic processing thereon, such as conversion of the output voltage into data of a desired parameter. The storage 30 may hold the data generated at the arithmetic processor 20. The outputting unit 40 may output the data generated at the arithmetic processor 20 to an external apparatus as an electric signal.

The sensor device 101 according to the present example embodiment may be provided with the detector 10 including the element array circuit 1, the element array circuit 2, or both. This helps to achieve high operational reliability.

Note that the description is given above of an example case in which the resistors R in the detector 10 may each be a light receiving element that converts an electromagnetic wave such as infrared rays into an electric signal; however, the sensor device 101 according to the present example embodiment is not limited to such a kind of device.

For example, as each of the resistors R of the element array circuit 1 or 2 in the detector 10, a temperature-sensitive resistor element including, for example, a thermistor material or a temperature-sensitive electrically-conductive ink material may be employed. Such a temperature-sensitive resistor element may change in electrical resistance value with changing temperature. In such a case, the sensor device 101 may serve as a temperature sensor configured to detect a temperature distribution in a plane.

In some embodiments, a pressure-sensitive element including, for example, a pressure-sensitive electrically-conductive ink material may be employed as each of the resistors R of the element array circuit 1 or 2 in the detector 10. Such a pressure-sensitive element may change in electrical resistance value with changing magnitude of an applied pressure. The sensor device 101 with the detector 10 including the pressure-sensitive elements as the resistors R may serve as a pressure sensor configured to detect a pressure distribution in a plane.

In some embodiments, a strain gauge may be employed as each of the resistors R of the element array circuit 1 or 2 in the detector 10. The strain gauge may change in electrical resistance value with changing magnitude of an applied stress. The sensor device 101 with the detector 10 including the strain gauges as the resistors R may serve as a strain sensor configured to detect a stress distribution in a plane.

4. Modification Examples

Although some example embodiments of the disclosure have been described hereinabove, the disclosure is not limited to such example embodiments, and may be modified in a variety of ways.

For example, although respective illustrations of the element array circuits 1 and 2 of the foregoing first and second example embodiments in the drawings each exemplify a case in which the row lines extend in parallel to each other, embodiments of the disclosure are not limited thereto. In some embodiments, the row lines may be non-parallel to each other. Further, each of the row lines does not have to extend linearly, and may extend in a curved shape as a whole, or may be shaped to include a curved portion or a bent portion. Similarly, although the respective illustrations of the element array circuits 1 and 2 of the first and second example embodiments in the drawings each exemplify a case in which the column lines extend in parallel to each other, embodiments of the disclosure are not limited thereto. In some embodiments, the column lines may be non-parallel to each other. Further, embodiments of the disclosure are not limited to a case in which the row lines and the column lines extend in directions orthogonal to each other. Moreover, each of the column lines does not have to extend linearly, and may extend in a curved shape as a whole, or may be shaped to include a curved portion or a bent portion.

Figure 19:
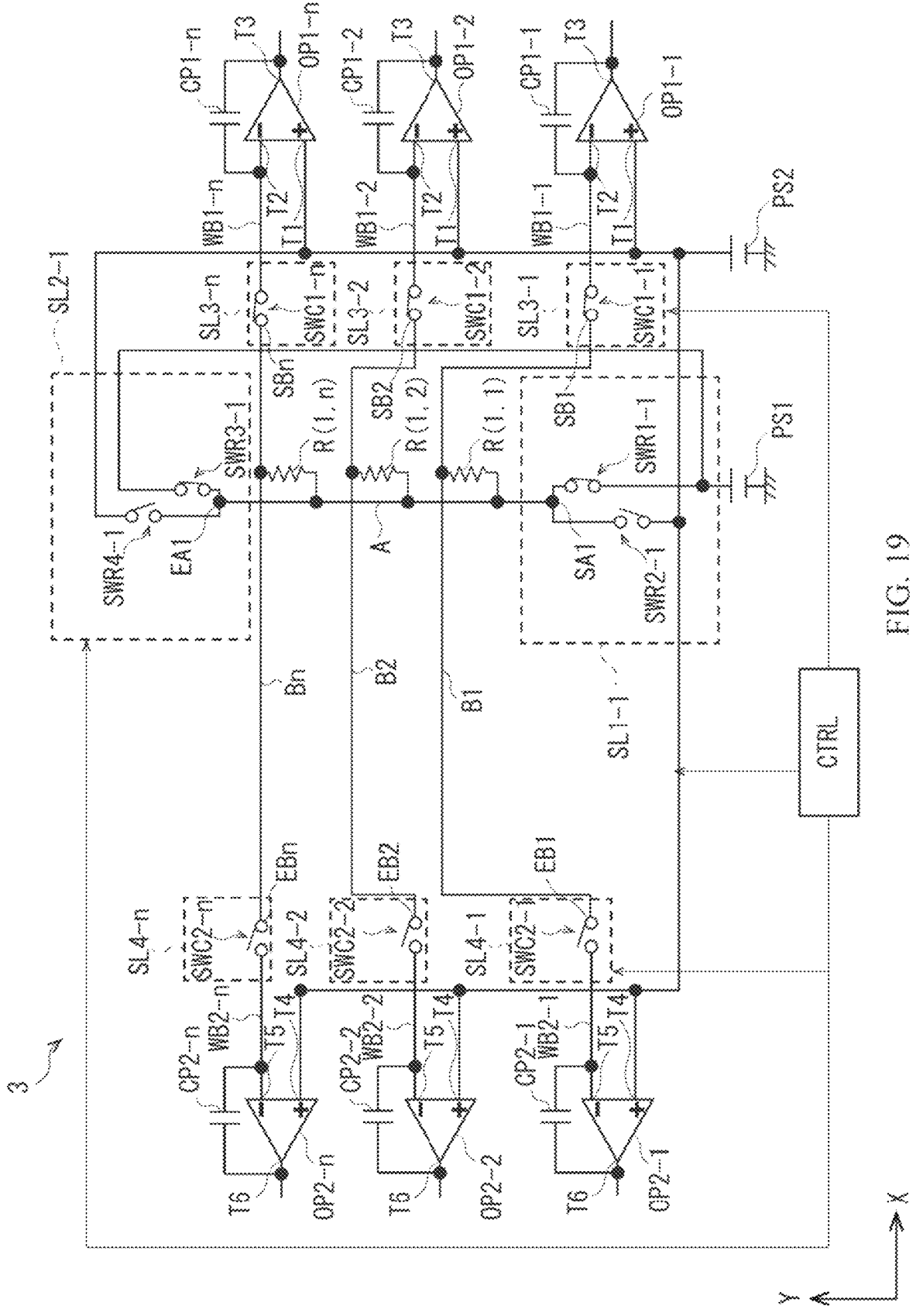
FIG. 19 is a circuit diagram illustrating a configuration example of an element array circuit according to a first modification example of one example embodiment of the disclosure.
Figure 20:
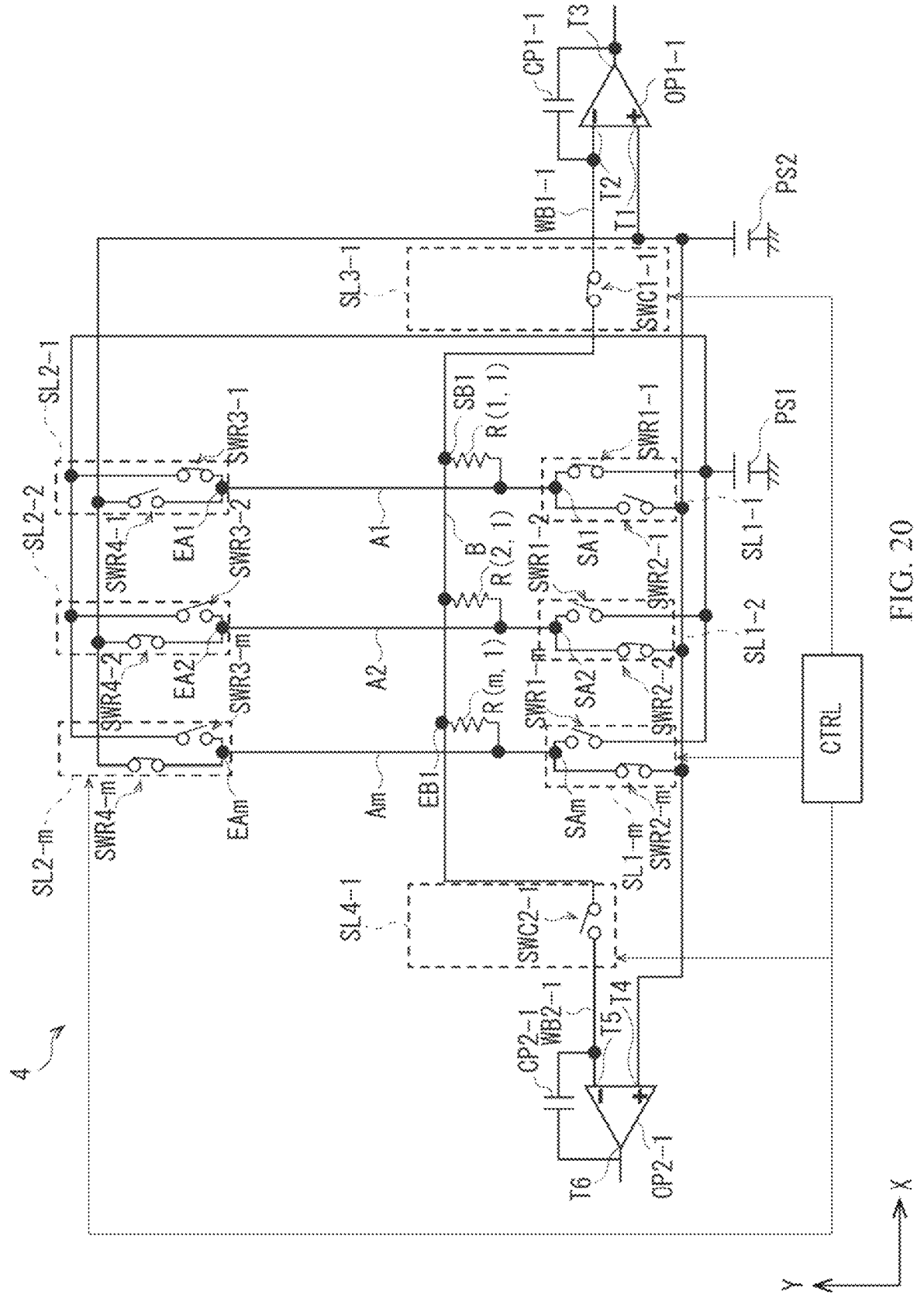
FIG. 20 is a circuit diagram illustrating a configuration example of an element array circuit according to a second modification example of one example embodiment of the disclosure.

The element array circuits 1 and 2 of the foregoing first and second example embodiments may each include the plurality of row lines and the plurality of column lines; however, embodiments of the disclosure are not limited thereto. For example, an element array circuit 3 illustrated in FIG. 19 may include a single row line A. The element array circuit 3 may be substantially the same in configuration as the element array circuit 1 illustrated in FIG. 1 except that the single row line A is provided instead of the plurality of row lines A1 to Am. Further, an element array circuit 4 illustrated in FIG. 20 may include a single column line B. The element array circuit 4 may be substantially the same in configuration as the element array circuit 1 illustrated in FIG. 1 except that the single column line B is provided instead of the plurality of column lines B1 to Bn.

Note that the foregoing descriptions of the element array circuits 1 and 2 of the first and second example embodiments have illustrated an example case where the number of the unselected row lines AU is two or more. However, embodiments of the disclosure are not limited thereto, and the number of the unselected row lines AU may be one.

Figure 21:
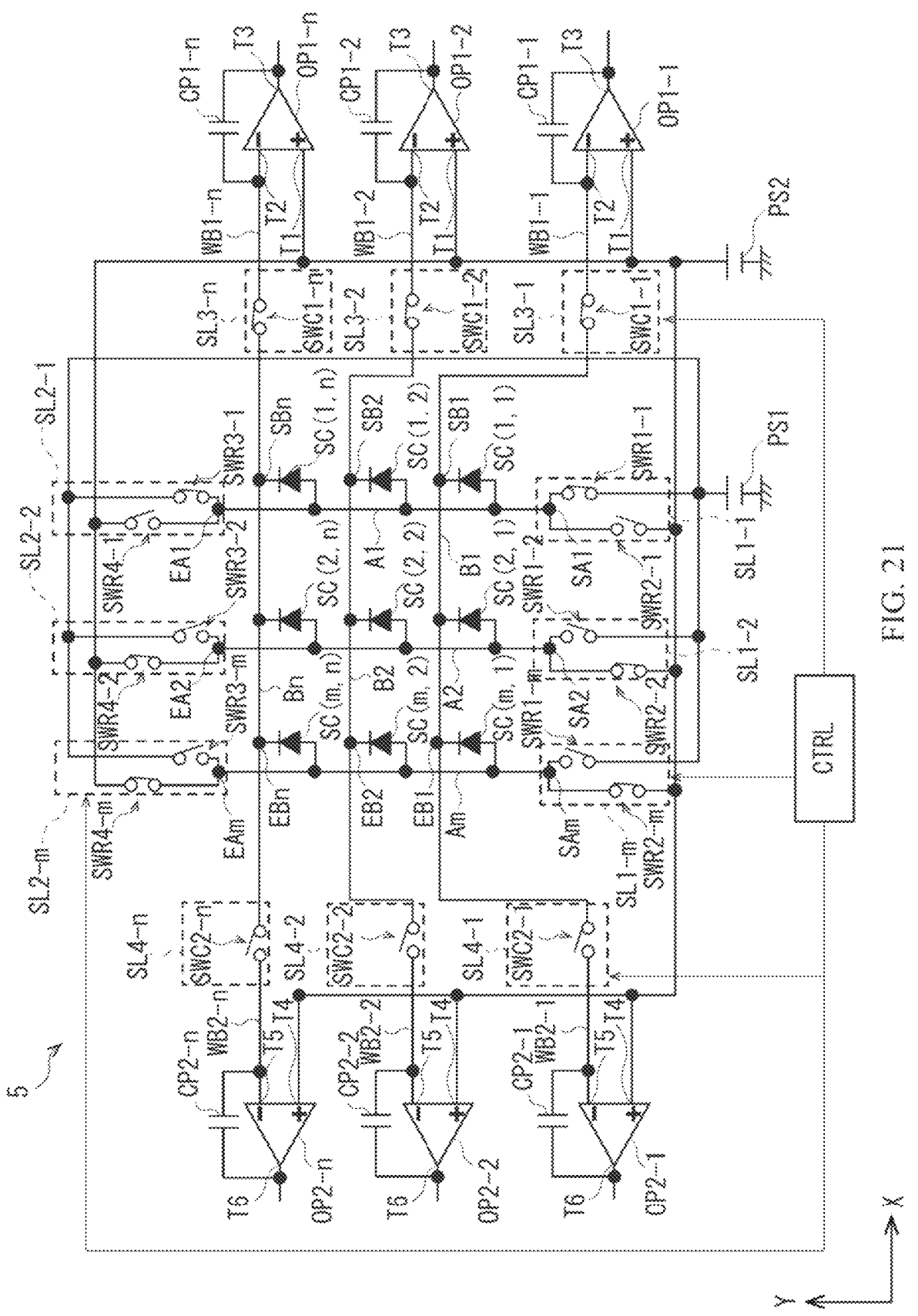
FIG. 21 is a circuit diagram illustrating a configuration example of an element array circuit according to a third modification example of one example embodiment of the disclosure.

The element array circuits 1 and 2 of the foregoing first and second example embodiments may each include the plurality of resistors R as a plurality of impedance elements; however, embodiments of the disclosure are not limited thereto. For example, an element array circuit 5 illustrated in FIG. 21 may include a plurality of semiconductor elements SC. The element array circuit 5 may be substantially the same in configuration as the element array circuit 1 except that the semiconductor elements SC are provided instead of the resistors R. The semiconductor element SC may have an electrical property that changes with temperature. Non-limiting examples of the semiconductor element SC may include a diode. For example, the thermistor film described as an example of the resistor R in the first example embodiment may be replaced with a diode whose impedance value changes with temperature, and the temperature of the diode may be detected as an output voltage resulting from the impedance value of the diode. Such an element array circuit may be applied to an electromagnetic wave sensor that detects the intensity of an electromagnetic wave such as infrared rays, or to a temperature sensor configured to detect a temperature distribution in a plane.

The disclosure encompasses any possible combination of some or all of the various embodiments and the modification examples described herein and incorporated herein. It is possible to achieve at least the following configurations from the foregoing example embodiments and modification examples of the disclosure.

(1)

An element array circuit including:

one or more first wirings that include respective one or more first ends and respective one or more second ends;

a plurality of second wirings, the second wirings each extending in a direction different from a direction in which the one or more first wirings each extend;

a plurality of impedance elements, the impedance elements each being coupled to both one of the one or more first wirings and one of the second wirings;

one or more operational amplifiers each including a positive input terminal to be set to a first potential, and a negative input terminal couplable to one of the second wirings;

one or more first selectors each coupled to corresponding one of the one or more first ends and configured to select one option from a first option group, the first option group including a first option to apply the first potential to the corresponding one of the one or more first ends and a second option to apply a second potential different from the first potential to the corresponding one of the one or more first ends; and one or more second selectors each coupled to corresponding one of the one or more second ends and configured to select one option from a second option group, the second option group including a third option to apply the first potential to the corresponding one of the one or more second ends and a fourth option to apply the second potential to the corresponding one of the one or more second ends.

(2)

The element array circuit according to (1), further including a processor, the processor being configured to apply, through the one or more first selectors, the first potential to one first end, of the one or more first ends, and the second potential to each of the one or more first ends other than the one first end, and apply, through the one or more second selectors, the first potential to one second end, of the one or more second ends, and the second potential to each of the one or more second ends other than the one second end, the one second end corresponding to the one first end to which the first potential is to be applied.

(3)

The element array circuit according to (2), in which the processor is configured to perform application of the first potential to the one first end and application of the first potential to the one second end in synchronization with each other.

(4)

The element array circuit according to (1), further including:

one or more third selectors; and one or more fourth selectors, in which the one or more operational amplifiers include one or more first operational amplifiers and one or more second operational amplifiers, the second wirings include respective third ends and respective fourth ends, the one or more third selectors are each provided between corresponding one of the third ends and the negative input terminal of corresponding one of the one or more first operational amplifiers, and are each configured to perform a selection operation to select either an electrically continuous state or an electrically discontinuous state between the corresponding one of the third ends and the negative input terminal of the corresponding one of the one or more first operational amplifiers, and the one or more fourth selectors are each provided between corresponding one of the fourth ends and the negative input terminal of corresponding one of the one or more second operational amplifiers, and are each configured to perform a selection operation to select either an electrically continuous state or an electrically discontinuous state between the corresponding one of the fourth ends and the negative input terminal of the corresponding one of the one or more second operational amplifiers.

(5)

The element array circuit according to (4), in which the one or more first operational amplifiers include a plurality of the first operational amplifiers, and the negative input terminal of each of the first operational amplifiers is coupled to corresponding one of the second wirings via one of the one or more third selectors.

(6)

The element array circuit according to (4) or (5), in which the one or more second operational amplifiers include a plurality of the second operational amplifiers, and the negative input terminal of each of the second operational amplifiers is coupled to corresponding one of the second wirings via one of the one or more fourth selectors.

(7)

The element array circuit according to (4), further including a processor, the processor being configured to cause one of the one or more fourth selectors to select the electrically continuous state, the one of the one or more fourth selectors being coupled to one fourth end, of the fourth ends, that is the fourth end of a selected second wiring selected from the second wirings, where at least one of: a state where the first potential is applied through one of the one or more first selectors to one first end, of the one or more first ends, that is the first end of a selected first wiring selected from the one or more first wirings; or a state where the first potential is applied through one of the one or more second selectors to one second end, of the one or more second ends, that is the second end of the selected first wiring, is satisfied, where one of the one or more third selectors that is coupled to one third end, of the third ends, that is the third end of the selected second wiring has been caused to select the electrically continuous state, and where an output from one of the one or more first operational amplifiers that is coupled to the one of the one or more third selectors is at an abnormal value.

(8)

The element array circuit according to (1), further including a processor, in which the second option group further includes a fifth option to cause the corresponding one of the one or more second ends to be open, and the processor is configured to determine that a break is present in either a first part or a second part, or in each of the first part and the second part, the first part being along one first wiring, of the one or more first wirings, that is coupled to a selected impedance element selected from the impedance elements and being from the selected impedance element to one of the one or more first selectors, the second part being along one second wiring, of the second wirings, that is coupled to the selected impedance element and being from the selected impedance element to one of the one or more operational amplifiers that corresponds to the selected impedance element, where an output from the one of the one or more operational amplifiers that corresponds to the selected impedance element is at an abnormal value when a first state is satisfied, the first state being a state where the first potential is applied through the one of the one or more first selectors to one first end, of the one or more first ends, that is the first end of the one first wiring coupled to the selected impedance element, and where one second end, of the one or more second ends, that is the second end of the one first wiring coupled to the selected impedance element is caused to be open by one of the one or more second selectors.

(9)

The element array circuit according to (1), further including a processor, in which the second option group further includes a fifth option to cause the corresponding one of the one or more second ends to be open, and the processor is configured to determine that a break is present in a first part, the first part being along one first wiring, of the one or more first wirings, that is coupled to a selected impedance element selected from the impedance elements and being from the selected impedance element to one of the one or more first selectors, where an output from one of the one or more operational amplifiers that corresponds to the selected impedance element is at an abnormal value when a first state is satisfied, the first state being a state where the first potential is applied through the one of the one or more first selectors to one first end, of the one or more first ends, that is the first end of the one first wiring coupled to the selected impedance element, and where one second end, of the one or more second ends, that is the second end of the one first wiring coupled to the selected impedance element is caused to be open by one of the one or more second selectors, and where the output from the one of the one or more operational amplifiers that corresponds to the selected impedance element is at a normal value when a second state is satisfied, the second state being a state where the first potential is applied through the one of the one or more first selectors to the first end of the one first wiring coupled to the selected impedance element and where the first potential is applied through the one of the one or more second selectors to the second end of the one first wiring coupled to the selected impedance element.

(10)

The element array circuit according to (4), in which the processor is configured to determine that a break is present in a second part, the second part being along one second wiring, of the second wirings, that is coupled to a selected impedance element selected from the impedance elements and being from the selected impedance element to one of the one or more first operational amplifiers that is coupled to one third selector, of the one or more third selectors, that corresponds to the selected impedance element, where an output from the one of the one or more first operational amplifiers that is coupled to the one third selector that corresponds to the selected impedance element is at an abnormal value when the one third selector that corresponds to the selected impedance element has selected the electrically continuous state, and where an output from one of the one or more second operational amplifiers that is coupled to one fourth selector, of the one or more fourth selectors, that corresponds to the selected impedance element is at a normal value when the one fourth selector that corresponds to the selected impedance element has selected the electrically continuous state.

(11)

An element array circuit including:

a plurality of first wirings, the first wirings including respective first ends and respective second ends;

one or more second wirings each extending in a direction different from a direction in which the first wirings each extend;

a plurality of impedance elements, the impedance elements each being coupled to both one of the first wirings and one of the one or more second wirings;

one or more operational amplifiers each including a positive input terminal to be set to a first potential, and a negative input terminal couplable to one of the one or more second wirings;

a plurality of first selectors, the first selectors each being coupled to corresponding one of the first ends and configured to select one option from a first option group, the first option group including a first option to apply the first potential to the corresponding one of the first ends and a second option to apply a second potential different from the first potential to the corresponding one of the first ends; and a plurality of second selectors, the second selectors each being coupled to corresponding one of the second ends and configured to select one option from a second option group, the second option group including a third option to apply the first potential to the corresponding one of the second ends and a fourth option to apply the second potential to the corresponding one of the second ends.

(12)

The element array circuit according to (11), further including a processor, the processor being configured to apply, through the first selectors, the first potential to one first end, of the first ends, and the second potential to each of the first ends other than the one first end, and apply, through the second selectors, the first potential to one second end, of the second ends, and the second potential to each of the second ends other than the one second end, the one second end corresponding to the one first end to which the first potential is to be applied.

(13)

The element array circuit according to (12), in which the processor is configured to perform application of the first potential to the one first end and application of the first potential to the one second end in synchronization with each other.

(14)

The element array circuit according to (11), further including:

one or more third selectors; and one or more fourth selectors, in which the one or more operational amplifiers include one or more first operational amplifiers and one or more second operational amplifiers, the one or more second wirings include respective one or more third ends and respective one or more fourth ends, the one or more third selectors are each provided between corresponding one of the one or more third ends and the negative input terminal of corresponding one of the one or more first operational amplifiers, and are each configured to perform a selection operation to select either an electrically continuous state or an electrically discontinuous state between the corresponding one of the one or more third ends and the negative input terminal of the corresponding one of the one or more first operational amplifiers, and the one or more fourth selectors are each provided between corresponding one of the one or more fourth ends and the negative input terminal of corresponding one of the one or more second operational amplifiers, and are each configured to perform a selection operation to select either an electrically continuous state or an electrically discontinuous state between the corresponding one of the one or more fourth ends and the negative input terminal of the corresponding one of the one or more second operational amplifiers.

(15)

A sensor including the element array circuit according to claim 1 or 11.

The element array circuit and the sensor according to at least one embodiment of the disclosure each make it possible to obtain outputs from a larger number of impedance elements even when a break occurs in a portion of each first wiring. The element array circuit and the sensor according to at least one embodiment of the disclosure each achieve high operational reliability, accordingly.

It is to be noted that the effects described herein are mere examples and non-limiting, and other effects may be achieved.

Although the disclosure has been described hereinabove in terms of the example embodiment and modification examples, the disclosure is not limited thereto. It should be appreciated that variations may be made in the described example embodiment and modification examples by those skilled in the art without departing from the scope of the disclosure as defined by the following claims.

The limitations in the claims are to be interpreted broadly based on the language employed in the claims and not limited to examples described in this specification or during the prosecution of the application, and the examples are to be construed as non-exclusive.

As used in this specification and the appended claims, the singular forms "a," "an," and "the" include, especially in the context of the claims, are to be construed to cover both the singular and the plural, unless otherwise indicated herein or clearly contradicted by context.

Throughout this specification and the appended claims, unless the context requires otherwise, the terms "comprise", "include", "have", and their variations are to be construed to cover the inclusion of a stated element, integer or step but not the exclusion of any other non-stated element, integer or step.

The use of the terms first, second, etc. do not denote any order or importance, but rather the terms first, second, etc. are used to distinguish one element from another.

The term "substantially", "approximately", "about", and its variants having the similar meaning thereto are defined as being largely but not necessarily wholly what is specified as understood by one of ordinary skill in the art.

The term "disposed on/provided on/formed on" and its variants having the similar meaning thereto as used herein refer to elements disposed directly in contact with each other or indirectly by having intervening structures therebetween.

What is claimed is:

1. An element array circuit comprising:

one or more first wirings that include respective one or more first ends and respective one or more second ends;

a plurality of second wirings, the second wirings each extending in a direction different from a direction in which the one or more first wirings each extend;

a plurality of impedance elements, the impedance elements each being coupled to both one of the one or more first wirings and one of the second wirings;

one or more operational amplifiers each including a positive input terminal to be set to a first potential, and a negative input terminal couplable to one of the second wirings;

one or more first selectors each coupled to corresponding one of the one or more first ends and configured to select one option from a first option group, the first option group including a first option to apply the first potential to the corresponding one of the one or more first ends and a second option to apply a second potential different from the first potential to the corresponding one of the one or more first ends; and one or more second selectors each coupled to corresponding one of the one or more second ends and configured to select one option from a second option group, the second option group including a third option to apply the first potential to the corresponding one of the one or more second ends and a fourth option to apply the second potential to the corresponding one of the one or more second ends.

2. The element array circuit according to claim 1, further comprising a processor, the processor being configured to apply, through the one or more first selectors, the first potential to one first end, of the one or more first ends, and the second potential to each of the one or more first ends other than the one first end, and apply, through the one or more second selectors, the first potential to one second end, of the one or more second ends, and the second potential to each of the one or more second ends other than the one second end, the one second end corresponding to the one first end to which the first potential is to be applied.

3. The element array circuit according to claim 2, wherein the processor is configured to perform application of the first potential to the one first end and application of the first potential to the one second end in synchronization with each other.

4. The element array circuit according to claim 1, further comprising:

one or more third selectors; and one or more fourth selectors, wherein the one or more operational amplifiers include one or more first operational amplifiers and one or more second operational amplifiers, the second wirings include respective third ends and respective fourth ends, the one or more third selectors are each provided between corresponding one of the third ends and the negative input terminal of corresponding one of the one or more first operational amplifiers, and are each configured to perform a selection operation to select either an electrically continuous state or an electrically discontinuous state between the corresponding one of the third ends and the negative input terminal of the corresponding one of the one or more first operational amplifiers, and the one or more fourth selectors are each provided between corresponding one of the fourth ends and the negative input terminal of corresponding one of the one or more second operational amplifiers, and are each configured to perform a selection operation to select either an electrically continuous state or an electrically discontinuous state between the corresponding one of the fourth ends and the negative input terminal of the corresponding one of the one or more second operational amplifiers.

5. The element array circuit according to claim 4, wherein the one or more first operational amplifiers comprise a plurality of the first operational amplifiers, and the negative input terminal of each of the first operational amplifiers is coupled to corresponding one of the second wirings via one of the one or more third selectors.

6. The element array circuit according to claim 4, wherein the one or more second operational amplifiers comprise a plurality of the second operational amplifiers, and the negative input terminal of each of the second operational amplifiers is coupled to corresponding one of the second wirings via one of the one or more fourth selectors.

7. The element array circuit according to claim 4, further comprising a processor, the processor being configured to cause one of the one or more fourth selectors to select the electrically continuous state, the one of the one or more fourth selectors being coupled to one fourth end, of the fourth ends, that is the fourth end of a selected second wiring selected from the second wirings, where at least one of: a state where the first potential is applied through one of the one or more first selectors to one first end, of the one or more first ends, that is the first end of a selected first wiring selected from the one or more first wirings; or a state where the first potential is applied through one of the one or more second selectors to one second end, of the one or more second ends, that is the second end of the selected first wiring, is satisfied, where one of the one or more third selectors that is coupled to one third end, of the third ends, that is the third end of the selected second wiring has been caused to select the electrically continuous state, and where an output from one of the one or more first operational amplifiers that is coupled to the one of the one or more third selectors is at an abnormal value.

8. The element array circuit according to claim 1, further comprising a processor, wherein the second option group further includes a fifth option to cause the corresponding one of the one or more second ends to be open, and the processor is configured to determine that a break is present in either a first part or a second part, or in each of the first part and the second part, the first part being along one first wiring, of the one or more first wirings, that is coupled to a selected impedance element selected from the impedance elements and being from the selected impedance element to one of the one or more first selectors, the second part being along one second wiring, of the second wirings, that is coupled to the selected impedance element and being from the selected impedance element to one of the one or more operational amplifiers that corresponds to the selected impedance element, where an output from the one of the one or more operational amplifiers that corresponds to the selected impedance element is at an abnormal value when a first state is satisfied, the first state being a state where the first potential is applied through the one of the one or more first selectors to one first end, of the one or more first ends, that is the first end of the one first wiring coupled to the selected impedance element, and where one second end, of the one or more second ends, that is the second end of the one first wiring coupled to the selected impedance element is caused to be open by one of the one or more second selectors.

9. The element array circuit according to claim 1, further comprising a processor, wherein the second option group further includes a fifth option to cause the corresponding one of the one or more second ends to be open, and the processor is configured to determine that a break is present in a first part, the first part being along one first wiring, of the one or more first wirings, that is coupled to a selected impedance element selected from the impedance elements and being from the selected impedance element to one of the one or more first selectors, where an output from one of the one or more operational amplifiers that corresponds to the selected impedance element is at an abnormal value when a first state is satisfied, the first state being a state where the first potential is applied through the one of the one or more first selectors to one first end, of the one or more first ends, that is the first end of the one first wiring coupled to the selected impedance element, and where one second end, of the one or more second ends, that is the second end of the one first wiring coupled to the selected impedance element is caused to be open by one of the one or more second selectors, and where the output from the one of the one or more operational amplifiers that corresponds to the selected impedance element is at a normal value when a second state is satisfied, the second state being a state where the first potential is applied through the one of the one or more first selectors to the first end of the one first wiring coupled to the selected impedance element and where the first potential is applied through the one of the one or more second selectors to the second end of the one first wiring coupled to the selected impedance element.

10. The element array circuit according to claim 4, wherein the processor is configured to determine that a break is present in a second part, the second part being along one second wiring, of the second wirings, that is coupled to a selected impedance element selected from the impedance elements and being from the selected impedance element to one of the one or more first operational amplifiers that is coupled to one third selector, of the one or more third selectors, that corresponds to the selected impedance element, where an output from the one of the one or more first operational amplifiers that is coupled to the one third selector that corresponds to the selected impedance element is at an abnormal value when the one third selector that corresponds to the selected impedance element has selected the electrically continuous state, and where an output from one of the one or more second operational amplifiers that is coupled to one fourth selector, of the one or more fourth selectors, that corresponds to the selected impedance element is at a normal value when the one fourth selector that corresponds to the selected impedance element has selected the electrically continuous state.

11. A sensor comprising the element array circuit according to claim 1.

12. An element array circuit comprising:

a plurality of first wirings, the first wirings including respective first ends and respective second ends;

one or more second wirings each extending in a direction different from a direction in which the first wirings each extend;

a plurality of impedance elements, the impedance elements each being coupled to both one of the first wirings and one of the one or more second wirings;

one or more operational amplifiers each including a positive input terminal to be set to a first potential, and a negative input terminal couplable to one of the one or more second wirings;

a plurality of first selectors, the first selectors each being coupled to corresponding one of the first ends and configured to select one option from a first option group, the first option group including a first option to apply the first potential to the corresponding one of the first ends and a second option to apply a second potential different from the first potential to the corresponding one of the first ends; and a plurality of second selectors, the second selectors each being coupled to corresponding one of the second ends and configured to select one option from a second option group, the second option group including a third option to apply the first potential to the corresponding one of the second ends and a fourth option to apply the second potential to the corresponding one of the second ends.

13. The element array circuit according to claim 12, further comprising a processor, the processor being configured to apply, through the first selectors, the first potential to one first end, of the first ends, and the second potential to each of the first ends other than the one first end, and apply, through the second selectors, the first potential to one second end, of the second ends, and the second potential to each of the second ends other than the one second end, the one second end corresponding to the one first end to which the first potential is to be applied.

14. The element array circuit according to claim 13, wherein the processor is configured to perform application of the first potential to the one first end and application of the first potential to the one second end in synchronization with each other.

15. The element array circuit according to claim 12, further comprising:

one or more third selectors; and one or more fourth selectors, wherein the one or more operational amplifiers include one or more first operational amplifiers and one or more second operational amplifiers, the one or more second wirings include respective one or more third ends and respective one or more fourth ends, the one or more third selectors are each provided between corresponding one of the one or more third ends and the negative input terminal of corresponding one of the one or more first operational amplifiers, and are each configured to perform a selection operation to select either an electrically continuous state or an electrically discontinuous state between the corresponding one of the one or more third ends and the negative input terminal of the corresponding one of the one or more first operational amplifiers, and the one or more fourth selectors are each provided between corresponding one of the one or more fourth ends and the negative input terminal of corresponding one of the one or more second operational amplifiers, and are each configured to perform a selection operation to select either an electrically continuous state or an electrically discontinuous state between the corresponding one of the one or more fourth ends and the negative input terminal of the corresponding one of the one or more second operational amplifiers.

16. A sensor comprising the element array circuit according to claim 12.

* * * * *